(12) United States Patent
Miyazaki et al.

(10) Patent No.: US 10,488,484 B2
(45) Date of Patent: Nov. 26, 2019

(54) MAGNETIC RESONANCE IMAGING METHOD

(71) Applicant: Toshiba Medical Systems Corporation, Otawara-shi (JP)

(72) Inventors: Mitsue Miyazaki, Des Plaines, IL (US); Aiming Lu, Vernon Hills, IL (US); Xiangzhi Zhou, Vernon Hills, IL (US)

(73) Assignee: Canon Medical Systems Corporation, Otawara-shi (JP)

( * ) Notice: Subject to any disclaimer, the term of this patent is extended or adjusted under 35 U.S.C. 154(b) by 424 days.

(21) Appl. No.: 15/009,412

(22) Filed: Jan. 28, 2016

(65) Prior Publication Data

US 2017/0219672 A1 Aug. 3, 2017

(51) Int. Cl.
| | |
|---|---|
| *G01V 3/00* | (2006.01) |
| *G01R 33/561* | (2006.01) |
| *G01R 33/48* | (2006.01) |
| *G01R 33/483* | (2006.01) |
| *G01R 33/563* | (2006.01) |
| *G01R 33/565* | (2006.01) |

(52) U.S. Cl.
CPC ....... *G01R 33/5614* (2013.01); *G01R 33/482* (2013.01); *G01R 33/4816* (2013.01); *G01R 33/4835* (2013.01); *G01R 33/5635* (2013.01); *G01R 33/56308* (2013.01); *G01R 33/56509* (2013.01)

(58) Field of Classification Search
USPC ........................................................ 324/322
See application file for complete search history.

(56) References Cited

U.S. PATENT DOCUMENTS

| | | | |
|---|---|---|---|
| 6,246,897 B1* | 6/2001 | Foo ................. | G01R 33/56316 324/307 |
| 2014/0194730 A1* | 7/2014 | Hoshino .............. | A61B 5/0044 600/419 |
| 2016/0266223 A1* | 9/2016 | Bi ...................... | A61B 5/02007 |
| 2016/0334488 A1* | 11/2016 | Bieri .................. | G01R 33/4824 |
| 2017/0131376 A1* | 5/2017 | Miyazaki ......... | G01R 33/56308 |

OTHER PUBLICATIONS

Hee Kwon Song et al. "Dynamic MRI with Projection Reconstruction and KWIC Processing for Simultaneous High Spatial and Temporal Resolution", Magnetic Resonance in Medicine, vol. 52, 2004, pp. 815-824.

(Continued)

*Primary Examiner* — Rodney E Fuller
(74) *Attorney, Agent, or Firm* — Oblon, McClelland, Maier & Neustadt, L.L.P.

(57) ABSTRACT

A magnetic resonance imaging method executed in a magnetic resonance imaging apparatus according to an embodiment comprises: applying an inversion pulse; executing a subsequent imaging sequence including an RF (Radio Frequency) pulse and a gradient magnetic field concurrently applied with the RF pulse in a slice direction and performing, for a slice position selected by the RF pulse and the gradient magnetic field and during a time period including a null point, data acquisition in a plurality of orientations including a center of a two-dimensional k-space.

20 Claims, 35 Drawing Sheets

(56) References Cited

OTHER PUBLICATIONS

Robert J. Mcdonald et al. "Intracranial Gadolinium Deposition after Contrast-Enhanced MR Imaging", Radiology, vol. 275, No. 3, Jun. 2015, pp. 772-782.

Huimin Wu et al. "Noncontrast Dynamic 3D Intracranial MR Angiography Using Pseudo-Continuous Arterial Spin Labeling (PCASL) and Accelerated 3D Radial Acquisition", Journal of Magnetic Resonance Imaging, vol. 39, 2014, pp. 1320-1326.

* cited by examiner

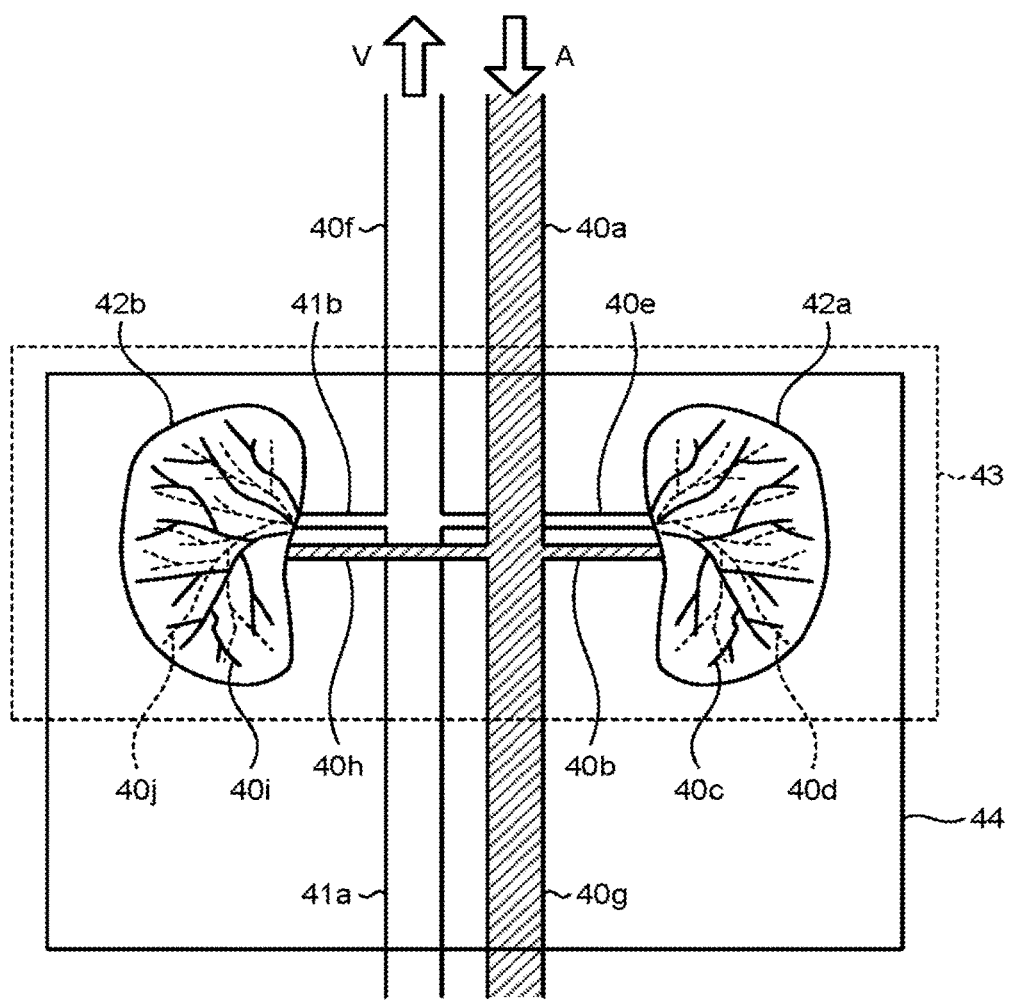

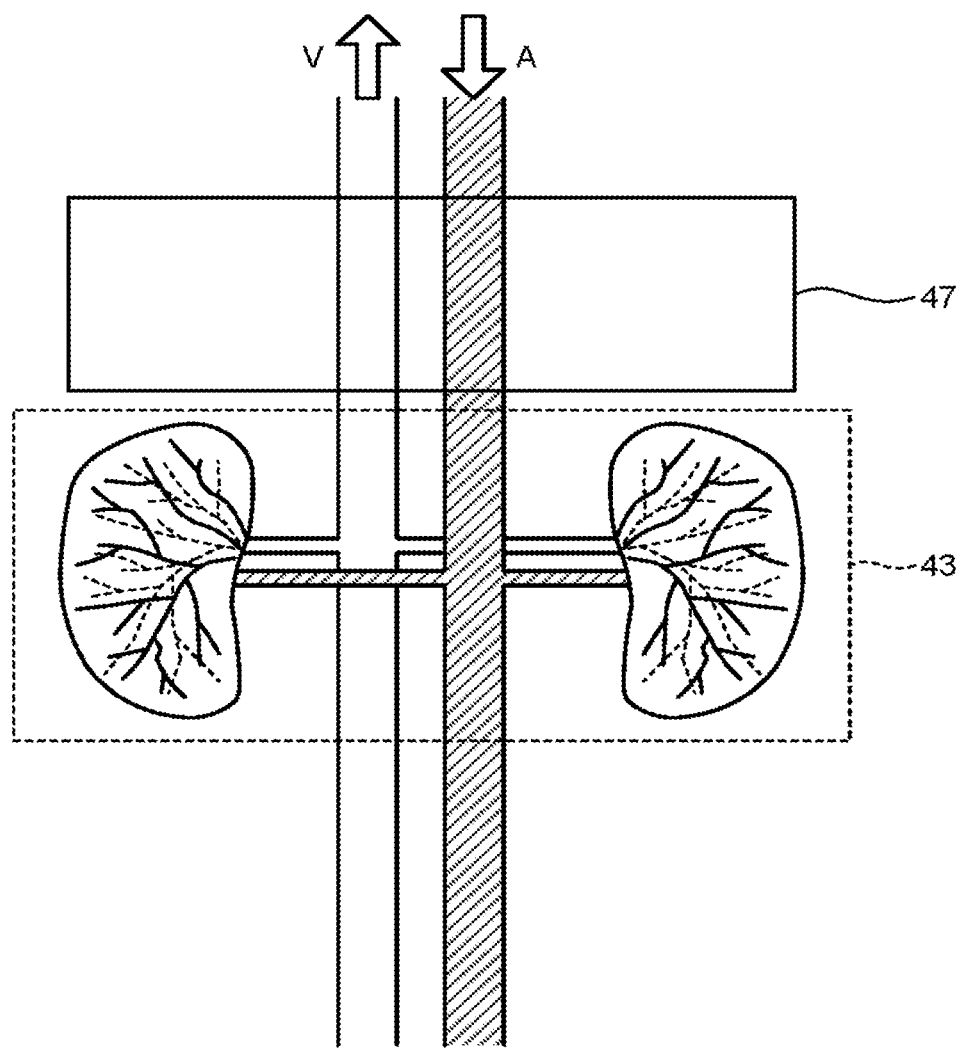

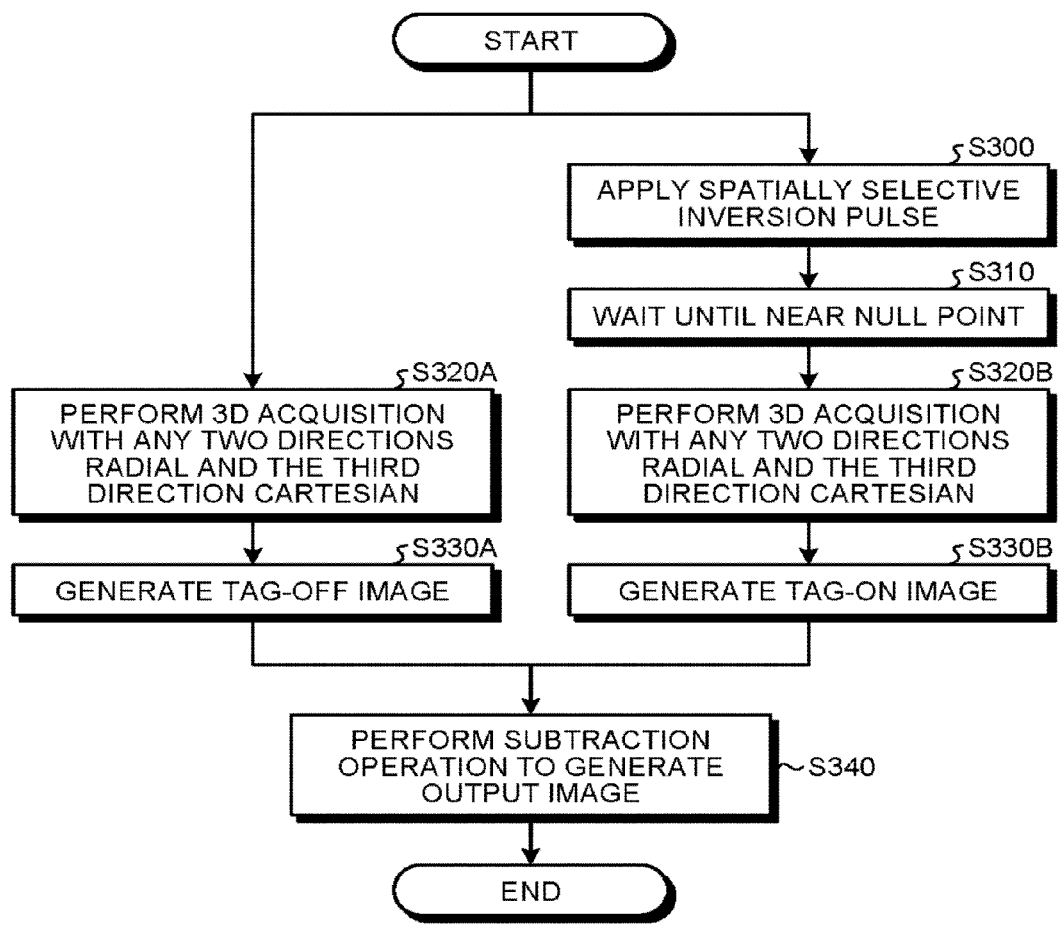

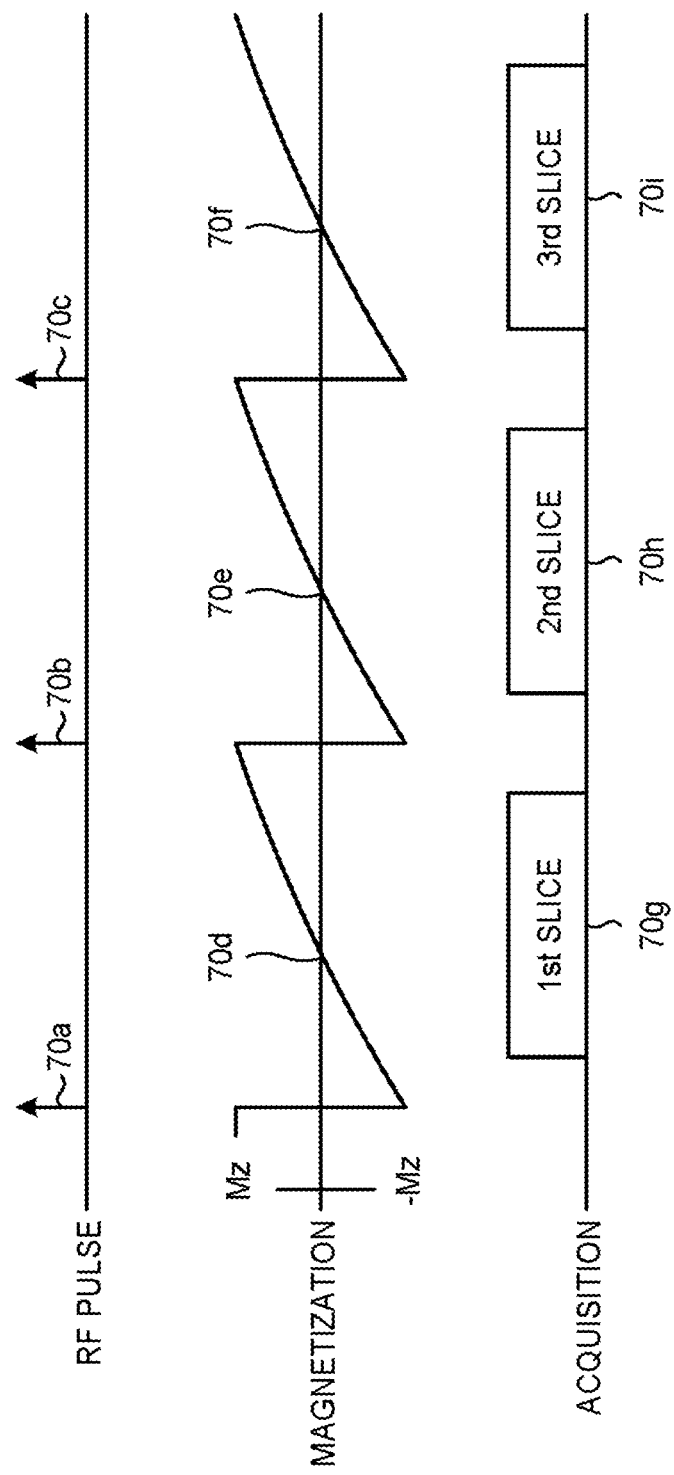

FIG.7B

| 1st SLICE | | | | | |
|---|---|---|---|---|---|
| PREP | $A_1$ | $B_1$ | $C_1$ | $D_1$ | ...... |

| 2nd SLICE | | | | | |
|---|---|---|---|---|---|
| PREP | $A_2$ | $B_2$ | $C_2$ | $D_2$ | ...... |

| 3rd SLICE | | | | | |
|---|---|---|---|---|---|
| PREP | $A_3$ | $B_3$ | $C_3$ | $D_3$ | ...... |

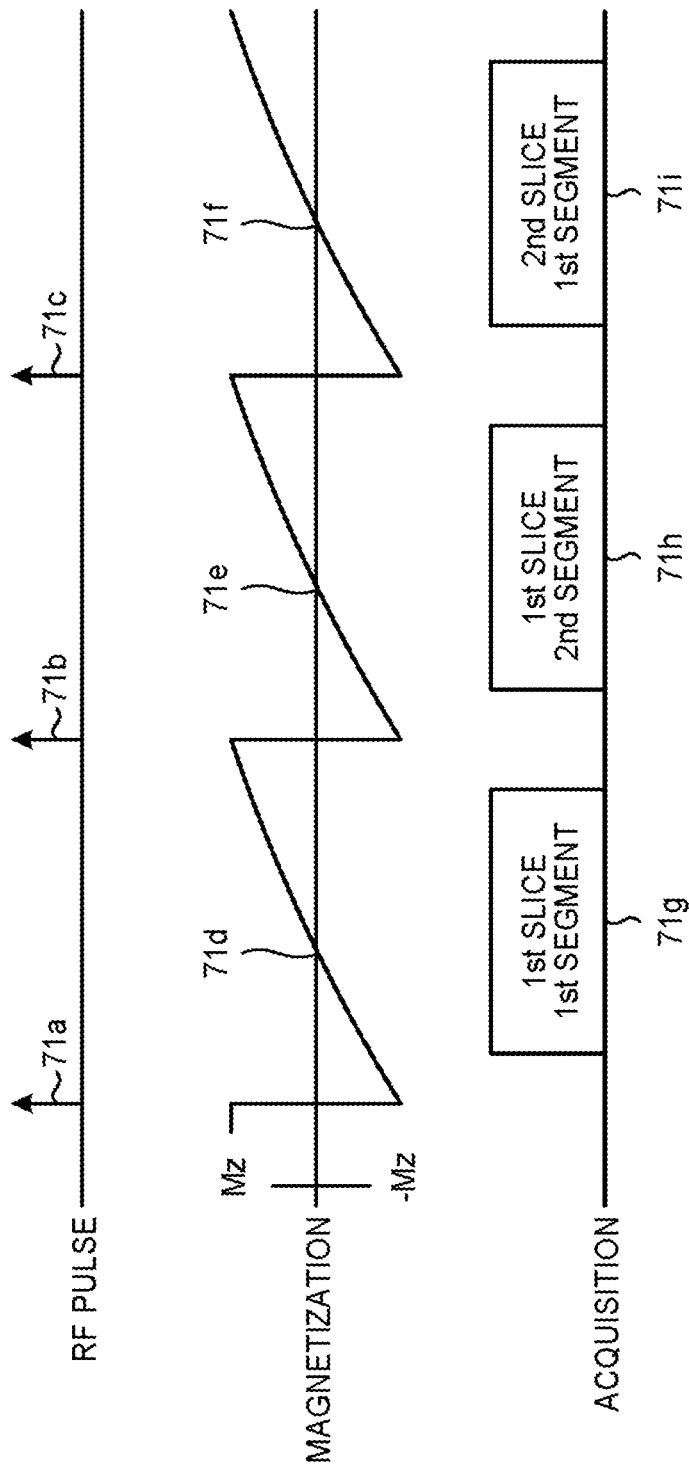

FIG.8B

| 1st SLICE 1st SEGMENT | | | | |
|---|---|---|---|---|
| PREP | $A_1$ | $B_1$ | $C_1$ | $D_1$ |

| 1st SLICE 2nd SEGMENT | | | | |
|---|---|---|---|---|
| PREP | $E_1$ | $F_1$ | $G_1$ | $H_1$ |

| 2nd SLICE 1st SEGMENT | | | | |
|---|---|---|---|---|
| PREP | $A_2$ | $B_2$ | $C_2$ | $D_2$ |

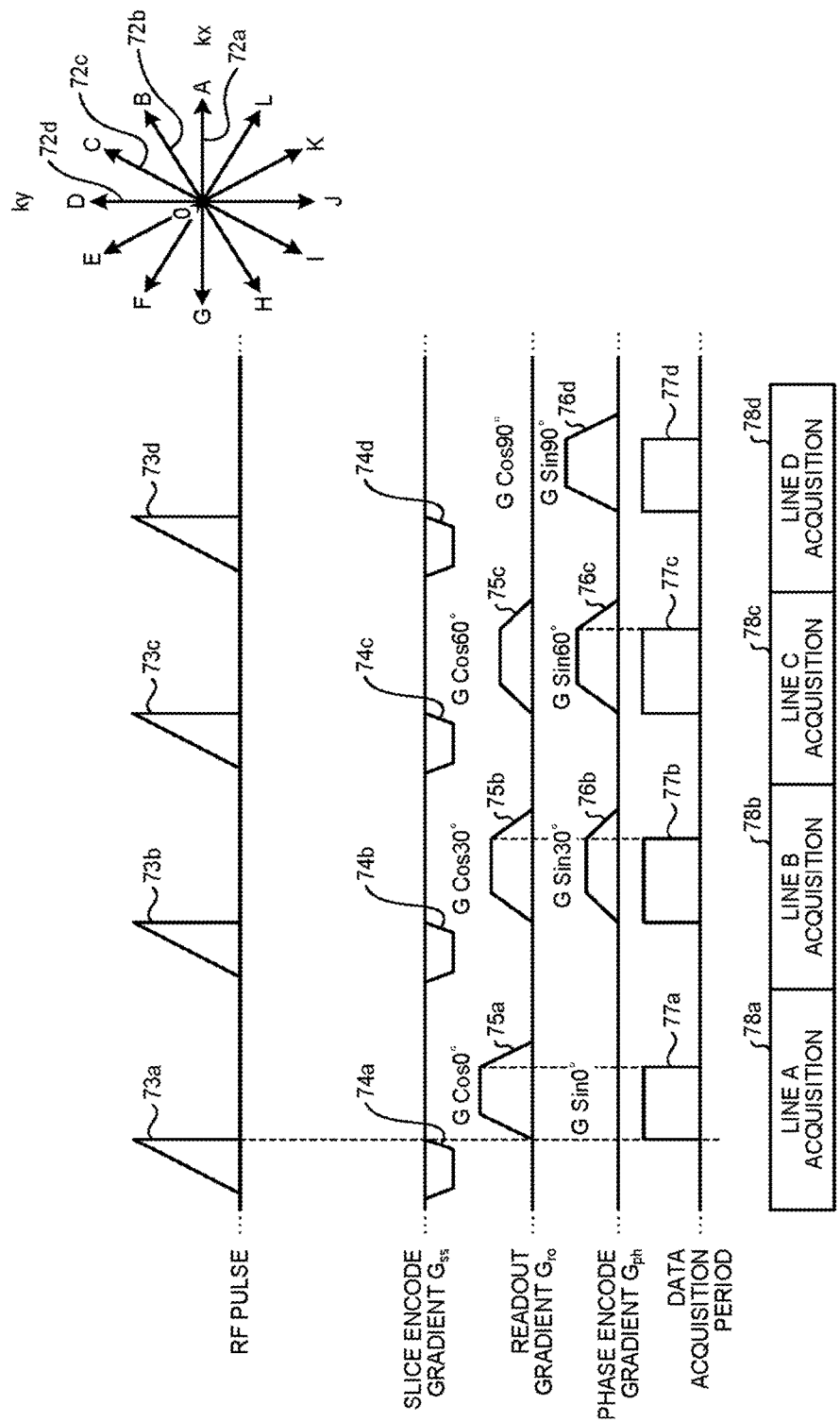

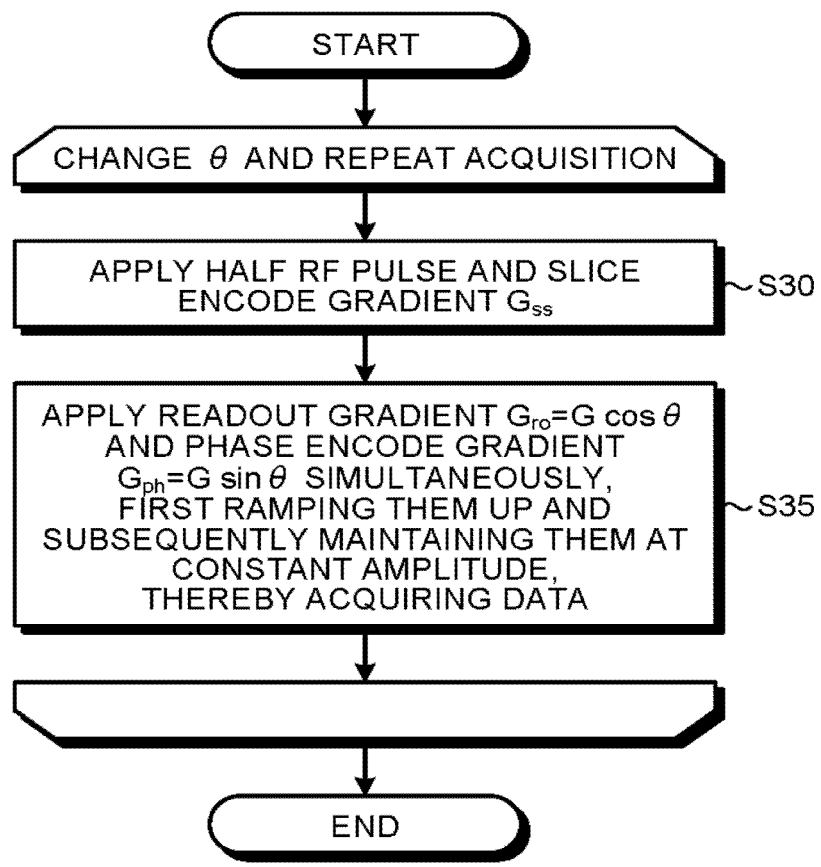

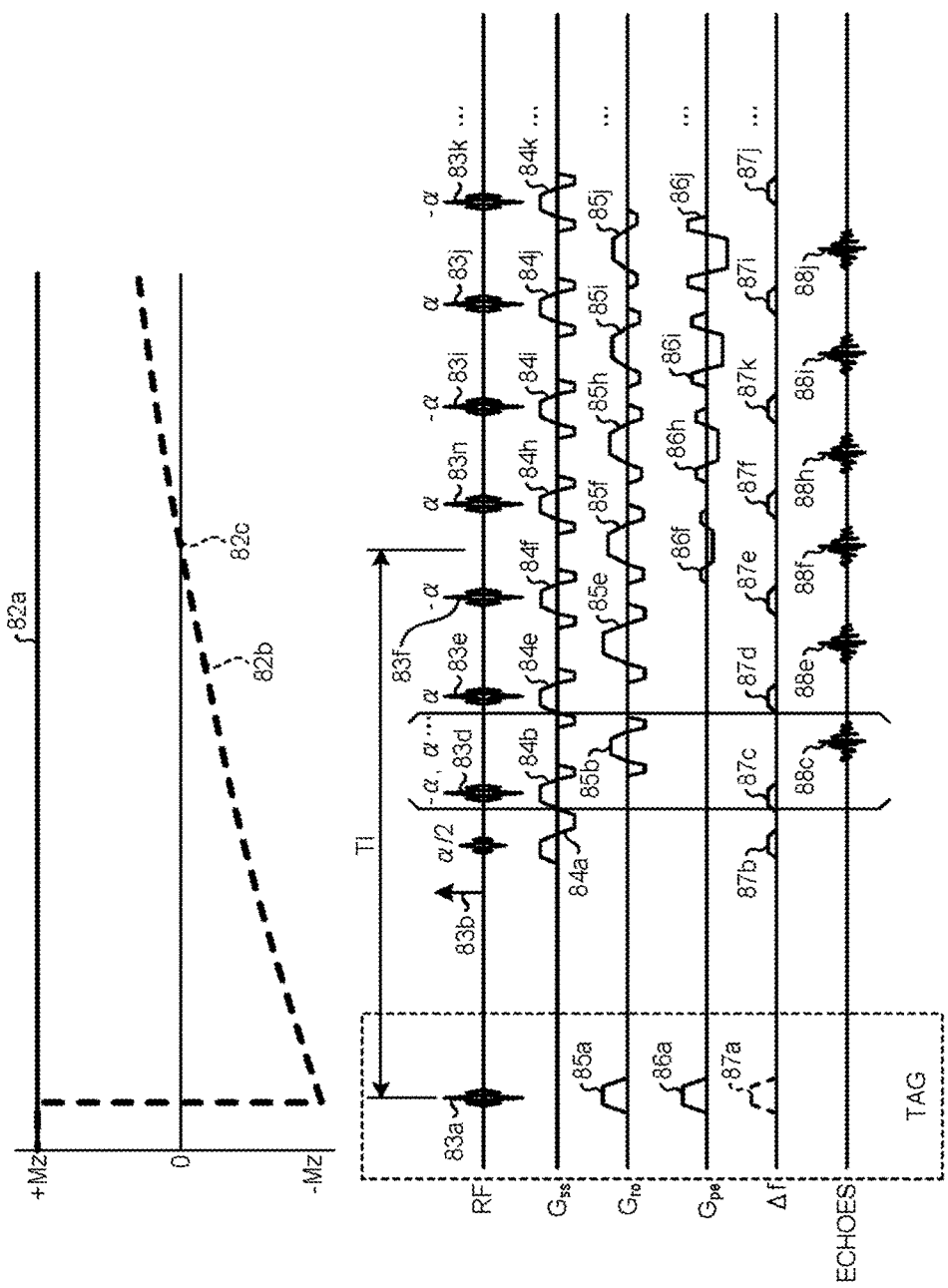

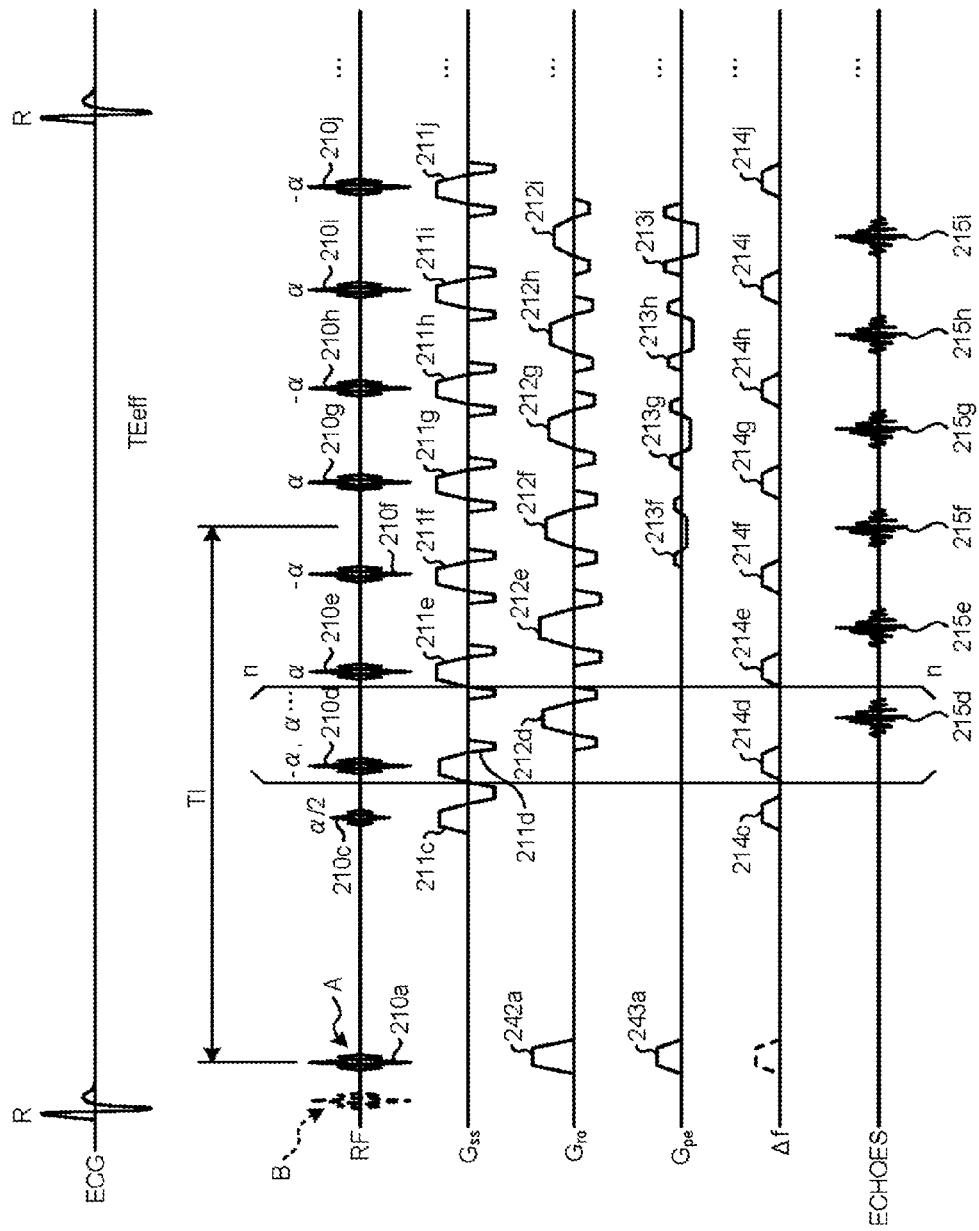

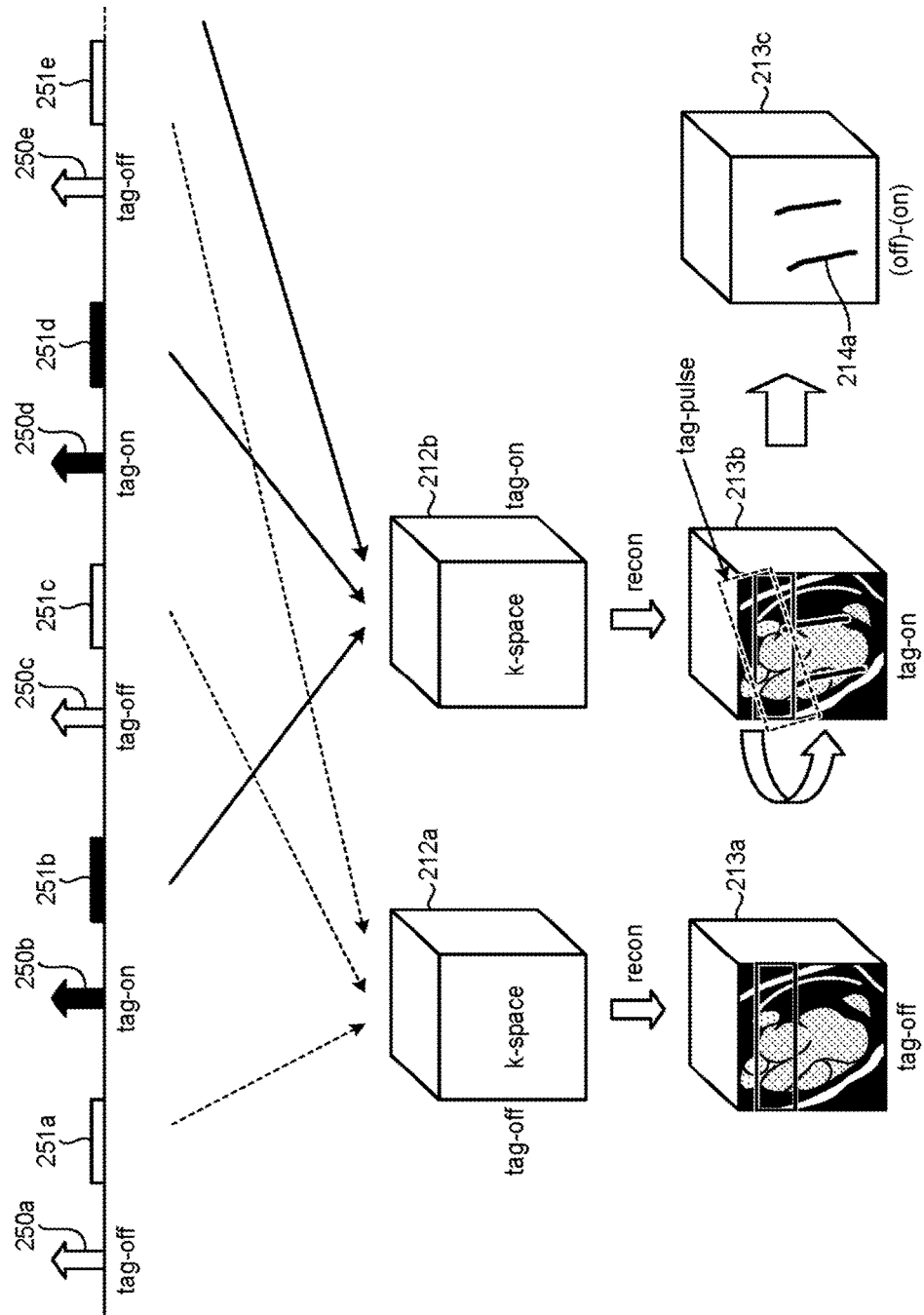

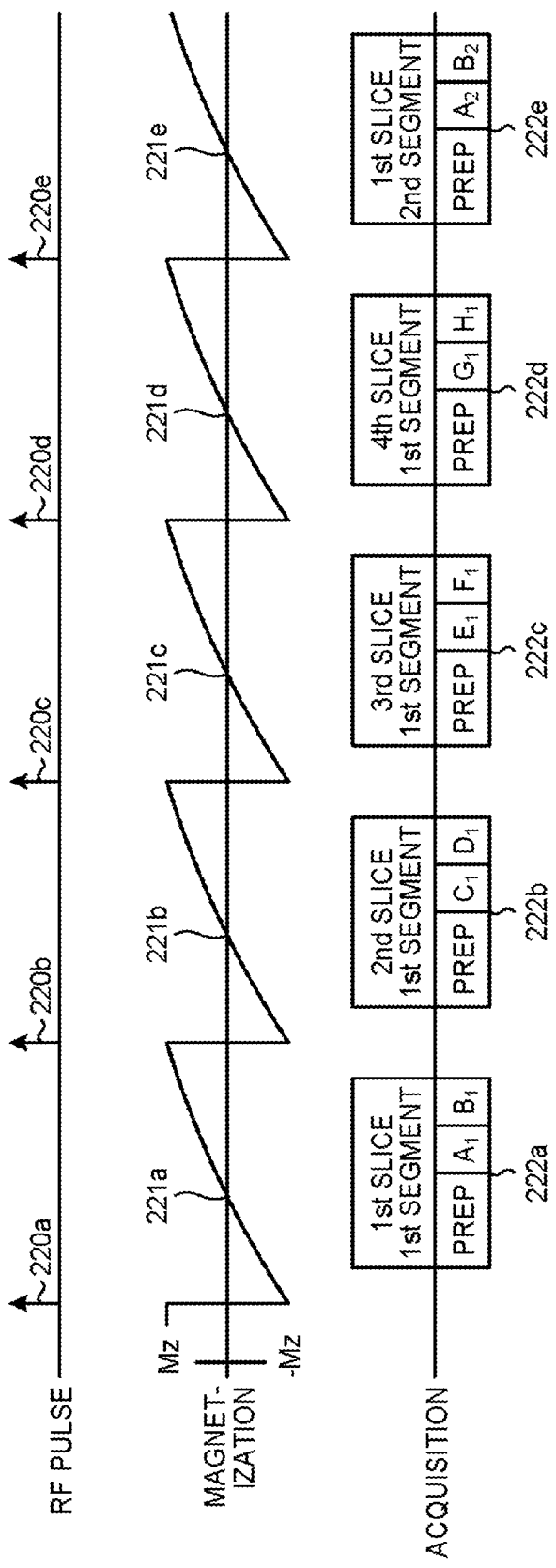

MAGNETIC RESONANCE IMAGING METHOD

FIELD

Embodiments described herein relate generally to a magnetic resonance imaging method.

BACKGROUND

In magnetic resonance imaging, Gadolinium-based contrast agents are often infused into a subject body in order to increase signal sensitivities. However, in some cases, contrast agents are detrimental. For example, contrast agents used in renal imaging become a risk factor for Nephrogenic Systemic Fibrosis (NSF). As for cephalic imaging, Gadolinium deposits remain in the brain after imaging, which becomes a health concern. Thus, non-contrast imaging methods are preferable.

In this context, Time-SLIP (Time-Spatial Labeling Inversion Pulse) is a non-contrast MRA (Magnetic Resonance Angiography) technique using ASL (Arterial Spin Labeling) that provides a user an angiogram whose image quality is equal to or even superior to contrast-enhanced technique. In Time-SLIP method, an inversion pulse is applied and data acquisition is performed at a subsequent imaging sequence during a time period near the null point in which longitudinal magnetization of background tissues becomes substantially zero. Hence, background signals become obliterated and signals of interest become conspicuous.

In data acquisition, Cartesian acquisition is usually used in Time-SLIP method. However, Cartesian acquisition employed in the imaging sequence of a Time-SLIP pulse sequence precludes a magnetic resonance imaging apparatus from robust sampling against motion artifact.

BRIEF DESCRIPTION OF THE DRAWINGS

FIG. 3A, FIG. 3B and FIG. 3C are drawings illustrating processing performed by a magnetic resonance imaging apparatus according to the first embodiment;

FIG. 4A, FIG. 4B, FIG. 4C and FIG. 4D are flowcharts illustrating procedures of processing performed by a magnetic resonance imaging apparatus according to a first embodiment;

FIG. 7A is a diagram illustrating processing performed by a magnetic resonance imaging apparatus according to the first embodiment;

FIG. 7B is a drawing illustrating processing performed by a magnetic resonance imaging apparatus according to the first embodiment;

FIG. 8A is a diagram illustrating processing performed by a magnetic resonance imaging apparatus according to the first embodiment;

FIG. 8B is a drawing illustrating processing performed by a magnetic resonance imaging apparatus according to the first embodiment;

FIG. 9A is a pulse sequence diagram illustrating a pulse sequence executed by a magnetic resonance imaging apparatus according to the first embodiment;

FIG. 9B is a flowchart illustrating a procedure of processing performed by a magnetic resonance imaging apparatus according to the first embodiment;

FIG. 11 and FIG. 12 are pulse sequence diagrams illustrating pulse sequences executed by a magnetic resonance imaging apparatus according to the first embodiment;

FIG. 13B and FIG. 13C are pulse sequence diagrams illustrating pulse sequences executed by a magnetic resonance imaging apparatus according to the first embodiment;

FIG. 14 is a diagram illustrating processing performed by a magnetic resonance imaging apparatus according to the first embodiment;

FIG. 15B is a diagram illustrating processing performed by a magnetic resonance imaging apparatus according to the second embodiment;

DETAILED DESCRIPTION

A magnetic resonance imaging method executed in a magnetic resonance imaging apparatus according to an embodiment comprises: applying an inversion pulse; executing a subsequent imaging sequence including an RF (Radio Frequency) pulse and a gradient magnetic field concurrently applied with the RF pulse in a slice direction and performing, for a slice position selected by the RF pulse and the gradient magnetic field and during a time period including a null point, data acquisition in a plurality of orientations including a center of a two-dimensional k-space.

Exemplary embodiments of a magnetic resonance imaging apparatus and a magnetic resonance imaging method will be explained below with reference to accompanying drawings. Possible embodiments are not limited to exemplary embodiments described below. In principle, the description of each exemplary embodiment is applicable to any other embodiment as well.

First Embodiment

Figure 1:
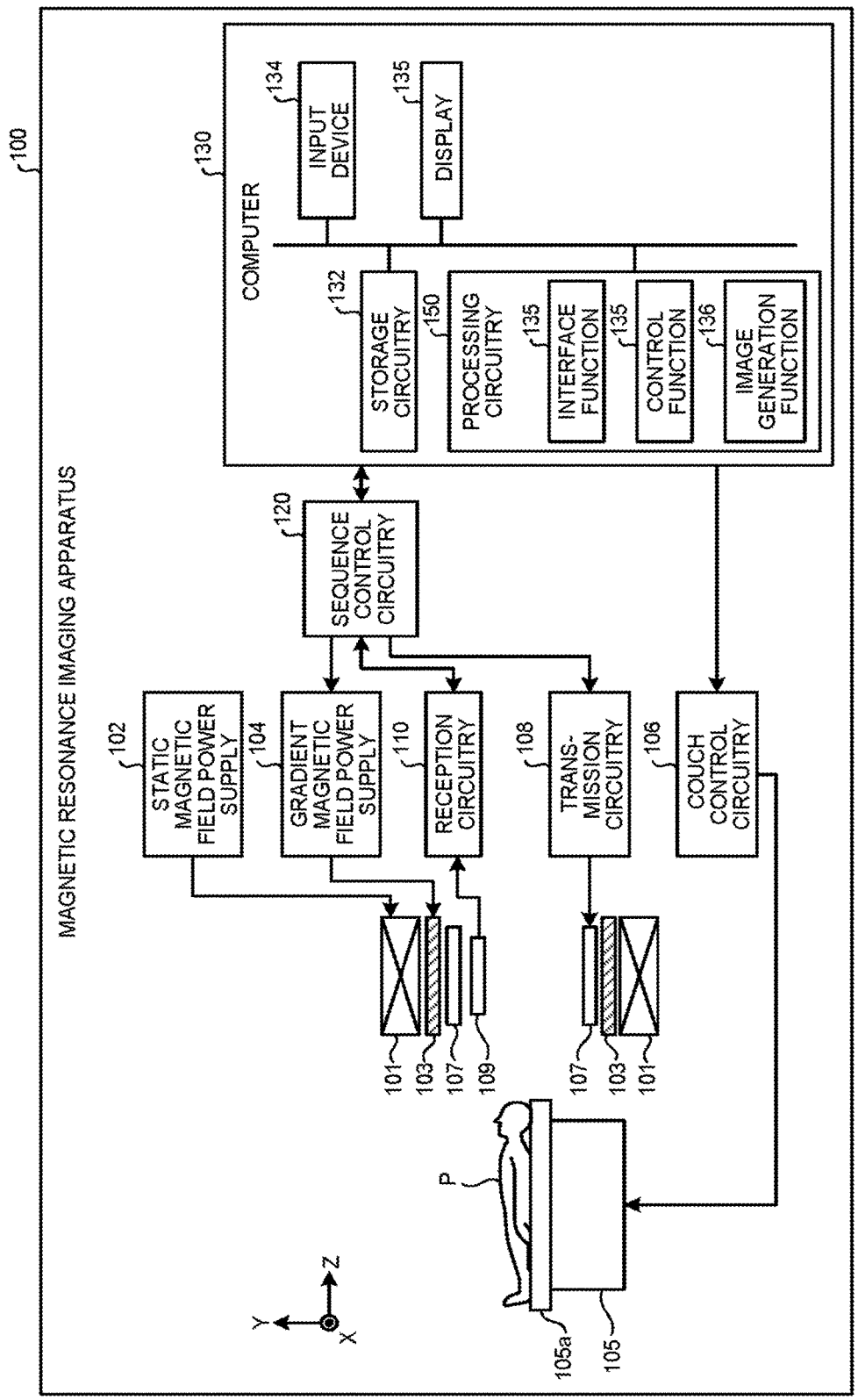
FIG. 1 is a block diagram illustrating a magnetic resonance imaging apparatus according to an embodiment.

FIG. 1 is a block diagram of a magnetic resonance imaging apparatus 100 according to an embodiment. As illustrated in FIG. 1, the magnetic resonance imaging apparatus 100 includes a static magnetic field magnet 101, a static magnetic field power source 102, a gradient coil 103, a gradient magnetic field power source 104, a couch 105, couch control circuitry 106, a transmission coil 107, transmission circuitry 108, a reception coil 109, reception circuitry 110, sequence control circuitry 120, and a computer 130 (which may be called an "image processing apparatus"). The magnetic resonance imaging apparatus 100 does not include an examined subject (such as a human body) P. The configuration illustrated in FIG. 1 is merely an example. In another example, any of the unit included in the sequence control circuitry 120 and the computer 130 may be integrated together or separated, as appropriate.

The static magnetic field magnet 101 is a magnet formed in the shape of a substantially hollow circular cylinder and generates a static magnetic field in a space on an inside thereof. The static magnetic field magnet 101 may be configured by using, for example, a superconducting magnet and is magnetically excited by receiving supply of electric current from the static magnetic field power source 102. The static magnetic field power source 102 supplies electric current to the static magnetic field magnet 101. Alternatively, the static magnetic field magnet 101 may be a permanent magnet, in which case the magnetic resonance imaging apparatus 100 need not comprise the static magnetic field power source 102. Further, the static magnetic field power source 102 may be provided separately from the magnetic resonance imaging apparatus 100.

The gradient coil 103 is a coil formed in a shape of a substantially hollow circular cylinder and is disposed on an inside of the static magnetic field magnet 101. The gradient coil 103 is formed by combining three coils corresponding to X-, Y-, and Z-axes that are orthogonal to one another. These three coils individually receive supply of electric current from the gradient magnetic field power source 104 and generate gradient magnetic fields of which the magnetic field intensities change along the X-, Y-, and Z-axes. The gradient magnetic fields on the X-, Y-, and Z-axes that are generated by the gradient coil 103 correspond to, for example, a slice encode gradient magnetic field Gs, a phase encode gradient magnetic field Ge, and a readout gradient magnetic field Gr, respectively. The gradient magnetic field power source 104 supplies the electric current to the gradient coil 103.

The couch 105 includes a couchtop 105a on which the subject P is placed. Under control of the couch control circuitry 106, while the subject P is placed thereon, the couchtop 105a is inserted into a hollow (i.e., an image taking opening) of the gradient coil 103. Normally, the couch 105 is provided so that a longitudinal direction thereof extends parallel to a central axis of the static magnetic field magnet 101. Under control of the computer 130, the couch control circuitry 106 drives the couch 105 so that the couchtop 105a moves in longitudinal directions and in up-and-down directions.

The transmission coil 107 is disposed on an inside of the gradient coil 103 and generates a radio frequency magnetic field by receiving a supply of a radio frequency (RF) pulse from the transmission circuitry 108. The transmission circuitry 108 supplies an RF pulse corresponding to Larmor frequency determined by a type of targeted atoms and magnetic field intensities, to the transmission coil 107.

The reception coil 109 is disposed on an inside of the gradient coil 103 and receives magnetic resonance signals (hereinafter, "MR signals", as necessary) emitted from the subject P subjected to an influence of a radio frequency magnetic field. Upon reception of magnetic resonance signals, the reception coil 109 outputs the received magnetic resonance signals to the reception circuitry 110.

The transmission coil 107 and the reception coil 109 described above are mere examples. The configuration thereof may be realized by selecting one of the following or combining together two or more of the following: a coil having only a transmission function; a coil having only a reception function; and a coil having transmission and reception functions.

The reception circuitry 110 detects the magnetic resonance signals output from the reception coil 109 and generates magnetic resonance data based on the detected magnetic resonance signals. More specifically, the reception circuitry 110 generates the magnetic resonance data by applying a digital conversion to the magnetic resonance signals output from the reception coil 109. Further, the reception circuitry 110 transmits the generated magnetic resonance data to the sequence control circuitry 120. The reception circuitry 110 may be provided on a gantry device side where the static magnetic field magnet 101, the gradient coil 103, and the like are provided.

The sequence control circuitry 120 images the subject P, by driving the gradient magnetic field power source 104, the transmission circuitry 108, and the reception circuitry 110, on the basis of sequence information transmitted from the computer 130. The sequence information is information that defines a procedure of the imaging. The sequence information defines: an intensity of electric current to be supplied from the gradient magnetic field power source 104 to the gradient coil 103 and a timing with which electric current is to be supplied; an intensity of an RF pulse to be supplied by the transmission circuitry 108 to the transmission coil 107 and the timing with which an RF pulse is to be applied; a timing with which magnetic resonance signals are to be detected by the reception circuitry 110, and the like. The sequence control circuitry 120 may be configured with an integrated circuit such as an Application Specific Integrated Circuit (ASIC) or a Field Programmable Gate Array (FPGA) or an electronic circuit such as a Central Processing Unit (CPU) or a Micro Processing Unit (MPU).

Further, upon reception of a magnetic resonance data from the reception circuitry 110 as a result of imaging of the subject P by driving the gradient magnetic field power source 104, the transmission circuitry 108, and the reception circuitry 110, the sequence control circuitry 120 forwards the received magnetic resonance data to the computer 130.

The computer 130 exercises overall control of the magnetic resonance imaging apparatus 100, or generates an image, and the like. The computer 130 comprises storage circuitry 132, an input device 134, a display 135 and processing circuitry 150. The processing circuitry 150 includes an interface function 131, a control function 133 and an image generation function 136.

In the first embodiment, each processing function carried out at the interface function 131, the control function 133, the image generation function 136, is stored in the storage circuitry 132 in a form of an executable program by a computer. The processing circuitry 150 is a processor realizing a function corresponding to each program by reading a program from the storage circuitry 132 and thereafter executing the program. In other words, the processing circuitry 150 in a state of having read each program has each function illustrated within the processing circuitry 150 in FIG. 1. It is noted that, in FIG. 1, it is explained that the single processing circuitry 150 realizes the processing function carried out at the interface function 131, the control function 133, or the image generation function 136. However, a plurality of independent processors may constitute the processing circuitry 150, each processor of the processing circuitry 150 executing its own program. In other words, each function described above may constitute a program and the single processing circuitry may execute each program. Alternatively, a specific function may be implemented in an independent program execution circuitry dedicated for the specific function.

Terminology "processor" used in the above explanation is meant to refer to, for example, CPU (Central Processing Unit), GPU (Graphical Processing Unit), or ASIC (Application Specific Integrated Circuit), circuitry such as programmable logic device (i.e. SPLD (Simple Programmable Logic Device), CPLD (Complex Programmable Logic Device) and FPGA (Field Programmable Gate Array). A processor reads and executes a program stored in the storage circuitry 132, thereby realizing the function.

Further, instead of being stored in the storage circuitry 132, a program may be constructed such that it is directly incorporated within circuitry of a processor. In that situation, the processor realizes a function by reading and executing the program incorporated within the circuitry. The couch control circuitry 106, the transmission circuitry 108, the reception circuitry 110 may be constructed as well, with a use of electronic circuits such as processors described above.

The processing circuitry 150 sends sequence information to the sequence control circuitry 120 by the interface function 131 and receives a magnetic resonance data from the sequence control circuitry 120. Further, upon reception of the magnetic resonance data, the processing circuitry 150 stores the received magnetic resonance data into the storage circuitry 132 by the interface function 131. When receiving the magnetic resonance data, the processing circuitry 150 having the interface function 131 stores the received magnetic resonance data in the storage circuitry 132.

The magnetic resonance data stored in the storage circuitry 132 is arranged into a k-space by the control function 133. As a result, the storage circuitry 132 stores therein a k-space data.

The storage circuitry 132 stores therein the magnetic resonance data received by the processing circuitry 150 that has the interface function 131, the k-space data arranged in the k-space by the processing circuitry 150 having the control function 133, an image data generated by the processing circuitry 150 having the image generation function 136, and the like. For example, the storage circuitry 132 is configured by using a Random Access Memory (RAM), a semiconductor memory element such as a flash memory, a hard disk, an optical disc, and the like.

The input device 134 receives various types of instructions and inputs of information from an operator. For example, the input device 134 is a pointing device such as a mouse or a trackball, a selecting device such as a mode changing switch, or an input device such as a keyboard. Under the control of the processing circuitry 150 that has the control function 133, the display 135 displays Graphical User Interface (GUI) used for receiving an input of an image taking condition and an image generated by the processing circuitry 150 that has the image generation function 136, and the like. For example, the display 135 is a display device such as a liquid crystal display device.

The processing circuitry 150 exercises overall control of the magnetic resonance imaging apparatus 100 by the control function 133 and controls image capturing processing, image generation processing, image display processing, and the like. For example, the processing circuitry 150 that has the control function 133 receives an input of the image taking condition (e.g., an image taking parameter) via the GUI and generates sequence information according to the received image taking condition. Further, the processing circuitry 150 that has the control function 133 transmits the generated sequence information to the sequence control circuitry 120.

The processing circuitry 150 reads a k-space data from the storage circuitry 132 by the image generation function 136 and generates an image through a reconstructing process such as Fourier transform on the read k-space data.

Next, background of a magnetic resonance imaging apparatus according to a first embodiment is briefly explained. In magnetic resonance imaging, Gadolinium-based contrast agents are often infused into a subject body in order to increase signal sensitivities. However, in some cases, contrast agents are detrimental. For example, contrast agents used in renal imaging become a risk factor for Nephrogenic Systemic Fibrosis (NSF). As for cephalic imaging, Gadolinium deposits remain in the brain after imaging, which becomes a health concern. Thus, non-contrast imaging methods are preferable.

In this context, Time-SLIP (Time-Spatial Labeling Inversion Pulse) is a non-contrast MRA (Magnetic Resonance Angiography) technique using ASL (Arterial Spin Labeling) that provides a user an angiogram whose image quality is equal to or even superior to contrast-enhanced technique. In Time-SLIP method, the sequence control circuitry 120 applies an inversion and executes a subsequent imaging sequence, thereby performing data acquisition. In Time-SLIP method, data acquisition is performed including the null point (near the null point), in which longitudinal magnetization of background tissues becomes substantially zero. Thus, for example, background signals become obliterated and signals of interest become conspicuous. In data acquisition, Cartesian acquisition is usually used in Time-SLIP method.

However, Cartesian acquisition employed in the imaging sequence of a Time-SLIP pulse sequence precludes a magnetic resonance imaging apparatus from robust sampling against motion artifact. For one reason, in Cartesian sampling, sampling density is the same between a region in the vicinity of the center of a k-space and a region other than the vicinity of the center of a k-space. On the other hand, in radial sampling, a larger number of times of sampling is performed in the vicinity of the center of a k-space than in a region other than the vicinity of the center of a k-space. To put it in another way, Cartesian sampling has less redundancy in the vicinity of the center of a k-space than radial sampling, thus less robust against motion artifact. Hence, it is preferable that radial sampling be employed in the imaging sequence of Time-SLIP method. Further, radial sampling has an advantage that TE (echo time) becomes short by using a pulse sequence such as an UTE (Ultrashort Echo Time) sequence.

However, true 3D radial acquisition, in other words, spherical sampling in three-dimensional k-space, is time-consuming.

In this context, the sequence control circuitry 120 of a magnetic resonance imaging apparatus according to the following embodiments performs 3D acquisition with any two directions radial and the third direction Cartesian (also referred to as a stack-of-star radial sampling). Compared to true 3D radial acquisition (spherical sampling in three-dimensional k-space), 3D acquisition with any two directions radial and the third direction Cartesian is easier to handle. Furthermore, compared to true 3D radial acquisition that is essentially inseparable 3D acquisition, 3D acquisition with any two directions radial and the third direction Cartesian is an aggregate of mutually independent 2D acquisition. Hence, compared to true-3D radial acquisition, 3D acquisition with any two directions radial and the third direction Cartesian has more flexibility as to adjustment of parameters of a pulse sequence depending on a feature of an object to be imaged, such as flow velocity. This adjustment is realized, for example, by adjusting the number of slices to be acquired within a predetermined time period. Hence, the magnetic resonance imaging apparatus 100 can tailor segmented Time-SLIP 3D acquisition with any two directions radial and the third direction Cartesian, for example, with ECG gating or/and respiratory gating to accommodate flow speed of various vessels.

In summary, the sequence control circuitry 120 of a magnetic resonance imaging apparatus according to the first embodiment combines 3D acquisition with any two directions radial and the third direction Cartesian with spin labeling technique, thereby obtaining robustness against motion artifact. The magnetic resonance imaging apparatus according to the first embodiment becomes capable of adjusting parameters of a pulse sequence depending on a feature of an object to be imaged and becomes capable of quick acquiring of data.

Figure 2A:
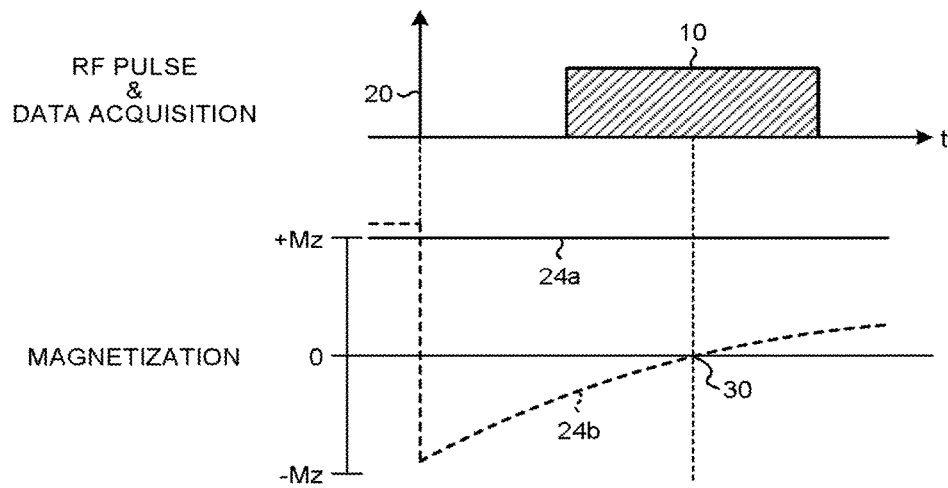
FIG. 2A, FIG. 2B, FIG. 2C and FIG. 2D are diagrams illustrating processing performed by a magnetic resonance imaging apparatus according to the first embodiment.
Figure 2B:
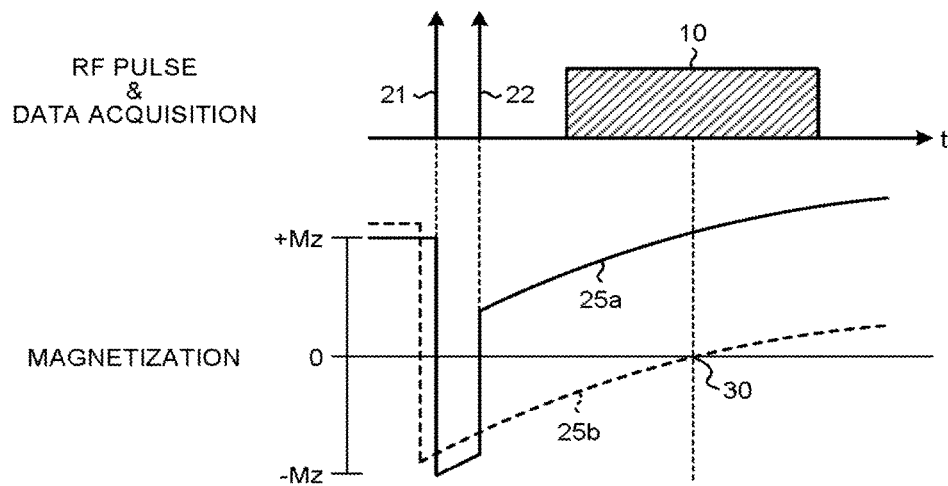
Figure 2C:
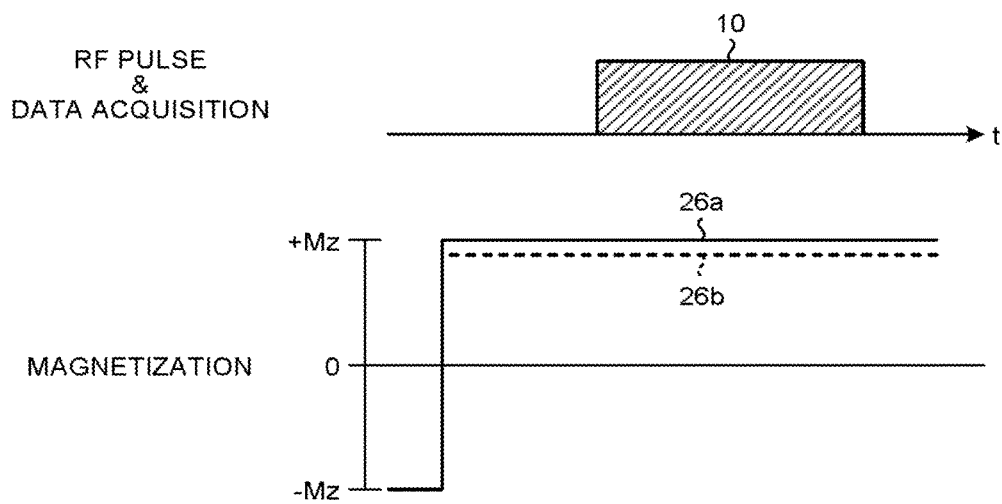
Figure 2D:
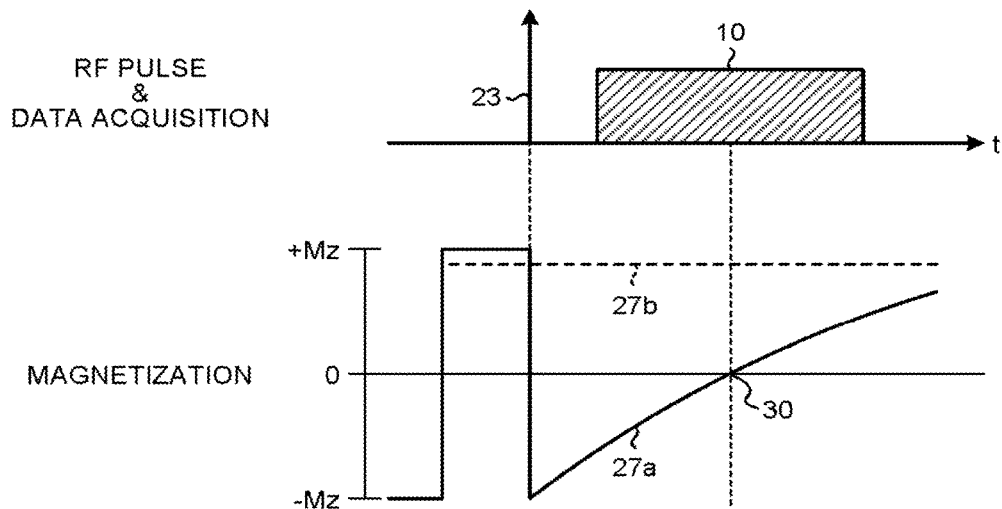
Figure 3B:
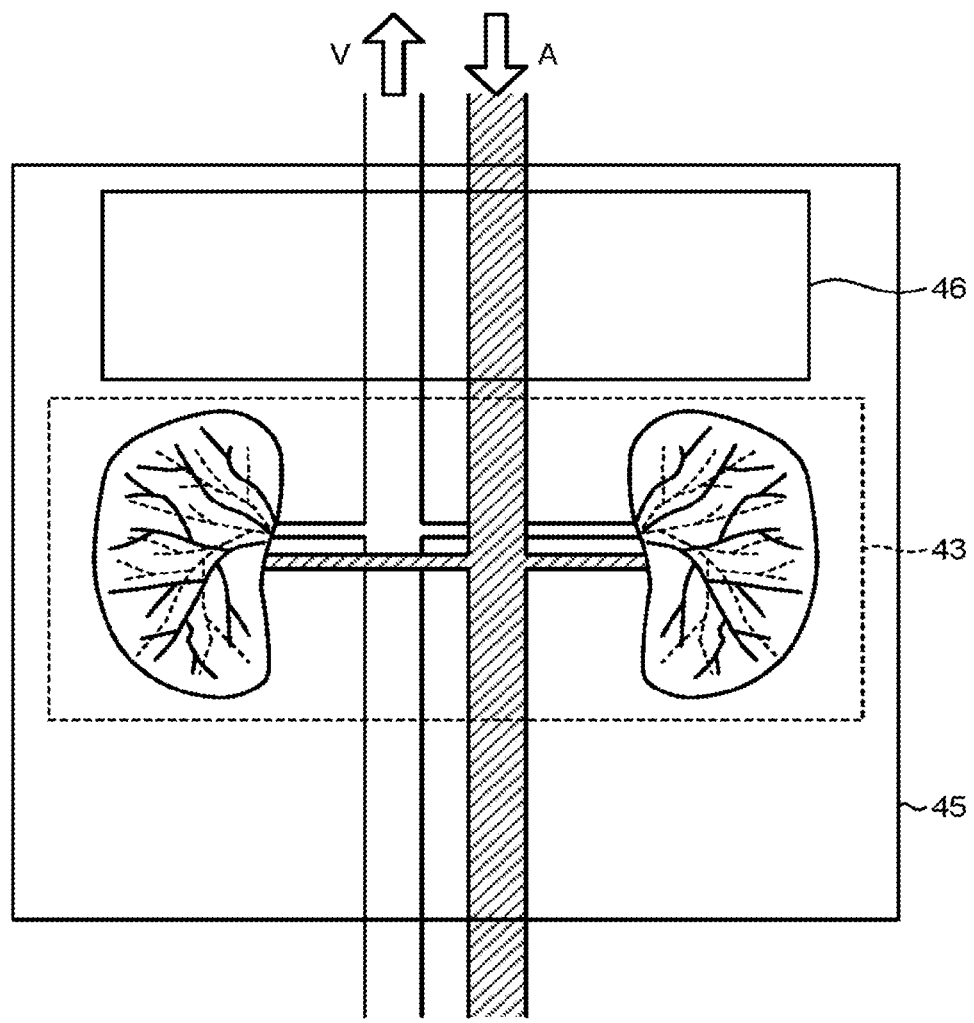
Figure 4A:
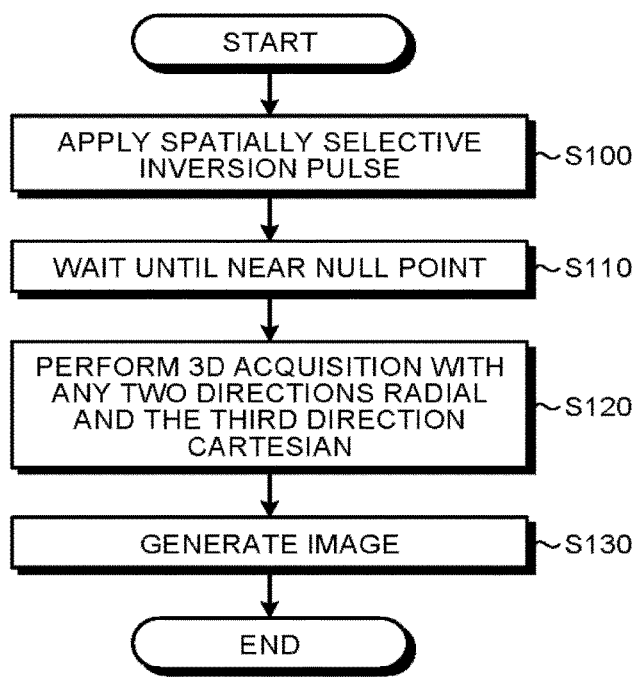
Figure 4B:
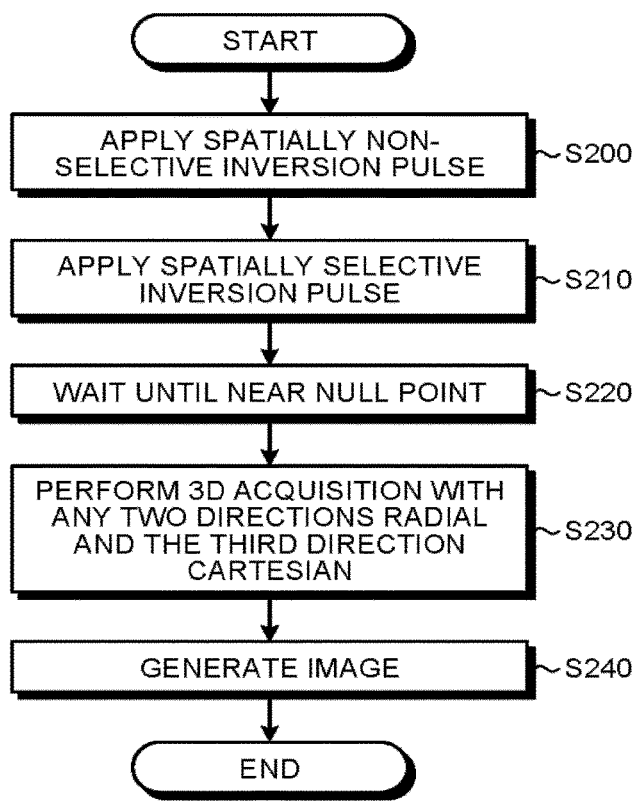

With reference to FIG. 2A, FIG. 2B and FIG. 2C, FIG. 3A, FIG. 3B, FIG. 3C, FIG. 4A, FIG. 4B and FIG. 4C an overall procedure of Time-SLIP method according to a magnetic resonance imaging apparatus according to the first embodiment is explained. FIG. 2A, FIG. 2B, FIG. 2C and FIG. 2D are diagrams illustrating processing performed by a magnetic resonance imaging apparatus according to the first embodiment. FIG. 3A, FIG. 3B and FIG. 3C are drawings illustrating processing performed by a magnetic resonance imaging apparatus according to the first embodiment. FIG. 4A, FIG. 4B and FIG. 4C are flowcharts illustrating procedures of processing performed by a magnetic resonance imaging apparatus according to a first embodiment.

There are three main variants in Time-SLIP method, that is to say, so-called "flow-in" method, so-called "flow-out" method, and so-called "tag-on/tag-off" method. FIG. 2A, FIG. 3A and FIG. 4A illustrate "flow-in" method. FIG. 2B, FIG. 3B and FIG. 4B illustrate "flow-out" method. FIG. 2C, FIG. 3C, FIG. 3D and FIG. 4C illustrate "tag-on/tag-off" method.

First of all, "flow-in" method is explained with reference to FIG. 2A, FIG. 3A and FIG. 4A.

The top row of FIG. 2A illustrate RF pulses applied and the data acquisition period in which an imaging sequence is performed. The horizontal axis indicates time. A spatially selective inversion pulse 20 indicates a spatially selective inversion pulse applied by the sequence control circuitry 120. A data acquisition time period 10 indicates a time period suitable for data acquisition in which the imaging sequence is executed.

In the bottom row of FIG. 2A, the horizontal axis indicates time. The vertical axis indicates longitudinal magnetization. A curve 24b indicates, as a function of time, longitudinal magnetization of spins to which the spatially selective inversion pulse 20 is applied. On the other hand, a curve 24a indicates, as a function of time, longitudinal magnetization of spins to which the spatially selective inversion pulse 20 is not applied. A null point 30 indicates a time in which longitudinal magnetization of the curve 24b becomes zero.

In FIG. 3A, a typical situation of "flow-in" renal imaging is illustrated. Kidneys 42a and 42b represent kidneys of a subject. An artery upstream position 40a and an artery downstream position 40g represent an upstream and a downstream position of the descending aorta, respectively. A vein upstream position 41a and a vein downstream position 40f represent an upstream and a downstream position of the inferior vena cava. Renal arteries 40b and 40h represent renal arteries. Renal veins 41b and 40e represent renal veins. An artery 40c represents an artery in the kidney 42a. A vein 40d represents a vein in the kidney 42a. An artery 40i represents an artery in the kidney 42b. A vein 40j represents a vein in the kidney 42b. Most of the arterial blood at the artery upstream position 40a travels to the artery downstream position 40g straightforwardly. Venous blood at the vein upstream position 41a travels to the vein downstream position 40f straightforwardly. On the other hand, some of the arterial blood at the artery upstream position 40a enters into the renal artery 40b, subsequently the artery 40c, and then returns to the vein 40d, the renal vein 40e, and reaches the vein downstream position 40f.

Alternatively, some of the arterial blood at the artery upstream position 40a enters into the renal artery 40h, subsequently the artery 40i, and then returns to the vein 40j, the renal vein 41b, and reaches the vein downstream position 40f. A pulse application region 44 represents a region in which the spatially selective inversion pulse 20 is applied. The pulse application region 44 is inclusive of the vein upstream region 41a. An imaging region 43 represents a region in which data acquisition is performed.

FIG. 4A is a flowchart illustrating a procedure of processing of "flow-in" Time-SLIP method. In FIG. 4A, the sequence control circuitry 120 applies a spatially selective inversion pulse as an inversion pulse (Step S100). For example, the sequence control circuitry 120 applies the spatially selective inversion pulse 20 to the pulse application region 44.

An inversion pulse is an RF pulse that rotates a spin to which the inversion pulse is applied by 180 degrees. Thus, when an inversion pulse is applied, a spin having a longitudinal magnetization of $+M_z$ becomes a spin having a longitudinal magnetization of $-M_z$.

Further, a spatially selective inversion pulse is an inversion pulse that rotates spins that are within a particular region. On the other hand, a spatially selective inversion pulse does not rotate spins that are not within the particular region.

For example, when the spatially selective inversion pulse 20 is applied by the sequence control circuitry 120 to the pulse application region 44, as illustrated in the curve 24b, the longitudinal magnetization is changed from $+M_z$ to $-M_z$. On the other hand, for a region other than the pulse application region 44, as illustrated in the curve 24a, even if the spatially selective inversion pulse 20 is applied by the sequence control circuitry 120, the longitudinal magnetization remains unchanged.

As illustrated in FIG. 2A, the longitudinal magnetization gradually recovers as time passes. The sequence control circuitry 120 waits until near the null point 30 (Step S110). The null point is the time on which longitudinal magnetization becomes zero.

At this time, in other words, during the data acquisition time period 10, the sequence control circuitry 120 performs 3D acquisition with any two directions radial and the third direction Cartesian (Step S120). This step is explained later in more detail. Upon completion of the 3D acquisition using 3D acquisition with any two directions radial and the third direction Cartesian by the sequence control circuitry 120, the processing circuitry 150 generates an image based on the data acquisition pulse sequence executed by the processing circuitry 150 (Step S130).

In FIG. 3A, the sequence control circuitry 120 applies the spatially selective inversion pulse 20 to the pulse application region 44. As is pointed out earlier, the pulse application region 44 is inclusive of the upstream region of the vein, such as the vein upstream position 41a. The sequence control circuitry 120 choose the pulse application region 44 such that venous blood that is within the imaging region 43 at the null point 30 (in other words, during the data acquisition time period 10) is venous blood that is within the pulse application region 44 at the time of application of the spatially selective inversion pulse 20 by the sequence control circuitry 120. If this condition is satisfied, the venous blood that is within the imaging region 43 at the null point 30 is blood whose longitudinal magnetization is substantially zero. Thus, signals of the venous blood become obliterated during the data acquisition time period 10.

On the other hand, as for arterial blood, the pulse application region 44 is not inclusive of the upstream region of the artery, such as the artery upstream position 40a. The sequence control circuitry 120 choose the pulse application region 44 such that arterial blood that is within the kidneys 42a and 42b at the null point 30 (in other words, during the data acquisition time period 10) is arterial blood that is outside the pulse application region 44 at the time of application of the spatially selective inversion pulse 20 by the sequence control circuitry 120. If this condition is satisfied, the arterial blood that is within the kidneys 42a and 42b at the null point 30 is blood which is not subjected to the spatially selective inversion pulse 20. Thus, signals of the arterial blood that is within the kidneys 42a and 42b become conspicuous during the data acquisition time period 10.

Secondly, "flow-out" method is explained with reference to FIG. 2B, FIG. 3B and FIG. 4B.

The top row of FIG. 2B illustrate RF pulses applied and the data acquisition period in which an imaging sequence is performed. The horizontal axis indicates time. A spatially non-selective inversion pulse 21 indicates a spatially non-selective inversion pulse applied by the sequence control circuitry 120. A spatially selective inversion pulse 22 indicates a spatially selective inversion pulse applied by the sequence control circuitry 120. A data acquisition time period 10 in FIG. 2B indicates a time period suitable for data acquisition in which the imaging sequence is executed.

In the bottom row of FIG. 2B, similarly to FIG. 2A, the horizontal axis indicates time. The vertical axis indicates longitudinal magnetization. A curve 25a indicates, as a function of time, longitudinal magnetization of spins to which the spatially selective inversion pulse 22 is applied, as well as the spatially non-selective inversion pulse 21. On the other hand, a curve 25b indicates, as a function of time, longitudinal magnetization of spins to which the spatially selective inversion pulse 22 is not applied and only the spatially non-selective inversion pulse 21 is applied.

A null point 30 in FIG. 2B indicates a time in which longitudinal magnetization of the curve 25b becomes zero.

In FIG. 3B, a typical situation of "flow-out" renal imaging is illustrated. A pulse application region 45 represents a region in which the spatially non-selective inversion pulse 21 is applied. A pulse application region 46 represents a region in which the spatially selective inversion pulse 22 is applied. The pulse application region 46 is inclusive of the upstream region of the artery. An imaging region 43 in FIG. 3B represents a region in which data acquisition is performed, similarly to FIG. 3A.

FIG. 4B is a flowchart illustrating a procedure of processing of "flow-out" Time-SLIP method. In FIG. 4B, the sequence control circuitry 120 applies a spatially non-selective inversion pulse (Step S200). For example, the sequence control circuitry 120 applies the spatially non-selective inversion pulse 21 to the pulse application region 45. A spatially non-selective inversion pulse is an inversion pulse that rotates spins of all the regions.

For example, when the spatially non-selective inversion pulse 21 is applied by the sequence control circuitry 120 to the pulse application region 46, as illustrated in curve 25a, the longitudinal magnetization is changed from $+M_z$ to $-M_z$. Furthermore, when the spatially non-selective inversion pulse 21 is applied by the sequence control circuitry to a region other than the pulse application region 46, as illustrated in curve 25b, the longitudinal magnetization is also changed from $+M_z$ to $-M_z$.

Subsequently, the sequence control circuitry 120 applies, for example, a spatially selective inversion pulse 22 to the pulse application region 46 (Step S210). When the spatially selective inversion pulse 22 is applied by the sequence control circuitry 120 to the pulse application region 46, as illustrated in curve 25a, the longitudinal magnetization of the pulse application region 46 is inverted. On the other hand, for a region other than the pulse application region 46, as illustrated in curve 25b, even if the spatially selective inversion pulse 22 is applied by the sequence control circuitry 120 to the pulse application region 46, the longitudinal magnetization remains unchanged.

As illustrated in FIG. 2B, the longitudinal magnetization gradually recovers as time passes. The sequence control circuitry 120 waits until near the null point 30 (Step S220). The null point is the time on which longitudinal magnetization of a region other than the pulse application region 46 becomes zero.

At this time, in other words, during the data acquisition time period 10, the sequence control circuitry 120 performs 3D acquisition with any two directions radial and the third direction Cartesian (Step S230). This step is explained later in more detail. Subsequent to the 3D acquisition with any two directions radial and the third direction Cartesian by the sequence control circuitry 120, the processing circuitry 150 generates an image (Step S240).

In FIG. 3B, the sequence control circuitry 120 applies the spatially selective inversion pulse 22 to the pulse application region 46. As is pointed out earlier, the pulse application region 46 is the upstream region of the artery. The sequence control circuitry 120 choose the pulse application region 46 such that arterial blood that is within the imaging region 43 at the null point 30 (in other words, during the data acquisition time period 10) is arterial blood that is within the pulse application region 46 at the time of application of the spatially selective inversion pulse 22 by the sequence control circuitry 120. If this condition is satisfied, the arterial blood that is within the imaging region 43 at the null point 30 is blood whose longitudinal magnetization is inverted twice, first by the spatially non-selective inversion pulse 21 and secondly by the spatially selective inversion pulse 22. Hence, longitudinal magnetization becomes non-zero and signals become conspicuous during the data acquisition time period 10.

On the other hand, for blood that is in a region other than the pulse application region 46 at the time of application of the spatially selective inversion pulse 22, blood that is within the imaging region 43 at the null point 30 is blood whose longitudinal magnetization is inverted once, that is, by the spatially non-selective inversion pulse 21. Hence, longitudinal magnetization becomes substantially zero and signals become obliterated during the data acquisition time period 10.

Thirdly, "tag-on/tag-off" method is explained with reference to FIG. 2C, FIG. 2D, FIG. 3C, FIG. 3D and FIG. 4C.

In "tag-on/tag-off" method, the sequence control circuitry 120 execute two pulse sequences of a "tag-on" pulse sequence and a "tag-off" pulse sequence. The processing circuitry 150 performs a subtraction processing between a "tag-on" image acquired from the "tag-on" pulse sequence and a "tag-off" image acquired from the "tag-off" pulse sequence, thereby acquiring an output image.

Roughly speaking, there are two types of "tag-on/tag-off" method.

In the first method, the sequence control circuitry 120 applies a spatially selective inversion pulse for the "tag-on" pulse sequence and the sequence control circuitry 120 does not apply an inversion pulse for the "tag-off" pulse sequence.

In the second method, the sequence control circuitry 120 applies a spatially non-selective inversion pulse and a spatially selective inversion pulse for the "tag-on" pulse sequence and the sequence control circuitry 120 applies a spatially non-selective inversion pulse for the "tag-off" pulse sequence.

In the following, the former case is explained with reference to FIG. 2C, FIG. 2D, FIG. 3C and FIG. 4C. Subsequently, the latter case is explained with reference to FIG. 4D.

The top row of FIG. 2C illustrates, in a "tag-off" pulse sequence, RF pulses applied and the data acquisition period in which an imaging sequence is performed. The horizontal axis indicates time. In the "tag-off" pulse sequence, no inversion pulse is applied. A data acquisition time period 10 in FIG. 2C indicates a time period suitable for data acquisition in which the imaging sequence is executed.

In the bottom row of FIG. 2C, the horizontal axis indicates time. The vertical axis indicates longitudinal magnetization. A curve 26a indicates longitudinal magnetization of a region in which a spatially-selective inversion pulse is applied in a "tag-on" pulse sequence to be described later. A curve 26b indicates longitudinal magnetization of a region in which the spatially-selective inversion pulse is not applied in the "tag-on" pulse sequence.

The top row of FIG. 2D illustrates, in a "tag-on" pulse sequence, RF pulses applied and the data acquisition period in which an imaging sequence is performed. The horizontal axis indicates time.

The top row of FIG. 2D illustrate RF pulses applied and the data acquisition period in which an imaging sequence is performed in the "tag-on" pulse sequence. The horizontal axis indicates time. A spatially selective inversion pulse 23 indicates a spatially selective inversion pulse applied by the sequence control circuitry 120. A data acquisition time period 10 in FIG. 2D indicates a time period suitable for data acquisition in which the imaging sequence is executed, similarly to FIG. 2C.

In the bottom row of FIG. 2D, similarly to FIG. 2C, the horizontal axis indicates time. The vertical axis indicates longitudinal magnetization. A curve 27a indicates, as a function of time, longitudinal magnetization of a region to which the spatially selective inversion pulse 23 is applied. On the other hand, a curve 27b indicates longitudinal magnetization of a region to which the spatially selective inversion pulse 23 is not applied.

A null point 30 in FIG. 2D indicates a time in which longitudinal magnetization of the curve 27a becomes zero.

In FIG. 3C, a typical situation of "tag-on" renal imaging is illustrated. A pulse application region 47 represents a region in which the spatially selective inversion pulse 23 is applied. An imaging region 43 in FIG. 3C represents a region in which data acquisition is performed.

As for this "tag-off" renal imaging, no inversion pulse is applied. The imaging region for "tag-off" pulse sequence is chosen to be the same as that of "tag-on" pulse sequence for convenience for the subsequent subtraction processing.

FIG. 4C is a flowchart illustrating a procedure of processing of the first method of "tag-on/tag-off" Time-SLIP method. In "tag-on/tag-off" Time-SLIP method, the sequence control circuitry 120 executes two pulse sequences: a "tag-off" pulse sequence and a "tag-on" pulse sequence.

Step S320A to Step S330A are steps corresponding to the "tag-off" pulse sequences. Step S300 to Step S330B are steps corresponding to the "tag-on" pulse sequence. The sequence control circuitry 120 may execute the "tag-on" pulse sequence prior to the "tag-off" pulse sequence or vice versa. The sequence control circuitry 120 may execute the "tag-off" pulse sequence and the "tag-on" pulse sequence sequentially, concurrently, or simultaneously.

In this "tag-off" pulse sequence, the sequence control circuitry 120 does not apply an inversion pulse. During the data acquisition time period 10, the sequence control circuitry 120 performs 3D acquisition with any two directions radial and the third direction Cartesian in the imaging region 43 in FIG. 3C (Step S320A). This step is explained later in more detail. Subsequent to the 3D acquisition with any two directions radial and the third direction Cartesian by the sequence control circuitry 120, the processing circuitry 150 generates a "tag-off" image (Step S330A).

As for the "tag-on" pulse sequence, the sequence control circuitry 120 applies a spatially selective inversion pulse (Step S300). For example, the sequence control circuitry 120 applies the spatially selective inversion pulse 23 to the pulse application region 47.

When the spatially selective inversion pulse 23 is applied by the sequence control circuitry 120 to the pulse application region 47, as illustrated in curve 27a, the longitudinal magnetization is inverted. On the contrary, as illustrated in curve 27b, the longitudinal magnetization remains unchanged for a region other than the pulse application region 47. The longitudinal magnetization gradually recovers as time passes. The sequence control circuitry 120 waits until near the null point 30 (Step S310).

During the data acquisition time period 10, the sequence control circuitry 120 performs 3D acquisition with any two directions radial and the third direction Cartesian (Step S320B). This step is explained later in more detail. Subsequent to the 3D acquisition with any two directions radial and the third direction Cartesian by the sequence control circuitry 120, the processing circuitry 150 generates a tag-on image based on the data acquired by the sequence control circuitry 120 (Step S330B).

In FIG. 3C, the sequence control circuitry 120 applies the spatially selective inversion pulse 23 to the pulse application region 47. The pulse application region 47 is the upstream region of the artery. The sequence control circuitry 120 choose the pulse application region 47 such that arterial blood that is within the imaging region 43 at the null point 30 (in other words, during the data acquisition time period 10) is arterial blood that is within the pulse application region 47 at the time of application of the spatially selective inversion pulse 23 by the sequence control circuitry 120. If this condition is satisfied, the arterial blood that is within the imaging region 43 at the null point 30 is blood whose longitudinal magnetization is inverted by the spatially selective inversion pulse 23 and becomes zero at the null point. Hence, signals become zero during the data acquisition time period 10.

On the other hand, for blood that is in a region other than the pulse application region 47 at the time of application of the spatially selective inversion pulse 23, signals become non-zero during the data acquisition time period 10. In fact, for blood that is in a region other than the pulse application region 47 at the time of application of the spatially selective inversion pulse 23, the signals in the "tag-on" pulse sequence become the same as the signals in the "tag-off" pulse sequences.

Subsequent to the 3D acquisition with any two directions radial and the third direction Cartesian by the sequence control circuitry 120, the processing circuitry 150 generates a "tag-on" image, based on the data acquired in Step S320B by the sequence control circuitry 120 (Step S330B).

Upon completion of the generation of the "tag-off" image in step S330A by the processing circuitry 150 and the generation of the tag-on image in step S330B by the processing circuitry 150, the processing circuitry 150 performs a subtraction operation between the "tag-off" image and the "tag-on" image, to generate an output image (Step S340).

As explained earlier, for blood that is in a region other than the pulse application region 47 at the time of application of the spatially selective inversion pulse 23, the signals in the "tag-on" pulse sequence become the same as the signals in the "tag-off" pulse sequences. Hence, subtraction between the "tag-on" image and the "tag-off" image gives zero.

However, for blood within the pulse application region 47 at the time of application of the spatially selective inversion pulse 23 and within the imaging region 43 at the null point 30, the signals in the "tag-on" pulse sequence is different from those in the "tag-off" pulse. Therefore, blood within the pulse application region 47 at the time of application of the spatially selective inversion pulse 23 and within the imaging region 43 at the null point 30 is selectively depicted upon the subtraction processing of the processing circuitry 150.

To summarize, in the first method of "tag-on/tag-off" method, the sequence control circuitry 120 executes a "tag-off" pulse sequence in which no inversion pulse is applied. The sequence control circuitry 120 executes a "tag-on" pulse sequence in which an inversion pulse is applied, thereby performing data acquisition. The processing circuitry 150 generates a first imaged based on the data acquisition of the "tag-on" pulse sequence. The processing circuitry 150 generates a second image based on the "tag-off" pulse sequence. The processing circuitry 150 performs a subtraction processing between the first image and the second image, thereby generating a third image.

Next, the second method of "tag-on/tag-off" method is explained with reference to FIG. 4D. The difference between the first method and the second method is whether or not spatially non-selective inversion pulses are applied by the sequence control circuitry 120. In the first method, the sequence control circuitry 120 executes a "tag-off" pulse sequence in which no inversion pulse is applied. On the other hand, in the second method, the sequence control circuitry 120 executes a "tag-off" pulse sequence in which a spatially non-selective inversion pulse is applied. In the first method, the sequence control circuitry 120 executes a "tag-on" pulse sequence in which a spatially selective inversion pulse is applied. On the other hand, in the second method, the sequence control circuitry 120 executes a "tag-on" pulse sequence in which a spatially non-selective inversion pulse is applied in addition to a spatially selective pulse. The processing circuitry 150 generates a first imaged based on the data acquisition of the "tag-on" pulse sequence. The processing circuitry 150 generates a second image based on the "tag-off" pulse sequence. The processing circuitry 150 performs a subtraction processing between the first image and the second image, thereby generating a third image.

Figure 4D:
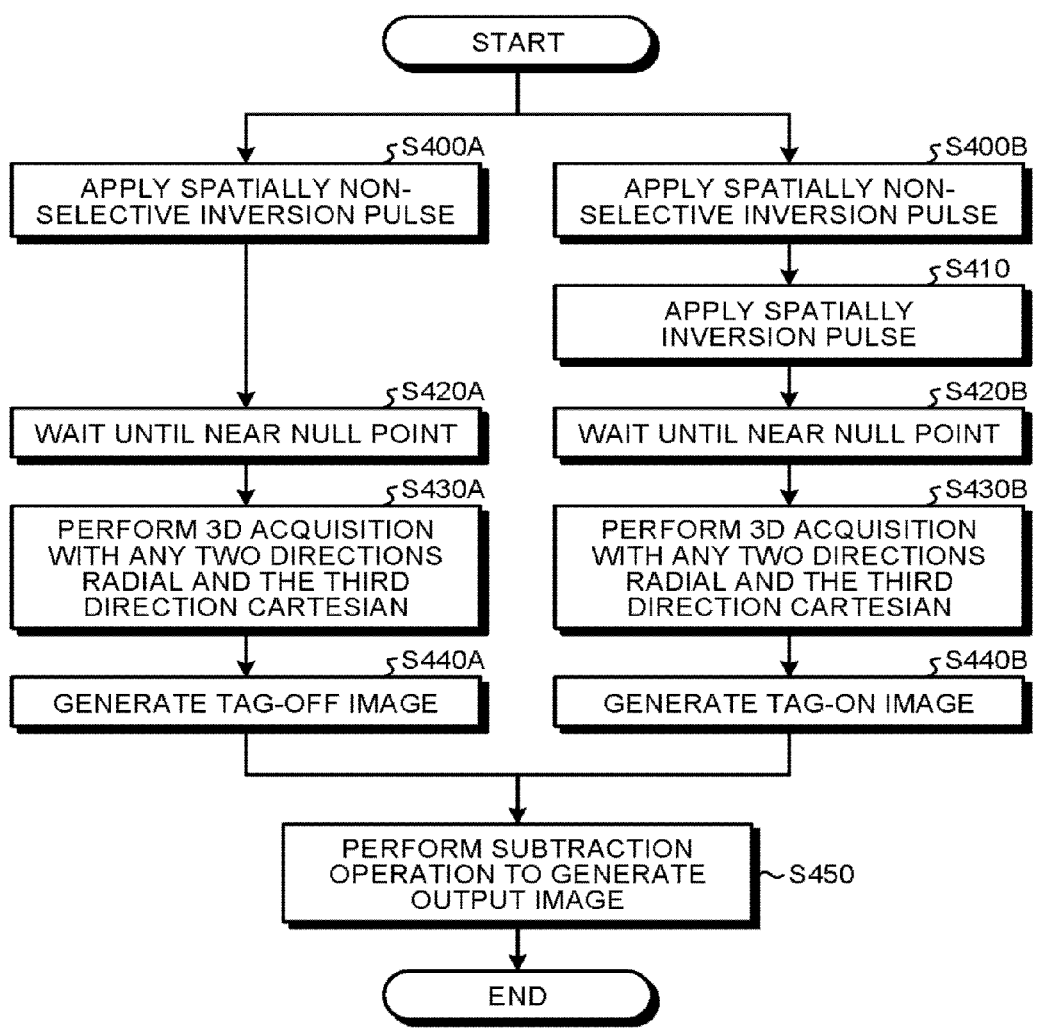

FIG. 4D is a flowchart illustrating a procedure of processing of the second method of "tag-on/tag-off" Time-SLIP method. In the second method of "tag-on/tag-off" Time-SLIP method, similarly to the first method, the sequence control circuitry 120 executes two pulse sequences: a "tag-off" pulse sequence and a "tag-on" pulse sequence.

Step S400A to Step S440A are steps corresponding to the "tag-off" pulse sequences. Step S400B to Step S440B are steps corresponding to the "tag-on" pulse sequence. The sequence control circuitry 120 may execute the "tag-on" pulse sequence prior to the "tag-off" pulse sequence or vice versa. The sequence control circuitry 120 may execute the "tag-off" pulse sequence and the "tag-on" pulse sequence sequentially, concurrently, or simultaneously.

In this "tag-off" pulse sequence, the sequence control circuitry 120 applies a spatially non-selective inversion pulse (Step 400A). The sequence control circuitry 120 waits until near the null point (Step 420A). This situation is similar to FIG. 2A, although in the current case a spatially non-selective inversion pulse is applied, whereas in FIG. 2A a spatially selective inversion pulse 20 is applied.

During the data acquisition time period 10, the sequence control circuitry 120 performs 3D acquisition with any two directions radial and the third direction Cartesian (Step S430A). This step is explained later in more detail. Subsequent to the 3D acquisition with any two directions radial and the third direction Cartesian by the sequence control circuitry 120, the processing circuitry 150 generates a "tag-off" image (Step S440A).

As for the "tag-on" pulse sequence, the sequence control circuitry 120 applies a spatially non-selective inversion pulse (Step 400B). Subsequently, the sequence control circuitry 120 applies a spatially selective inversion pulse (Step 410). The sequence control circuitry 120 waits until near the null point 30 (Step S420B). This situation is similar to that already illustrated in FIG. 2B During the data acquisition time period 10, the sequence control circuitry 120 performs 3D acquisition with any two directions radial and the third direction Cartesian (Step S430B). This step is explained later in more detail. Subsequent to the 3D acquisition with any two directions radial and the third direction Cartesian by the sequence control circuitry 120, the processing circuitry 150 generates a tag-on image based on the data acquired by the sequence control circuitry 120 (Step S440B).

Upon completion of the generation of the "tag-off" image in step S440A by the processing circuitry 150 and the generation of the tag-on image in step S440B by the processing circuitry 150, the processing circuitry 150 performs a subtraction operation between the "tag-off" image and the "tag-on" image, to generate an output image (Step S450).

Next, with reference FIG. 5 to FIG. 10B, the 3D acquisition with any two directions radial and the third direction Cartesian performed by the sequence control circuitry 120 will be explained in full detail. In "flow-in" case, this corresponds to Step S120 in FIG. 4A. In "flow-out" case, this corresponds to Step S230 in FIG. 4B. In "tag-on/tag-off" case, this corresponds to Step S330A and Step S330B in FIG. 4C.

Figure 5:
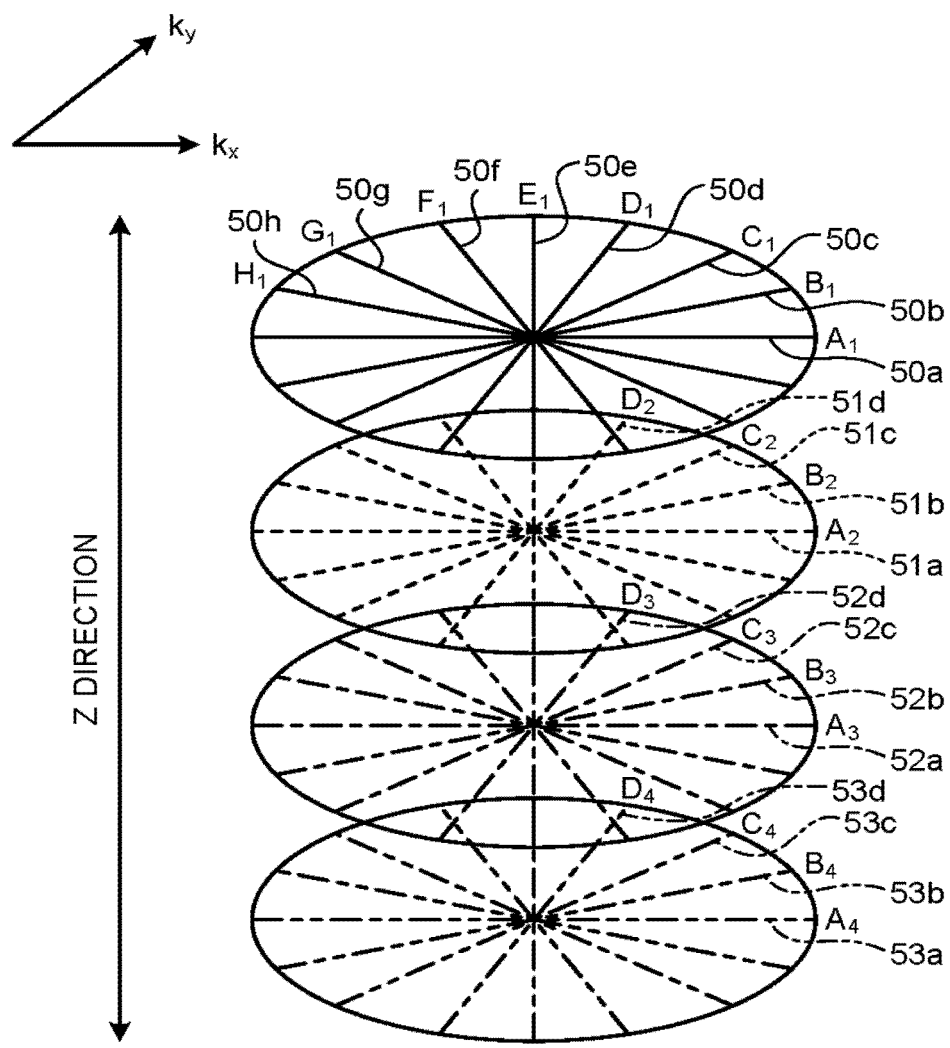
FIG. 5 is a drawing illustrating processing performed by a magnetic resonance imaging apparatus according to the first embodiment.

FIG. 5 is a drawing illustrating processing performed by a magnetic resonance imaging apparatus according to the first embodiment. In FIG. 5, an overall picture of 3D acquisition with any two directions radial and the third direction Cartesian is visualized.

During the data acquisition time period 10, the sequence control circuitry 120 performs an imaging sequence, in which the sequence control circuitry 120 performs data acquisition in a plurality of orientations including a center of a two-dimensional k-space. This situation is illustrated in FIG. 5. In FIG. 5, each disc represents data acquisition for a given slice position (or a position in the z-direction) in a two-dimensional k-space, which consists of two k axes of $k_x$ axis and $k_y$ axis. The choice of x, y and z direction is arbitrary so long as they are orthogonal.

Each disc consists of a plurality of "lines" having different orientation in two-dimensional k-space. For example, a k-space line 50a represents data acquisition of an orientation defined by an equation $k_y=0$. The k-space line 50a is also denoted as $A_1$. Each of a k-space line 50b, a k-space line 50c, a k-space line 50d, a k-space line 50e, a k-space line 50f, a k-space line 50g, a k-space line 50h represents data acquisition of an orientation defined by an equation $k_y=\tan 22.5°*k_x$, $k_y=k_x$, $k_y=\tan 67.5°*k_x$, $k_x=0$, $k_y=\tan 112.5°*k_x$, $k_y=-k_x$, $k_y=\tan 157.5°*k_x$, respectively. Each of the k-space line 50b, the k-space line 50c, the k-space line 50d, the k-space line 50e, the k-space line 50f, the k-space line 50g, the k-space line 50h is also denoted as $B_1$, $C_1$, $D_1$, $E_1$, $F_1$, $G_1$ and $H_1$, respectively. The k-space line 50a to the k-space line 50h are, for example, k-space lines pertinent to a first slice position. On the other hand, a k-space line 51a, a k-space line 51b, a k-space line 51c and a k-space line 51d, for example, are k-space lines pertinent to a second slice position different from the first slice position. A k-space line 52a, a k-space line 52b, a k-space line 52c and a k-space line 52d are k-space lines pertinent to a third slice position. A k-space line 53a, a k-space line 53b, a k-space line 53c and a k-space line 53d are k-space lines pertinent to a fourth slice position. The k-space lines 51a, 51b, 51c, 51d, 52a, 52b, 52c, 52d, 53a, 53b, 53c and 53d are also denoted as $A_2$, $B_2$, $C_2$, $D_2$, $A_3$, $B_3$, $C_3$, $D_3$, $A_4$, $B_4$, $C_4$ and $D_4$, respectively.

Figure 6A:
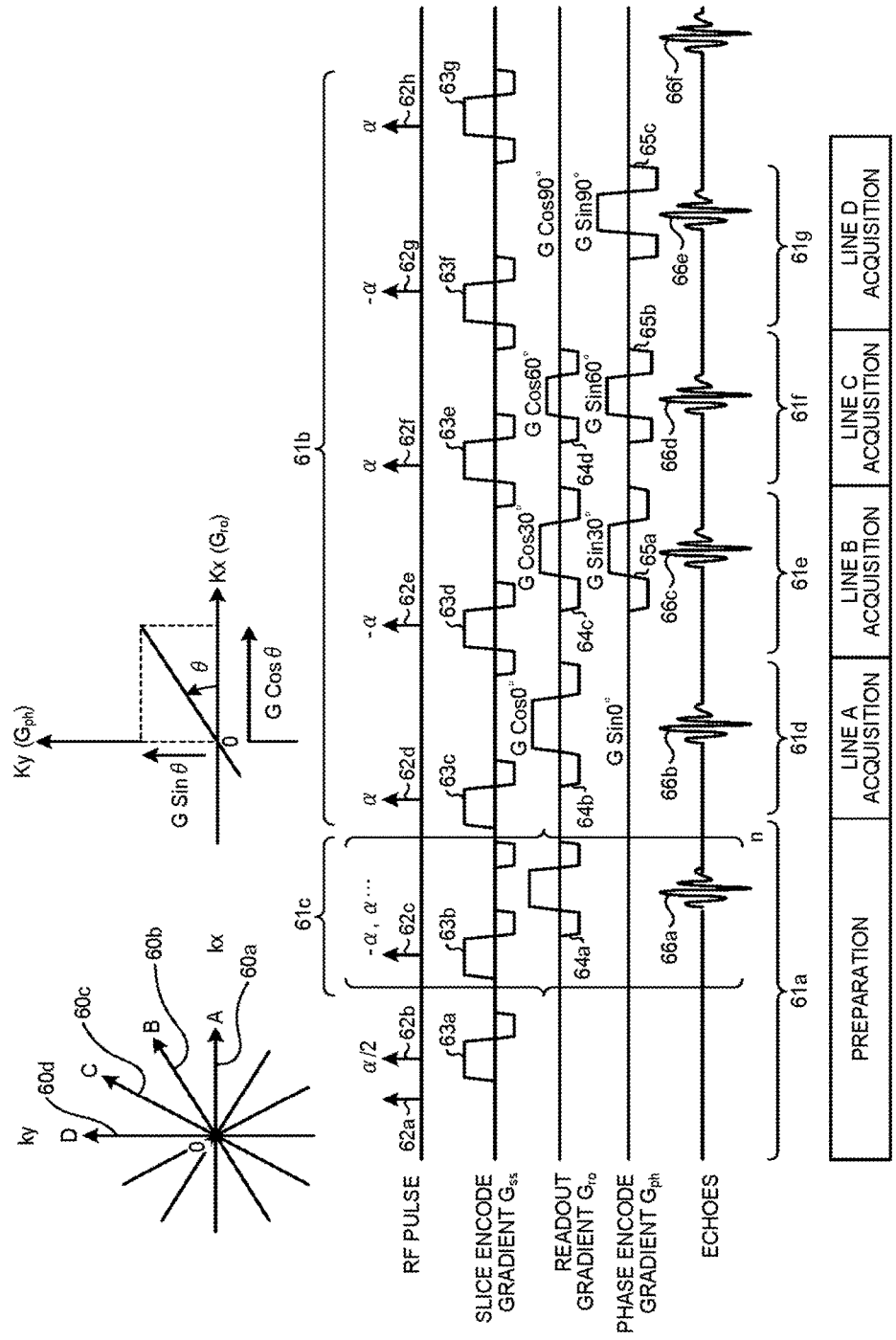
FIG. 6A is a pulse sequence diagram illustrating a pulse sequence executed by a magnetic resonance imaging apparatus according to the first embodiment.

FIG. 6A is a pulse sequence diagram illustrating a pulse sequence executed by a magnetic resonance imaging apparatus according to the first embodiment. In FIG. 6A, a case is explained in which the sequence control circuitry 120 executes an r-bSSFP (radial balanced Steady State Free Precession) sequence during the data acquisition time period 10. In other words, the sequence control circuitry 120 executes a bSSFP sequence (e.g. an r-bSSFP sequence) as the imaging sequence. What is illustrated in FIG. 6A is only about the imaging sequence performed by the sequence control circuitry 120 during the data acquisition time period 10. A spatially selective inversion pulse and optionally a spatially non-selective inversion pulse are applied, for example as in FIG. 2A to FIG. 2D.

In order to minimize the number of inversion pulses to be applied, the sequence control circuitry 120 often employs a method such that one RF pulse forms a plurality of echoes during the imaging sequence. Corresponding to the plurality of echoes formed, the sequence control circuitry 120 can perform data acquisition in a plurality of lines in a k-space.

For convenience of explanation, a case in which four k-space lines of data acquisition are performed at a time by the sequence control circuitry 120 is explained. In FIG. 6A, a k-space line 60a, corresponding to an orientation of 0 degrees, is denoted as "line A". A k-space line 60b, corresponding to an orientation of 30 degrees, is denoted as "line B". Each of a k-space line 60c, a k-space line 60d, corresponding to an orientation of 60 degrees and 90 degrees, respectively, is denoted as "line C" and "line D".

On the top row of the pulse sequence diagram of FIG. 6A, RF pulses applied by the sequence control circuitry 120 are illustrated. On the second row of the pulse sequence diagram of FIG. 6A, slice encode gradients G, applied by the sequence control circuitry 120 are illustrated. On the third row, readout gradients $G_{ro}$ applied by the sequence control circuitry 120 are illustrated. On the fourth row, phase encode gradients $G_{ph}$ applied by the sequence control circuitry 120 are illustrated. On the fifth row, echoes generated from the RF pulses and the gradients are illustrated.

A pre-pulse 62a is a pre-pulse applied by the sequence control circuitry 120 during the preparation stage of the r-bSSFP sequence. An α/2-degrees RF pulse 62b is an RF pulse applied by the sequence control circuitry 120 prior to a dummy sequence 61c. A slice encode gradient 63a is applied simultaneously by the sequence control circuitry 120 for slice selection. The dummy sequence 61c is a series of RF pulses 62c in combination with slice encode gradients 63b applied by the sequence control circuitry 120 in order for the system to reach the steady state. Readout gradients 64a are applied by the sequence control circuitry 120 during the dummy sequence 61c. Although not used for data acquisition, echoes 66a are formed during the dummy sequence 61c. The applications of the RF pulses 62c, the slice encode gradients 63b, the readout gradients 64a are repeated, for example, N times until the system reaches the steady state. The pre-pulse 62a, the α/2-degrees RF pulse 62b and the dummy sequence 61c constitute a preparation sequence 61a, the preparation stage of the imaging sequence.

When the system reaches the steady state, it becomes ready for the sequence control circuitry 120 to start data acquisition. In a data acquisition sequence 61b, α-degrees pulses 62d, 62f, 62h and minus-α-degrees pulses 62e, 62g, for example, are applied alternately by the sequence control circuitry 120. Slice encode gradients 63c, 63d, 63e, 63f and 63g represent slice encode gradients applied simultaneously with the α-degrees pulses or minus-α-degrees pulses by the sequence control circuitry 120 for slice selection.

A readout gradient 64b represents a readout gradient applied by the sequence control circuitry 120 during the k-space line 60a (or "line A") data acquisition. A time period 61d represents a time period of the "line A" data acquisition. An echo 66b represents an echo corresponding to the "line A" data acquisition.

Each of a readout gradient 64c and a readout gradient 64d represents a readout gradient applied by the sequence control circuitry 120 during the k-space line 60b (or "line B") data acquisition, the k-space line 60c (or "line C") data acquisition, respectively. Each of a phase encode gradient 65a, a phase encode gradient 65b and a phase encode gradient 65c represents a phase encode gradient applied by the sequence control circuitry 120 during the k-space line 60b data acquisition (or "line B"), the k-space line 60c (or "line C") data acquisition and the k-space line 60d (or "line D") data acquisition, respectively. Each of a time period 61e, a time period 61f and a time-period 61g represents a time period of "line B" data acquisition, "line C" data acquisition and "line D" data acquisition, respectively. Each of an echo 66c, an echo 66d, an echo 66e and an echo 66f represents an echo corresponding to the "line B" data acquisition, "line C" data acquisition, "line D" data acquisition and data acquisition pertinent to the subsequent k-space line, respectively.

Figure 6B:
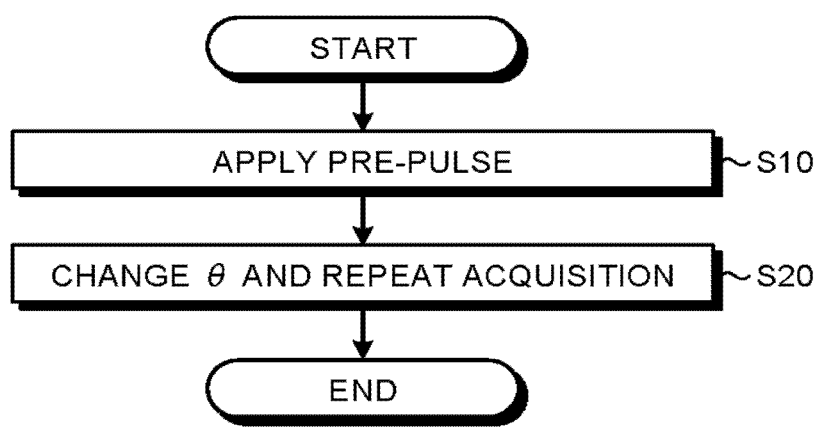
FIG. 6B is a flowchart illustrating a procedure of processing performed by a magnetic resonance imaging apparatus according to the first embodiment.

FIG. 6B is a flowchart illustrating a procedure of processing performed by a magnetic resonance imaging apparatus according to the first embodiment. FIG. 6B is a flowchart describing the Step S110 of FIG. 4A, the step S220 of FIG. 4B, the step S320A of FIG. 4C, the step S320B of FIG. 4C, the step 430A of FIG. 4D, or the step S430B of FIG. 4D in full detail. First of all, the sequence control circuitry 120 applies a pre-pulse (Step S10). For example, the sequence control circuitry 120 applies the pre-pulse 62a of FIG. 6A. Subsequently, the sequence control circuitry 120 applies an α/2-degrees RF pulse. For example, the sequence control circuitry 120 applies the α/2-degrees RF pulse 62b. Subsequently, the sequence control circuitry 120 executes a dummy sequence prior to data acquisition in order for the system to reach the steady state. For example, the sequence control circuitry 120 executes the dummy sequence 61c.

Upon completion of the preparation sequence 61a, the sequence control circuitry 120 moves on to the data acquisition sequence 61b. In the data acquisition sequence 61b, for each echo formed, the sequence control circuitry 120 changes an orientation of a k-space line (an angle θ) and repeats data acquisition (Step 20). For example, for the k-space line 60a (or line A), the angle θ is 0 degrees. For the k-space line 60b (or line B), the angle θ is 30 degrees. For the k-space line 60c (or line C), the angle θ is 60 degrees. For the k-space line 60d (or line D), the angle θ is 90 degrees.

In the beginning of each cycle of forming an echo, the sequence control circuitry 120 applies an α-degrees pulse or a minus-α-degrees pulse. The α-degrees pulse and the minus-α-degrees pulse are applied alternately for momentum balance preservation. The sequence control circuitry 120 applies a slice encode gradient G, simultaneously for slice selection. As an example, the sequence control circuitry 120 applies the α-degrees pulse 62d and the slice encode gradient 63c during the line A data acquisition. The sequence control circuitry 120 applies the minus-α-degrees pulse 62e and the slice encode gradient 63d during the line B data acquisition.

Further, for each echo, the sequence control circuitry 120 applies a readout gradient $G_{ro}$=G cos θ and a phase encode gradient $G_{ph}$=G sin θ simultaneously, thereby acquiring data. G is the effective magnitude of the applied gradient.

For example, during the line A data acquisition, the sequence control circuitry 120 applies the readout gradient 64b of G cos 0° and does not apply a phase encode gradient. During the line B data acquisition, the sequence control circuitry 120 applies the readout gradient 64c of G cos 30° and applies the phase encode gradient 65a of G sin 30° at the same time. During the line C data acquisition, the sequence control circuitry 120 applies the readout gradient 64d of G cos 60° and applies the phase encode gradient 65b of G sin 60° at the same time. During the line D data acquisition, the sequence control circuitry 120 does not apply a readout gradient and applies the phase encode gradient 65c of G sin 90° at the same time. In this way, simultaneous applications of the two gradients with slightly varying their relative magnitude make it possible for the sequence control circuitry 120 to perform data acquisition in a specific orientation in the two-dimensional k-space.

In summary, the sequence control circuitry 120 applies an inversion pulse. Subsequently, the sequence control circuitry 120 executes a data acquisition sequence 61b (an imaging sequence) including an RF pulse (i.e. α-degrees pulse 62d) and a gradient magnetic field (i.e. slice encode gradient 63c) concurrently applied with the RF pulse in a slice direction. The sequence control circuitry 120 performs, for a slice position selected by the RF pulse and the gradient magnetic field and during a time period including a null point 30, data acquisition in a plurality of orientation including a center of a two-dimensional k-space.

Figure 6C:
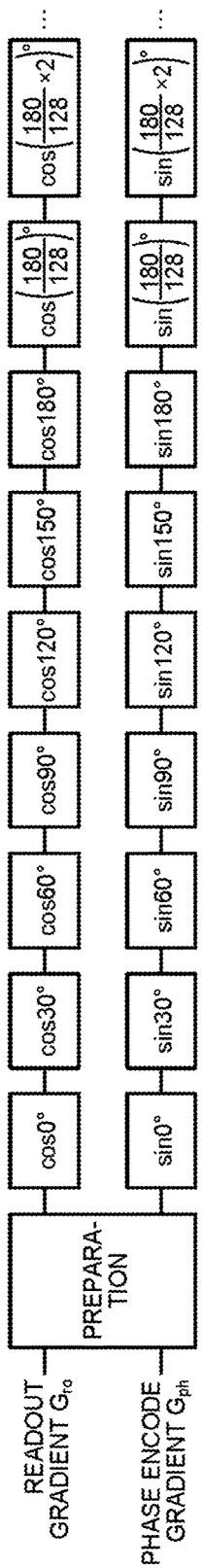
FIG. 6C, FIG. 6D and FIG. 6E are drawings illustrating processing performed by a magnetic resonance imaging apparatus according to the first embodiment.
Figure 6D:
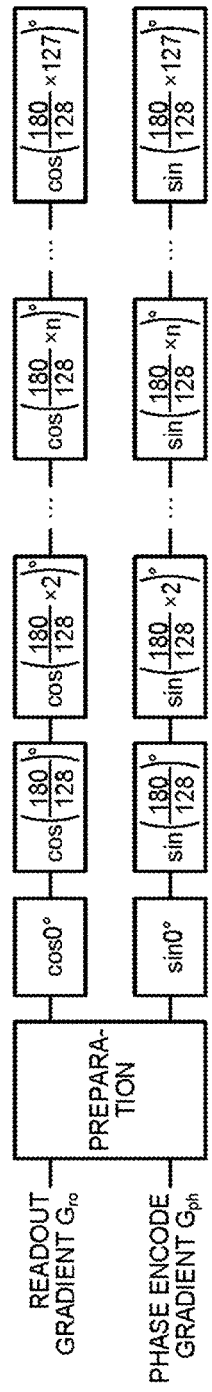
Figure 6E:
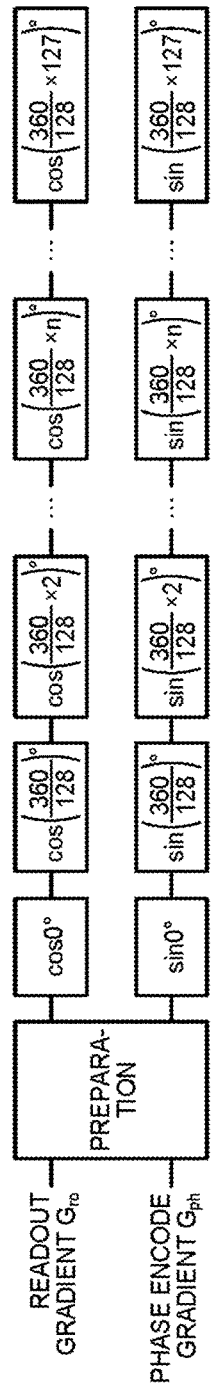

In FIG. 6A, the explanation is given assuming a case in which the orientation of data acquisition differs by 30 degrees for each echo. However, this is meant only for convenience of explanation. In reality, for example, typically data acquisition of 128 lines or 256 lines is performed at one time (one prepulse). In FIG. 6C, FIG. 6D and FIG. 6E, this situation is illustrated in more detail.

In FIG. 6C, a method of data acquisition in a case of "high-low-high" data acquisition is illustrated, with 128 lines being acquired at one time. Here, "high-low-high" data acquisition means that data acquisition is performed starting from the "high" (k-space positions being away from the center of the k-space), moving to the "low" (near the center of the k-space) and then moving to the "high", such as data acquisition along a k-space line going through the origin of the k-space.

In FIG. 6C, prior to the more in-depth data acquisition, data acquisition is performed, for example, with 0 degrees, 30 degrees, 60 degrees, 90 degrees, 120 degrees, 150 degrees and 180 degrees. For each data acquisition, the sequence control circuitry 120 applies the corresponding phase encode gradient and the corresponding readout gradient as illustrated in FIG. 6C.

Subsequently, the sequence control circuitry 120 performs the rest of data acquisition, by incrementing a small angle for each echo depending on the matrix number (the number of lines to be acquired).

Alternatively, as illustrated in FIG. 6D, the sequence control circuitry 120 may increment a small angle little by little for each echo from 0 degrees to 180 degrees from the outset. In this case, since the number of lines is 128, the angle to be added for each echo is 180/128 degrees.

In a case of an UTE pulse sequence, as illustrated in FIG. 6E, the sequence control circuitry 120 may increment a small angle for each echo from 0 degrees to 360 degrees. This is because, in an UTE pulse sequence, data acquisition is typically performed in a "low-high" manner. To put it in another way, the data acquisition starts in the center of the k-space and extending outward. In the case of FIG. 6E, since the number of lines is 128, the angle to be added for each echo is 360/128 degrees.

Up until now, a case in which two-dimensional radial acquisition in a plurality of k-space lines at a time for one slice position is explained. In other words, one slice of 2D radial acquisition among the 3D acquisition with any two directions radial and the third direction Cartesian is explained. With reference to FIG. 7A and FIG. 7B, the 3D acquisition with any two directions radial and the third direction Cartesian (a plurality of slices of 2D radial acquisition) is explained.

FIG. 7A is a diagram illustrating processing performed by a magnetic resonance imaging apparatus according to the first embodiment. FIG. 7B is a drawing illustrating processing performed by a magnetic resonance imaging apparatus according to the first embodiment.

In FIG. 7A, the top row represents RP pulses applied by the sequence control circuitry 120. An inversion pulse 70a represents a first spatially selective inversion pulse applied by the sequence control circuitry 120. An inversion pulse 70b and an inversion pulse 70c represent a second spatially selective pulse applied and a third spatially selective inversion pulse, respectively. For simplicity, a case in which "flow-in" method is employed is explained. However, application to "flow-out" method or "tag-on/tag-off" method is trivial and straightforward.

The second row of FIG. 7A indicates a temporal change of a longitudinal magnetization. A null point 70d represents the null point corresponding to the application of the first inversion pulse 70a. Each of a null point 70e and a null point 70f represent the null point corresponding to the application of the second inversion pulse 70b and the third inversion pulse 70c, respectively. The bottom row of FIG. 7A indicates data acquisition time periods. A first data acquisition time period 70g represents a data acquisition time period pertinent to the first inversion pulse 70a. Each of a second data acquisition time period 70h and a third data acquisition time period 70i represents a data acquisition time period pertinent to the second inversion pulse 70b and a data acquisition time period pertinent to the third inversion pulse 70c, respectively.

The sequence control circuitry 120 performs data acquisition for one slice position for one inversion pulse (or one pair of inversion pulses) in principle. Thus, for example, the sequence control circuitry 120 performs data acquisition for a first slice position during the first data acquisition time period 70g, performs data acquisition for a second slice position during the second data acquisition time period 70h, and performs data acquisition for a third slice position during the third data acquisition time period 70i. The first slice position is, for example, a slice position of k-space lines $A_1$ to $H_1$ in FIG. 5. The second slice position is, for example, a slice position of k-space lines $A_2$ to $D_2$. The third slice position is, for example, a slice position of k-space lines $A_3$ to $D_3$.

In FIG. 7B, how the sequence control circuitry 120 performs data acquisition during each data acquisition time period is explicitly illustrated.

The sequence control circuitry 120 executes, during the first data acquisition time period 70g, the preparation sequence 61a as in FIG. 6A (illustrated as "PREP" in FIG. 7B) and moves on to data acquisition of k-space lines $A_1$, $B_1$, $C_1$ and $D_1$ of FIG. 5, in this order. The sequence control circuitry 120 executes, during the second data acquisition time period 70h, the preparation sequence 61a as in FIG. 6A (illustrated as "PREP" in FIG. 7B) and moves on to data acquisition of k-space lines $A_2$, $B_2$, $C_2$ and $D_2$ of FIG. 5, in this order. The sequence control circuitry 120 executes, during the third data acquisition time period 70i, the preparation sequence 61a as in FIG. 6A (illustrated as "PREP" in FIG. 7B) and moves on to data acquisition of k-space lines $A_3$, $B_3$, $C_3$ and $D_3$ of FIG. 5, in this order.

The sequence control circuitry 120 performs slice selection by controlling the frequencies of RF pulses and slice encode gradients. For example, the sequence control circuitry 120 applies RF pulses of different frequencies for different slice positions, thereby perform slice selection. Alternatively, the sequence control circuitry 120 may perform slice encoding during the data acquisition, thereby performing 3D volume data acquisition.

In FIG. 7A and FIG. 7B, a case in which data acquisition of the whole two-dimensional k-space plane for one slice position is performed for one inversion pulse is explained. However, embodiments are not limited to this. In fact, the sequence control circuitry 120 may apply a plurality of inversion pulses in total to perform data acquisition of one slice position.

FIG. 7A is a diagram illustrating processing performed by a magnetic resonance imaging apparatus according to the first embodiment. FIG. 7B is a drawing illustrating processing performed by a magnetic resonance imaging apparatus according to the first embodiment.

In FIG. 8A, the top row represents RF pulses applied by the sequence control circuitry 120. Each of an inversion pulse 71a, an inversion pulse 71b and an inversion pulse 71c represents a first, a second and a third spatially selective inversion pulse applied by the sequence control circuitry 120, respectively.

The second row of FIG. 8A indicates a temporal change of a longitudinal magnetization. Each of a null point 70d, a null point 71e and a null point 71f represents the null point corresponding to the application of the first inversion pulse 71a, the second inversion pulse 71b and the third inversion pulse 71c, respectively.

The bottom row of FIG. 8A indicates data acquisition time periods. Each of a first data acquisition time period 70g, a second data acquisition time period 71h and a third data acquisition time period 71i represents a data acquisition time period pertinent to the first inversion pulse 71a, the second inversion pulse 71b and the third inversion pulse 71c, respectively.

The sequence control circuitry 120 applies a plurality of inversion pulses in total to perform data acquisition of one slice position. For example, the sequence control circuitry 120 performs data acquisition for a first segment of a first slice position during the first data acquisition time period 71g, performs data acquisition for a second segment of a first slice position during the second data acquisition time period 71h, and performs data acquisition for a first segment of a second slice position during the third data acquisition time period 71i. The first slice position and the second slice position are, for example, a slice position of the k-space lines $A_1$ to $H_1$ in FIG. 5 and a slice position of the k-space lines $A_2$ to $D_2$, respectively. The first segment is, for example, the k-space lines $A_1$ to $D_1$ in the two-dimensional k-space. The second segment is, for example, the k-space lines $E_1$ to $H_1$ in the two-dimensional k-space.

In FIG. 8B, how the sequence control circuitry 120 performs segmentation is explicitly illustrated.

The sequence control circuitry 120 executes, during the first data acquisition time period 71g, the preparation sequence 61a as in FIG. 6A, and moves on to data acquisition of k-space lines $A_1$, $B_1$, $C_1$ and $D_1$ of FIG. 5, in this order. The sequence control circuitry 120 executes, during the second data acquisition time period 71h, the preparation sequence 61a as in FIG. 6A and moves on to data acquisition of k-space lines $E_1$, $F_1$, $G_1$ and $H_1$ of FIG. 5, in this order. The sequence control circuitry 120 executes, during the third data acquisition time period 71i, the preparation sequence 61a as in FIG. 6A and moves on to data acquisition of k-space lines $A_2$, $B_2$, $C_2$ and $D_2$ of FIG. 5, in this order.

Embodiments are not limited to these examples. For example, in order to accelerate data acquisition, the processing circuitry 150 may employ an UTE (Ultrashort Echo Time) sequence as an imaging sequence to perform 3D acquisition with any two directions radial and the third direction Cartesian.

FIG. 9A is a pulse sequence diagram illustrating a pulse sequence executed by a magnetic resonance imaging apparatus according to the first embodiment. In FIG. 9A, a case is explained in which the sequence control circuitry 120 executes an UTE sequence during the data acquisition time period 10. FIG. 9A corresponds to the data acquisition sequence 61*b* in FIG. 6A, with RF pulses replaced by half-RF pulses.

In FIG. 9A, each of a k-space lines 72*a* (denoted as "A"), a k-space lines 72*b* (denoted as "B"), a k-space line 72*c* (denoted as "C") and a k-space line 72*d* (denoted as "D") corresponds to an orientation of 0 degrees, 30 degrees, 60 degrees and 90 degrees, respectively. The sequence control circuitry 120, for example, performs data acquisition from 0 degrees to 360 degrees ("low-high" data acquisition). In other words, the sequence control circuitry 120, for example, starts data acquisition from A, moving on to B, C, D, E, G, H, I, J and K, finally reaching L, until all the data acquisition is completed. In an UTE pulse sequence, if data acquisition starts from the center of the k-space, the echo time becomes dramatically lessened. Hence, it is preferable that data acquisition be commenced from the center.

The top row indicates RF pulses applied by the sequence control circuitry 120. Half pulses 73*a*, 73*b*, 73*c* and 73*d* represent half RF pulses applied by the sequence control circuitry 120. As illustrated in a triangle, the half pulse 73*a* is, for example, an RF pulse whose signal intensity gradually increases within a predetermined time period until all of a sudden the signal intensity becomes zero. This sudden drop of signal intensity creates an immediate echo during an UTE sequence, thereby reducing an echo time.

The second row indicates slice encode gradients $G_{ss}$ applied by the sequence control circuitry 120. Slice encode gradients 74*a*, 74*b*, 74*c* and 74*d* represent slice encode gradients applied by the sequence control circuitry 120. The sequence control circuitry 120, for example, applies the slice encode gradient 74*a* simultaneously with the half pulse 73*a*.

The third row indicates readout gradients $G_{ro}$ applied by the sequence control circuitry 120. Readout gradients 75*a*, 75*b*, 75*c* represents readout gradients applied by the sequence control circuitry 120. Each of the magnitude of the readout gradient 75*a*, 75*b* and 75*c* is G*cos(0°), G*cos(30°) and G*cos(60°), respectively. The readout gradients applied by the sequence control circuitry 120, for example, ramp up to a plateau during the data acquisition and maintains a constant magnitude for a predetermined period of time.

The fourth row indicates phase encode gradients $G_{ph}$ applied by the sequence control circuitry 120. Phase encode gradients 76*b*, 76*c* and 76*d* represent phase encode gradients applied by the sequence control circuitry 120. Each of the magnitude of the phase encode gradients 76*b*, 76*c* and 76*d* is G*sin(30°), G*sin(60°) and G*sin(90°), respectively. The phase encode gradients applied by the sequence control circuitry 120, for example, ramp up to a plateau during the data acquisition and maintains a constant magnitude for a predetermined period of time.

Each of rectangles 78*a*, 78*b*, 78*c* and 78*d* represents a time period during which the k-space line 72*a*, the k-space line 72*c* and the k-space line 72*d* is acquired, respectively.

The fifth row indicates data acquisition period. Each of data acquisition periods 77*a*, 77*b*, 77*c* and 77*d* represents a time period in which data acquisition is actually performed.

FIG. 9B is a flowchart illustrating a procedure of processing performed by a magnetic resonance imaging apparatus according to the first embodiment. FIG. 9B corresponds to Step S20 in FIG. 6B.

In data acquisition sequence, for each echo formed, the sequence control circuitry 120 changes an orientation of a k-space line (an angle θ) and repeats data acquisition.

More specifically, for each orientation, the sequence control circuitry 120 applies a half RF pulse and slice encode gradient $G_{ss}$ during the imaging sequence (Step S30). For example, the sequence control circuitry 120 applies the half pulse 73*a* and the slice encode gradient 74*a*. Subsequently, the sequence control circuitry 120 applies a readout gradient $G_{ro}$=G cos θ and a phase encode gradient $G_{ph}$=G sin θ simultaneously, first ramping them up and subsequently maintaining them at constant amplitudes, thereby acquiring data. This situation is illustrated in FIG. 9A.

Figure 10A:
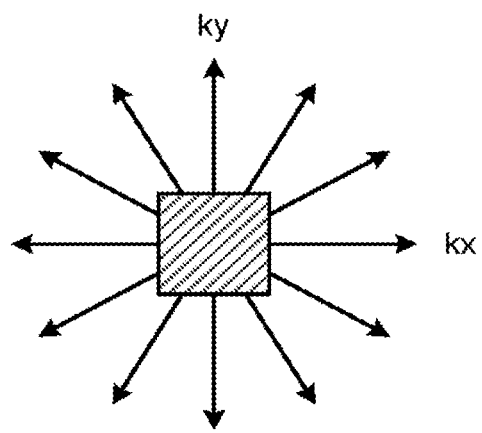
FIG. 10A is a drawing illustrating a stack of PETRA (Pointwise Encoding Time reduction with Radial Acquisition) acquisition (or a multi-slice 2D PETRA acquisition) performed by a magnetic resonance imaging apparatus according to the first embodiment.

Embodiments are not limited to these situations. For example, as illustrated in FIG. 10A, instead of performing a simple 3D acquisition with any two directions radial and the third direction Cartesian, the sequence control circuitry 120 may perform both a Cartesian sampling and a radial sampling during the imaging sequence. In other words, the sequence control circuitry 120 performs 3D acquisition with any two directions radial and the third direction Cartesian in addition to an imaging sequence employing a pointwise encoding sequence, thereby further accelerating data acquisition.

Figure 10B:
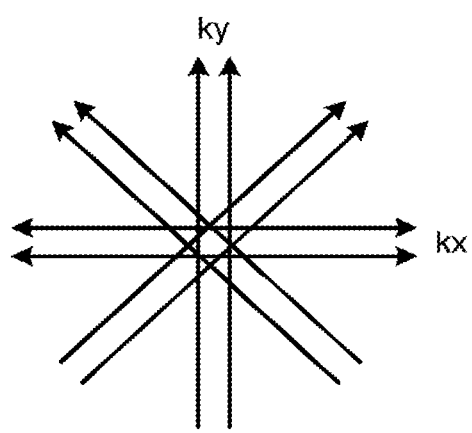
FIG. 10B is a drawing illustrating a stack of JET acquisition (or a multi-slice 2D JET acquisition) performed by a magnetic resonance imaging apparatus according to the first embodiment.

Alternatively, as illustrated in FIG. 10B, the sequence control circuitry 120 may perform a plurality of times of data acquisition per one orientation (JET acquisition), thereby data obtained by the sequence control circuitry 120 becomes more robust against motion artifact. In this case, the sequence control circuitry 120 performs data acquisition in a plurality of orientations including the origin of a k-space.

In FIG. 10A, a case in which the sequence control circuitry 120 performs a stack of PETRA acquisition is explained.

In FIG. 10B, a case in which the sequence control circuitry 120 performs a stack of JET acquisition is explained.

It is noted here that the JET acquisition is a method to generate an image by rotating a plurality of bundles (or "blades") of acquisition echo data obtained from, for example, the FSE (Fast Spin Echo) method and thereby filling the k-space. As illustrated in FIG. 10B, the sequence control circuitry 120 performs, in one "blade" of data acquisition, a plurality of times of data acquisition with substantially the same orientations. The sequence control circuitry 120 typically performs the plurality of times of data acquisition in the one "blade" of data acquisition such that at least one line of the plurality of times of data acquisition passes through the origin of the k-space. Subsequently, the sequence control circuitry 120 performs the next "blade" of data acquisition by rotating the data acquisition lines by a predetermined angle around the origin of the k-space. The set of the plurality of "blades" of data acquisition as a whole constitute k-space data with dense sampling in the vicinity of the origin of the k-space, which makes the correction of motion artifacts possible.

However, embodiments are not limited to this situation. For example, the sequence control circuitry 120 may perform a multi-slice 2D PETRA acquisition. Furthermore, the sequence control circuitry 120 may perform a multi-slice 2D JET acquisition.

Various Time-SLIP methods (i.e. "flow-in" method, "flow-out" method, and "tag-on/tag-off" method) and various 3D acquisition imaging sequences with any two directions radial and the third direction Cartesian (data acquisition sequences) are explained. A magnetic resonance imaging apparatus 100 according to the first embodiment, for example, includes 3D acquisition with any two directions radial and the third direction Cartesian, being incorporated into at least one of the Time-SLIP methods.

A few examples corresponding to particular combinations of a Time-SLIP method and a 3D acquisition imaging sequence with any two directions radial and the third direction Cartesian will be further given.

FIG. 11 is a pulse sequence diagram illustrating pulse sequences executed by a magnetic resonance imaging apparatus according to the first embodiment. In FIG. 11, a case in which "flow-in" method is employed as the Time-SLIP method and a bSSFP method is employed as the imaging sequence is explained. Explanation is given with reference to the flowchart of FIG. 4A, which is a flowchart of "flow-in" method, and the flowchart of FIG. 6B, which is a flowchart of a bSSFP method.

In FIG. 11, a spatially selective inversion pulse 83a indicates a spatially selective inversion pulse applied by the sequence control circuitry 120. A curve 82b indicates, as a function of time, longitudinal magnetization of spins to which the spatially selective inversion pulse 83a is applied. In other words, the curve 82b indicates longitudinal magnetization of a tagged region. On the other hand, a curve 82a indicates, as a function of time, longitudinal magnetization of spins to which the spatially selective inversion pulse 83a is not applied. In other words, the curve 82a indicates longitudinal magnetization of an untagged region. A null point 82c indicates the null point in which longitudinal magnetization of the tagged region becomes zero.

The top row of the pulse sequence diagram in FIG. 11 illustrates RF pulses applied. The sequence control circuitry 120 applies the spatially selective inversion pulse 83. A pre-pulse 83b indicates a pre-pulse applied by the sequence control circuitry 120 to start the imaging sequence. An α/2-degrees pulse is further applied. RF pulses 83d represent α-degrees pulses or minus-α-degrees pulses applied by the sequence control circuitry 120 during the dummy sequence. Each of an RF pulse 83e, an RF pulse 83n and an RF pulse 83j represents an α-degrees pulse applied by the sequence control circuitry 120. Each of an RF pulse 83f, an RF pulse 83i and an RF pulse 83k represents an minus-α-degrees pulse applied by the sequence control circuitry 120. The α-degrees pulses and the minus-α-degrees pulses are applied alternately in a bSSFP sequence.

The second row of the pulse sequence diagram in FIG. 11 illustrates slice encode gradients $G_{ss}$ applied. A slice encode gradient 84a is a slice encode gradient applied by the sequence control circuitry 120 simultaneously with the application of the α/2-degrees pulse. Slice encode gradients 84b are slice encode gradients applied by the sequence control circuitry 120 simultaneously with the RF pulses 83d during the dummy sequence. Slice encode gradients 84e, 84f, 84h, 84i and 84k represent slice encode gradients applied by the sequence control circuitry 120 simultaneously with the α-degrees pulses or the minus-α-degrees pulses.

The bottom row of the pulse sequence diagram in FIG. 11 illustrates echoes formed. Echoes 88c represent echoes formed during the dummy sequence. However, the echoes 88c are not used for data acquisition. An echo 88e, an echo 88f, an echo 88h, an echo 88i and an echo 88j represent echoes formed by the RF pulses and the gradient magnetic fields applied by the sequence control circuitry 120 during the imaging sequence. A plurality of echoes is formed for one inversion pulse.

The third row of the pulse sequence diagram in FIG. 11 illustrates readout gradients $G_{ro}$ applied. A readout gradient 85a represents a readout gradient applied simultaneously with the spatially selective inversion pulse 83a by the sequence control circuitry 120. Readout gradients 85b represent readout gradients applied by the sequence control circuitry 120 during the dummy sequence. Each of a readout gradient 85e, a readout gradient 85f, a readout gradient 85h, a readout gradient 85i and a readout gradient 85j represents readout gradients applied by the sequence control circuitry 120 during a time period in which the echo 88e, the echo 88f, the echo 88h, the echo 88i and the echo 88j are formed, respectively.

The fourth row of the pulse sequence diagram in FIG. 11 illustrates phase encode gradients $G_{ph}$ applied. A phase encode gradient 86a represents a phase encode gradient applied simultaneously with the spatially selective inversion pulse 83a by the sequence control circuitry 120. Each of a phase encode gradient 86f, a phase encode gradient 86h, a phase encode gradient 86i and a phase encode gradient 86j represents phase encode gradients applied by the sequence control circuitry 120 during a time period in which the echo 88f, the echo 88h, the echo 88i and the echo 88j are formed, respectively. The phases encode gradients and the readout gradients are applied simultaneous by the sequence control circuitry 120 during the imaging sequence.

As explained earlier, the relative amplitude between the readout gradients and the phase encode gradients designates the orientation in which data acquisition is performed. For each time an echo is formed, the sequence control circuitry 120 applies a phase encode gradient and a readout gradient, by changing a relative amplitude between the phase encode gradient and the readout gradient, depending on an orientation of a k-space line to be imaged.

The fifth row of the pulse sequence diagram in FIG. 11 illustrates a frequency offset gradient Δf optionally applied by the sequence control circuitry 120 in order to perform fine adjustment of a position or an orientation of a tagged region and the like. Frequency offsets 87a, 87b, 87c, 87d, 87e, 87f, 87k, 87i and 87j represent frequency offsets optionally applied by the sequence control circuitry 120 in those timings.

With reference to the flowchart of FIG. 4A again, the processing performed by the magnetic resonance imaging apparatus 100 is explained.

First of all, the sequence control circuitry 120 applies a spatially selective inversion pulse as an inversion pulse (Step S100). For example, the sequence control circuitry 120 applies the spatially selective inversion pulse 83a to the pulse application region 44.

The longitudinal magnetization of the tagged region, as illustrated in the curve 82b, gradually recovers as time passes. The sequence control circuitry 120 waits until near the null point 82c (Step S110). The waiting time is referred to as TI (Inversion Time) and illustrated in FIG. 11.

Near the null point, the sequence control circuitry 120 performs 3D acquisition with any two directions radial and the third direction Cartesian (Step S120).

With reference to the flowchart of FIG. 6B, this step is explained in more detail.

The sequence control circuitry 120 applies the pre-pulse 83*b* (Step S10). Subsequently, the sequence control circuitry 120 applies an α/2-degrees RF pulse. For example, the sequence control circuitry 120 applies the α/2-degrees RF pulse 62*b*. Subsequently, the sequence control circuitry 120 executes a dummy sequence prior to data acquisition in order for the system to reach the steady state.

Upon completion of the preparation sequence, the sequence control circuitry 120 moves on to the data acquisition. For each echo formed, the sequence control circuitry 120 changes an orientation of a k-space line (an angle θ) and repeats data acquisition (Step S20). The angle θ is explained, for example, in FIG. 6A.

In the beginning of each cycle of forming an echo, the sequence control circuitry 120 applies an α-degrees pulse or a minus-α-degrees pulse. The α-degrees pulse and the minus-α-degrees pulse are applied alternately. The sequence control circuitry 120 applies a slice encode gradient $G_{ss}$ simultaneously for slice selection. As an example, the sequence control circuitry 120 applies the α-degrees pulse 83*e* and the slice encode gradient 84*e*.

Further, for each echo, the sequence control circuitry 120 applies a readout gradient $G_{ro}$=G cos θ and a phase encode gradient $G_{ph}$=G sin θ simultaneously, thereby acquiring data. G is the effective magnitude of the applied gradient.

For example, the sequence control circuitry 120 applies readout gradients 85*e*, 85*f*, 85*h*, 85*i* and 85*j*, reducing magnitudes of readout gradients applied as the angle θ becomes larger. The sequence control circuitry 120 applies phase encode gradients 86*f*, 86*h*, 86*i* and 86*j*, increasing magnitudes of phase encode gradients applied as the angle θ becomes larger.

Upon completion of the 3D acquisition with any two directions radial and the third direction Cartesian by the sequence control circuitry 120, the processing circuitry 150 generates an image based on the data acquisition pulse sequence executed by the processing circuitry 150 (Step S130).

In FIG. 11, a case in which a bSSFP sequence with 3D acquisition with any two directions radial and the third direction Cartesian is incorporated into the "flow-in" Time-SLIP method is explained. A dense data acquisition in the center of the k-space with a use of a radial stack-of-data acquisition combined with a Time-SLIP method obliterating background signal without using contrast agents makes the image acquired by the processing circuitry 150 robust against motion artifact. The motion artifact includes artifact originated from voluntary movements of a subject as well as involuntary movements such as respiration and cardiac motion. In "flow-in" method, inflow of fresh blood to a specific region is depicted. On the other hand, in "flow-out" method, blood flowing out from a first region and having flowed in to a second region at a subsequent time is depicted. The former is a basic choice for depicting blood that flows into a specific region, such as renal imaging while the latter is a more advanced choice for depicting blood with blood dynamics taken into consideration, such as depicting blood flowing from the heart into the pulmonary system.

Figure 12:
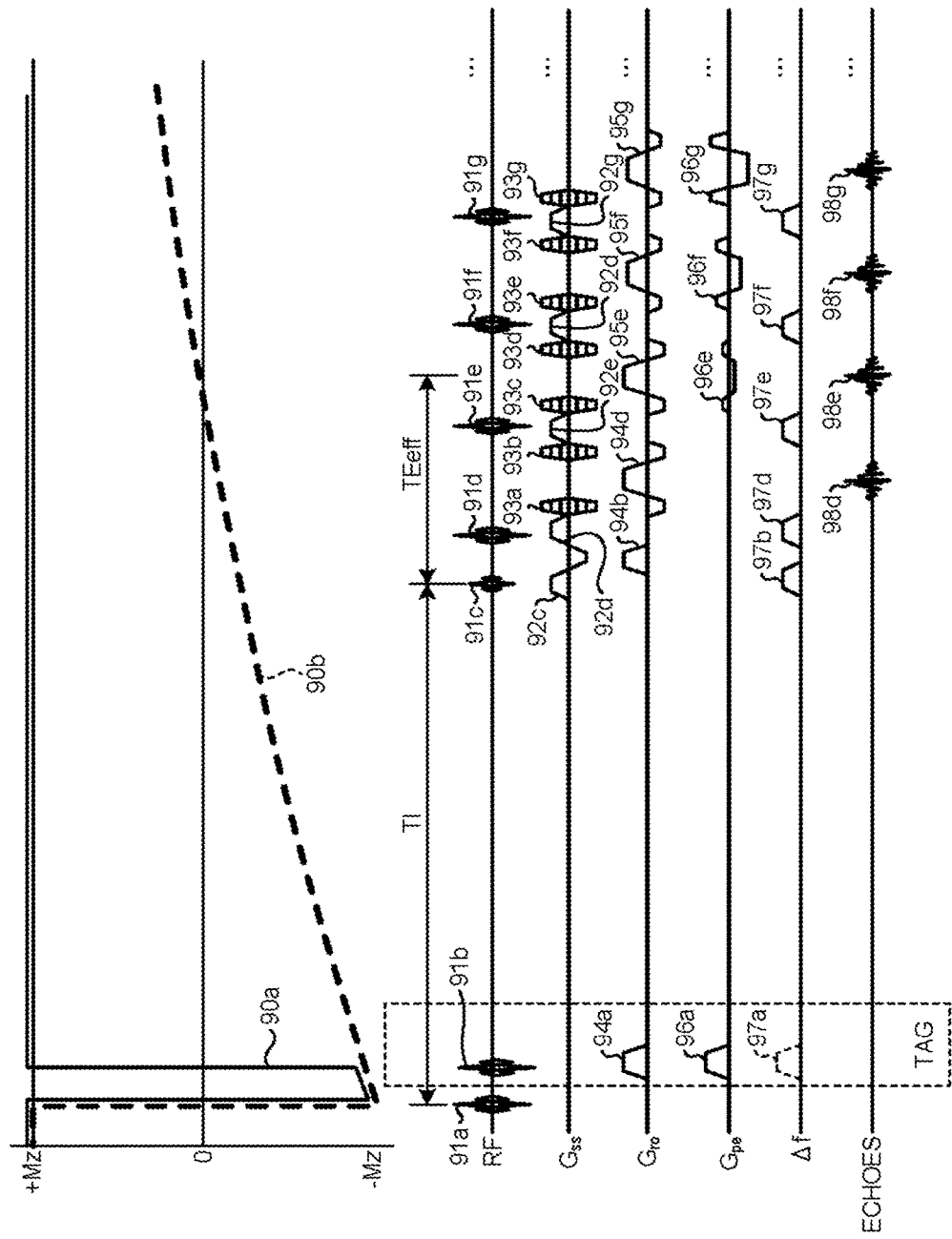

FIG. 12 is a pulse sequence diagrams illustrating pulse sequences executed by a magnetic resonance imaging apparatus according to the first embodiment. In FIG. 12, another example of the magnetic resonance imaging apparatus 100 is given. In FIG. 12, "flow-out" method is employed as Time-SLIP method. Furthermore, in FIG. 12, the bSSFP pulse sequence in FIG. 11 is supplanted by a FASE (Fast Asymmetric Spin Echo) pulse sequence. In other words, the sequence control circuitry 120 executes a FASE sequence as the imaging sequence. A FASE pulse sequence is a high-speed imaging sequence employing half-Fourier technique (partial Fourier technique) to reduce the number of phase-encoding, thereby reducing the total time necessary for data acquisition. Partial Fourier technique is imaging technique utilizing the fact that k-space data has a specific symmetry called the Hermitian symmetry. Due to the Hermitian symmetry, mirror images across the origin of the k-space need not be acquired, thus the total data acquisition time becomes greatly reduced. Therefore, by using a FASE pulse sequence instead of the bSSFP pulse sequence, the total data acquisition time becomes greatly reduced.

In FIG. 12, each of a spatially non-selective inversion pulse 91*a* and a spatially selective inversion pulse indicates a spatially non-selective inversion pulse applied by the sequence control circuitry 120 and a spatially selective inversion pulse applied by the sequence control circuitry 120, respectively. Each of a curve 90*a* and a curve 90*b* indicates, as a function of time, longitudinal magnetization of spins to which a spatially selective inversion pulse 91*b* is applied, and to which the spatially selective inversion pulse 91*b* is not applied. In other words, the curve 90*a* and the curve 90*b* indicates a tagged region and an untagged region, respectively.

The top row of the pulse sequence diagram in FIG. 12 illustrates RF pulses applied. The sequence control circuitry 120 applies the spatially non-selective inversion pulse 91*a* and subsequently applies the spatially selective inversion pulse 91*b*. An RF pulse 91*c* indicates a 90-degrees pulse applied by the sequence control circuitry 120 in order to start the imaging sequence. Each of an RF pulse 91*d*, an RF pulse 91*e*, an RF pulse 91*f* and an RF pulse 91*g* indicates a 180-degrees pulse applied by the sequence control circuitry 120.

The second row of the pulse sequence diagram in FIG. 12 illustrates slice encode gradients $G_{ss}$ applied. Slice encode gradients 92*c*, 92*d*, 94*d*, 95*e* and 95*f* indicate slice encode gradients applied by the sequence control circuitry 120. Each of a slice encoding 93*a*, 93*b*, 93*c*, 93*d*, 93*f* and 93*g* indicates a slice encoding.

The bottom row of the pulse sequence diagram in FIG. 12 illustrates echoes formed. Echoes 98*d*, 98*e*, 98*f* and 98*f* represent echoes formed. Similarly to the case of the bSSFP sequence, a plurality of echoes is formed for one inversion pulse.

The third row of the pulse sequence diagram in FIG. 12 illustrates readout gradients $G_{ro}$ applied. A readout gradient 94*a* indicates a readout gradient applied by the sequence control circuitry 120 simultaneously with the application of the spatially selective inversion pulse. Readout gradients 94*b*, 94*d*, 95*e*, 95*f* and 95*g* indicate readout gradients applied by the sequence control circuitry 120.

The fourth row of the pulse sequence diagram in FIG. 12 illustrates phase encode gradients $G_{ph}$ applied. A phase encode gradient 96*a* represents a phase encode gradient applied simultaneously with the spatially selective inversion pulse 91*b* by the sequence control circuitry 120. Phase encode gradients 96*e*, 96*f* and 96*g* indicate phases encode gradients applied by the sequence control circuitry 120.

The readout gradients and the phase encode gradients are applied simultaneously by the sequence control circuitry 120 during time periods in which echoes are formed. The relative amplitude between a readout gradient and a phase encode gradient designates the orientation in which data acquisition is performed. For each time an echo is formed, the sequence control circuitry 120 applies a phase encode gradient and a readout gradient, by changing a relative amplitude between a phase encode gradient and a readout gradient, depending on an orientation of a k-space line to be imaged. Additionally, in a EASE pulse sequence, the sequence control circuitry 120 performs data acquisition of only a half of k-space.

The fifth row of the pulse sequence diagram in FIG. 12 illustrates a frequency offset gradient Δf optionally applied by the sequence control circuitry 120 in order to perform fine adjustment of a position or an orientation of a tagged region and the like. Frequency offsets 97a, 97b, 97e, 97f and 97g represent frequency offsets optionally applied by the sequence control circuitry 120 in those timings.

With reference to the flowchart of FIG. 4B, the processing performed by the magnetic resonance imaging apparatus 100 is explained.

First of all, the sequence control circuitry 120 applies a spatially non-selective inversion pulse (Step S200). For example, the sequence control circuitry 120 applies the spatially non-selective inversion pulse 91a to the pulse application region 45.

Subsequently, the sequence control circuitry 120 applies, for example, a spatially selective inversion pulse 91b to the pulse application region 46 (Step S210). The longitudinal magnetization gradually recovers as time passes. The sequence control circuitry 120 waits until near the null point (Step S220). The sequence control circuitry 120 performs 3D acquisition with any two directions radial and the third direction Cartesian (Step S230).

This step is explained in more detail. The sequence control circuitry 120 applies the RF pulse 91b that is a 90-degrees pulse. Subsequently, the sequence control circuitry 120 applies RF pulses (e.g. RF pulses 91d, 91e, 91f and 91g, that are 180-degrees pulses). For each echo formed, the sequence control circuitry 120 changes an orientation of a k-space line (an angle θ) and repeats data acquisition. The angle θ is explained, for example, in FIG. 6A. Slice encoding (e.g. each of the slice encodings 93a, 93b, 93c, 93d, 93e, 93f and 93g) is introduced for each echo.

Further, for each echo, the sequence control circuitry 120 applies a readout gradient $G_{ro}=G \cos\theta$ and a phase encode gradient $G_{ph}=G \sin\theta$ simultaneously, thereby acquiring data. G is the effective magnitude of the applied gradient.

For example, the sequence control circuitry 120 applies readout gradients 94d, 95e, 95f and 95g, reducing magnitudes of readout gradients applied as the angle θ becomes larger. The sequence control circuitry 120 applies phase encode gradients 96e, 96f and 96g, increasing magnitudes of phase encode gradients applied as the angle θ becomes larger. Data acquisition is performed for only a half of the k-space in a EASE method.

Subsequent to the 3D acquisition with any two directions radial and the third direction Cartesian by the sequence control circuitry 120, the processing circuitry 150 generates an image by the image generation function 136 (Step S240). At this time, the processing circuitry 150 compensates the missing k-space data based on the k-space data acquired by the data acquisition performed by the sequence control circuitry 120 with an aid of the Hermitian symmetry of the k-space.

In FIG. 12, a case in which a FASE pulse sequence with 3D acquisition with any two directions radial and the third direction Cartesian is incorporated into "flow-out" Time-SLIP method is explained. With a use of half-Fourier technique, such as in a FASE pulse sequence, data acquisition time becomes greatly reduced. In addition, a FASE pulse sequence has a wide clinical application. For example, a FASE pulse sequence is applicable to, for example, vulnerability evaluation for carotid artery plaque imaging.

As described, the method of reparation (Time-SLIP) and 3D acquisition (2D radial+Cartesian) allows non-contrast MRA (bright blood). A combination of preparation pulse location and 3D imaging slab location, black blood imaging can be possible to obtain, which will be useful in plaque imaging. For example, a selective tag preparation applied on the chest, which is marked dark blood and traveled to carotid by waiting for TI to be depicted as black blood imaging.

Figure 13A:
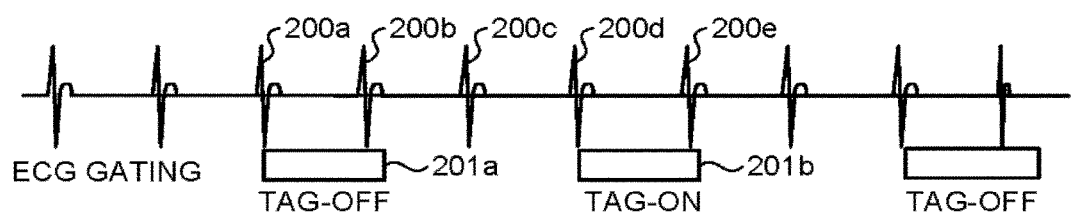
FIG. 13A is a diagram illustrating a magnetic resonance imaging apparatus according to the first embodiment.
Figure 13B:
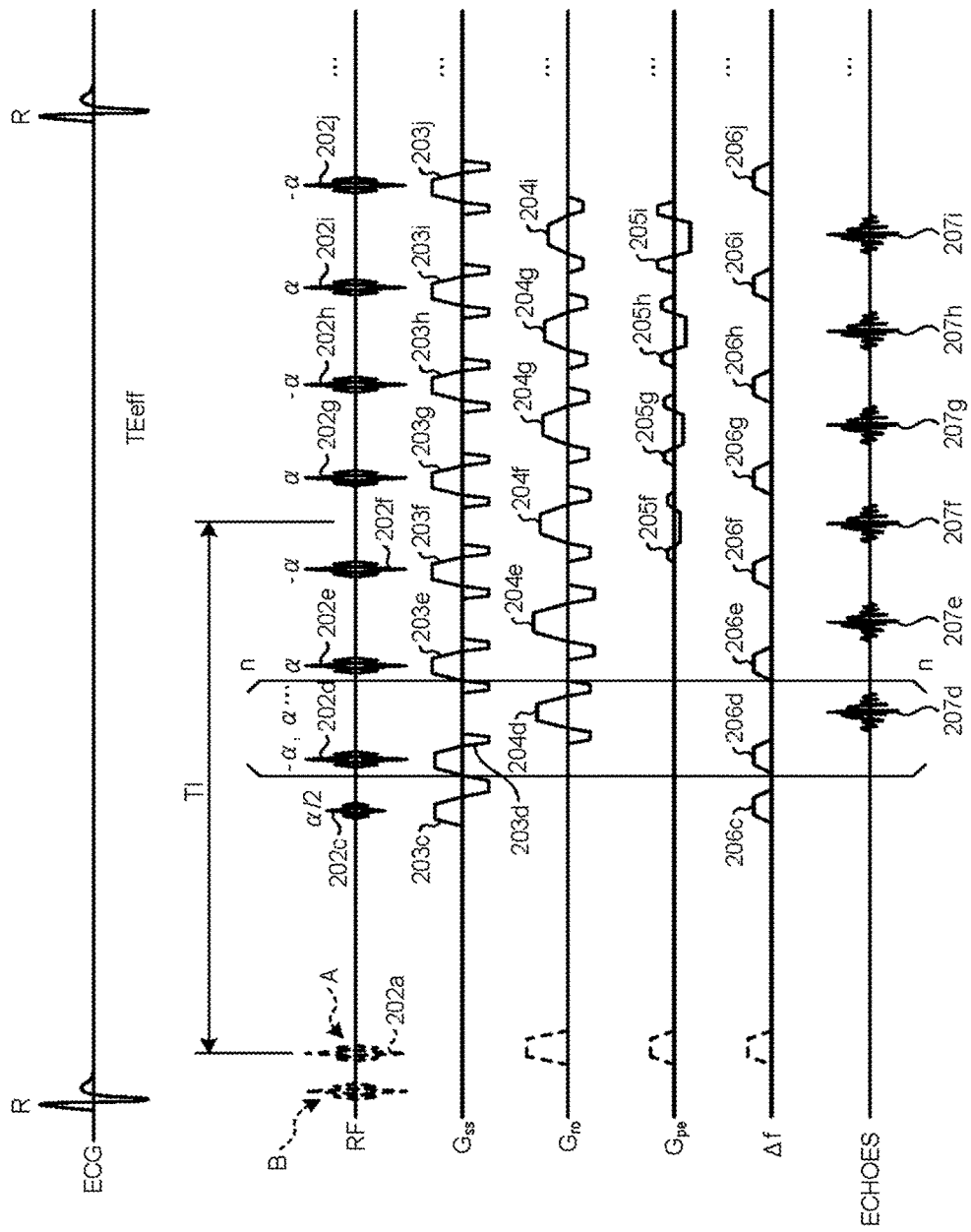

Next, FIG. 13A, FIG. 13B and FIG. 13C are explained. In these drawings, "tag-on/tag-off" method is employed. An example of radial bSSFP pulse sequence is employed during the imaging sequences. In case of cardiac phase sensitive, an ECG gating is performed.

In FIG. 13A, an ECG (Electrocardiogram) gating in combination "tag-on/tag-off" Time-SLIP method is explained.

In cardiac imaging, the heart is constantly moving, which often gives rise to motion artifacts in MRI images. In addition, the R to R intervals itself change from time to time. However, with a use of an ECG gating technique, motion artifact becomes alleviated. Here, ECG gating means synchronizing application timings of inversion pulses with R waves.

Typically, ECG leads are placed over the subject's chest with a specific configuration such that R waves of the subject become accentuated. The sequence control circuitry 120 reads electric signals from the leads and performs processing to be explained later based on the electric signals. Typically, the sequence control circuitry 120 performs data acquisition during diastole periods in which heart motion becomes minimized.

In FIG. 13A, an electrocardiogram of a subject is illustrated. Each of an R-wave 200a, 200b, 200c, 200d and 200e represents an R-wave during the cardiac cycles. A tag-off pulse sequence time period 201a represents a time period in which the sequence control circuitry 120 performs a "tag-off" pulse sequence. A tag-on pulse sequence time period 201b represents a time period in which the sequence control circuitry 120 performs a "tag-on" pulse sequence. The sequence control circuitry 120 electrically synchronizes a timing of an R-wave with a timing of an onset of a pulse sequence (either a "tag-on" pulse sequence or a "tag-off" pulse sequence).

FIG. 13B is a pulse sequence diagrams illustrating a pulse sequence executed by a magnetic resonance imaging apparatus 100 according to the first embodiment. In FIG. 13B, an example of "tag-off" pulse with the bSSFP data acquisition sequence is explained.

The top row illustrates an ECG signal.

The top row of the pulse sequence diagram in FIG. 13B illustrates RF pulses applied. A pulse denoted by "B" represents a spatially non-selective inversion pulse that is optionally applied by the sequence control circuitry 120.

A pulse 202a (also denoted by "A") represents a spatially selective inversion pulse that should have been applied by the sequence control circuitry 120 were it a "tag-on" pulse sequence. In fact, this is a "tag-off" pulse sequence, and the pulse 202a is not actually applied by the sequence control circuitry 120. The pulse 202a is a mere remainder of illustrating the time of origin when counting TI (Time to inversion) as illustrated in FIG. 13B. An α/2-degrees pulse 202c represents an α/2-degrees applied. RF pulses 202d represent RF pulse applied by the sequence control circuitry 120 during the dummy pulse sequence. α-degrees pulses 202*e*, 202*g*, 202*i* and minus-α-degrees pulses represent RF pulses applied by the sequence control circuitry 120 during the imaging sequence.

The second row of the pulse sequence diagram in FIG. 13B illustrates slice encode gradients $G_{ss}$ applied. A slice encode gradient 203*c* and slice encode gradients 203*d* are slice encode gradients applied by the sequence control circuitry 120 during the preparation stage of the pulse sequence. Slice encode gradients 203*e*, 203*f*, 203*g*, 203*h*, 203*i* and 203*j* represent slice encode gradients applied by the sequence control circuitry 120 simultaneously with the α-degrees pulses or the minus-α-degrees pulses.

The bottom row of the pulse sequence diagram in FIG. 13B illustrates echoes formed. Echoes 207*d* represent echoes formed during the dummy sequence. Echoes 207*e*, 207*f*, 207*g*, 207*h* and 207*i* represent echoes formed by the RF pulses and the gradient magnetic fields applied by the sequence control circuitry 120 during the imaging sequence. A plurality of echoes is formed for one inversion pulse.

The third row of the pulse sequence diagram in FIG. 13B illustrates readout gradients $G_{ro}$ applied. Readout gradients 204*d* represent readout gradients applied by the sequence control circuitry 120 during the dummy sequence. Readout gradients 204*e*, 204*f*, 204*g*, 204*i* represent readout gradients applied by the sequence control circuitry 120 during the imaging sequence.

The fourth row of the pulse sequence diagram in FIG. 13B illustrates phase encode gradients $G_{ph}$ applied. Phase encode gradients 205*f*, 205*g*, 205*h* and 205*i* represent phase encode gradients applied by the sequence control circuitry 120 during the imaging sequence.

The fifth row of the pulse sequence diagram in FIG. 13B illustrates a frequency offset gradient Δf optionally applied by the sequence control circuitry 120 in order to perform fine adjustment of a position or an orientation of a tagged region and the like. Frequency offsets 206*c*, 206*d*, 206*e*, 206*f*, 206*g*, 206*h*, 206*i* and 206*j* represent frequency offsets optionally applied by the sequence control circuitry 120.

In FIG. 13C, an example of "tag-off" pulse sequence with bSSFP data acquisition sequence is explained.

The top row illustrates an ECG signal. The top, the second, the third, the fourth, the fifth, the bottom row illustrates RF pulses, slice encode gradients $Gp_{ss}$, readout gradients $G_{ro}$, phase encode gradients $G_{pe}$, optionally-applied frequency offsets Δf and echoes.

A spatially selective pulse 210*a* (also denoted by "A") represents a spatially selective inversion pulse applied by the sequence control circuitry 120. Each of a readout gradient 242*a* and a phase encode gradient 243*a* represents a readout gradient and a phase encode gradient applied by the sequence control circuitry 120, respectively.

Except for the spatially selective pulse 210*a* (and the readout gradient 212*a*, the phase encode gradient 213*a*), FIG. 13C and FIG. 13B are the same. For example, each of an α/2-degrees pulse 210*c*, α-degrees pulses 210*d*, α-degrees pulses 210*e*, 210*f* and 210*i*, minus-α-degrees pulses 210*f*, 210*h* and 210*j*, slice encode gradients 211*c*, 211*d*, 211*e*, 211*f*, 211*i* and 211*j*, readout gradients 212*a*, 212*d*, 212*e*, 212*f*, 212*g*, 212*h* and 212*i*, phase encode gradients 213*a*, 213*f*, 213*g*, 213*h* and 213*i*, frequency offsets 214*c*, 214*d*, 214*e*, 214*f*, 214*g*, 214*h*, 214*i* and 214*j*, echoes 215*d*, 215*e*, 215*f*, 215*g*, 215*h* and 215*i* in FIG. 13C corresponds to the α/2-degrees pulse 202*c*, RF pulses 202*d* (α-degrees pulses), α-degrees pulses 202*e*, 202*g* and 202*i*, minus-α-degrees pulses 202*f*, 202*h* and 202*j*, slice encode gradients 203*c*, 203*d*, 203*e*, 203*f*, 203*i* and 203*j*, readout gradients 204*a*, 204*d*, 204*e*, 204*f*, 204*g*, 204*h* and 204*i*, phase encode gradients 205*a*, 205*f*, 205*g*, 205*h* and 205*i*, frequency offsets 206*c*, 206*d*, 206*e*, 206*f*, 206*g*, 206*h*, 206*i* and 206*j*, echoes 207*d*, 207*e*, 207*f*, 207*g*, 207*h* and 207*i*, respectively.

FIG. 14 is a diagram illustrating processing performed by a magnetic resonance imaging apparatus according to the first embodiment. In FIG. 14, data processing method performed by the processing circuitry 150 is explained in detail.

In FIG. 14, each of an arrow 250*a*, 250*c* and 250*e* indicates a time on which the "tag-off" pulse sequence as illustrated in FIG. 13B is started. Each of an arrow 250*b* and 250*d* indicates a time on which the "tag-on" pulse sequence as illustrated in FIG. 13C is started. Each of a data acquisition time period 251*a* and a data acquisition time period 251*c* represents a time period during which data acquisition is performed by the sequence control circuitry 120 during the "tag-off" pulse sequence as illustrated in FIG. 13B. Each of data acquisition time period 251*b* and data acquisition time period 251*d* represents a time period during which data acquisition is performed by the sequence control circuitry 120 during the "tag-on" pulse sequence as illustrated in FIG. 13C.

A k-space tag-off image 212*a* represents a k-space image generated by the processing circuitry 150 based on data acquired from the "tag-off" pulse sequences executed by the sequence control circuitry 120. A k-space tag-on image 212*b* represents a k-space image generated by the processing circuitry 150 based on data acquired from the "tag-on" pulse sequence executed by the sequence control circuitry 120.

A tag-off image 213*a* represents an image reconstructed from the k-space tag-off image 212*a* by the processing circuitry 150. A tag-on image 213*b* represents an image reconstructed from the k-space tag-on image 212*b* by the processing circuitry 150. An output image 213*c* is an image obtained from the tag-off image 213*a* and the tag-on image 213*b* by an image subtraction processing. The processing circuitry performs the subtraction processing. Myocardium blood 214*a* is depicted in the output image 213*c*.

With reference to FIG. 4C, the processing performed by the magnetic resonance imaging apparatus 100 is explained.

The sequence control circuitry 120 executes two pulse sequences. The sequence control circuitry 120 performs the "tag-off" pulse sequence illustrated in FIG. 13B during the tag-off pulse sequence time period 201*a* and performs the "tag-on" pulse sequence illustrated in FIG. 13C during the tag-on pulse sequence time period 201*b*.

In the "tag-off" pulse sequence, the sequence control circuitry 120 does not apply an inversion pulse. During the data acquisition time period 10, the sequence control circuitry 120 performs 3D acquisition with any two directions radial and the third direction Cartesian (Step S320A). This step is the same as that explained in FIG. 11, so the explanation is not repeated.

Subsequent to the 3D acquisition with any two directions radial and the third direction Cartesian by the sequence control circuitry 120, the processing circuitry 150 generates a "tag-off" image (Step S330A).

Specifically, the processing circuitry 150 gleans a plurality of pieces of data acquired during a plurality of data acquisition time periods, thereby generating a k-space tag-off image. For example, by the image generation function 136 the processing circuitry 150 collects a plurality of pieces of data acquired during the data acquisition time period 211*a*, 211*c* and 211*e*, thereby generating the k-space tag-off image 212*a*. Subsequently, the processing circuitry 150 performs a reconstruction processing to the k-space tag-off image, such as Fourier transform, thereby generating a tag-off image. For example, by the image generation function 136 the processing circuitry 150 performs Fourier transform to the k-space tag-off image 212a, thereby generating the tag-off image 213a.

As for the "tag-on" pulse sequence, the sequence control circuitry 120 applies a spatially selective inversion pulse (Step S300). For example, the sequence control circuitry 120 applies the spatially selective inversion pulse 202a.

The sequence control circuitry 120 waits until near the null point (Step S310). During the data acquisition time period, the sequence control circuitry 120 performs 3D acquisition with any two directions radial and the third direction Cartesian (Step S320B). Subsequent to the 3D acquisition with any two directions radial and the third direction Cartesian by the sequence control circuitry 120, the processing circuitry 150 generates a tag-on image based on the data acquired by the sequence control circuitry 120 (Step S330B).

For example, the processing circuitry 150 gleans a plurality of pieces of data acquired during a plurality of data acquisition time periods, thereby generating a k-space tag-on image. For example, by the image generation function 136 the processing circuitry 150 collects a plurality of pieces of data acquired during the data acquisition time period 211b and 211d, thereby generating the k-space tag-on image 212b. Subsequently, the processing circuitry 150 performs a reconstruction processing to the k-space tag-on image, such as Fourier transform, thereby generating a tag-on image. For example, by the image generation function 136 the processing circuitry 150 performs Fourier transform to the k-space tag-on image 212b, thereby generating the tag-on image 213b.

Upon completion of the generation of the "tag-off" image 213a in step S330A by the processing circuitry 150 and the generation of the tag-on image 213b in step S330B by the processing circuitry 150, the processing circuitry 150 performs a subtraction operation between the "tag-off" image 213a and the "tag-on" image 213b, thereby generating the output image 213c (Step S340).

In FIG. 13A to FIG. 14, an example is given in which "tag-on/tag-off" method in combination with an ECG gating is performed is explained. "Tag-on/tag-off" method is considered to be especially useful in a case fluid motion is slow, or in a case wishing for a complete background suppression. Furthermore, an ECG gating makes a further suppression of motion artifact possible.

Embodiments are not limited to these examples.

In FIG. 13A, a case in which the sequence control circuitry 120 performs an ECG gating is explained. However, embodiments are not limited to this situation. For example, the sequence control circuitry 120 may performs a respiratory gating. Alternatively, the sequence control circuitry 120 may performs both an ECG gating and a respiratory gating.

In summary, in a magnetic resonance imaging apparatus 100 according to the first embodiment, a dense data acquisition in the center of the k-space with a use of a radial stack-of-data acquisition combined with a Time-SLIP method obliterating background signal without using contrast agents makes the image acquired by the processing circuitry 150 robust against motion artifact. Furthermore, a quick data acquisition becomes possible with stack-of-star acquisition.

Second Embodiment

In the first embodiment, a case in which the sequence control circuitry 120 performs (sequential) radial stack-of-star acquisition (3D acquisition with any two directions radial and the third direction Cartesian) during the imaging sequence is explained. In a second embodiment, a case in which the sequence control circuitry 120 performs an interleaved radial sampling during the imaging sequence is explained. Compared to sequential radial stack-of star sampling (3D acquisition with any two directions radial and the third direction Cartesian), interleaved radial sampling has an advantage of being robust against motion artifact.

Figure 15A:
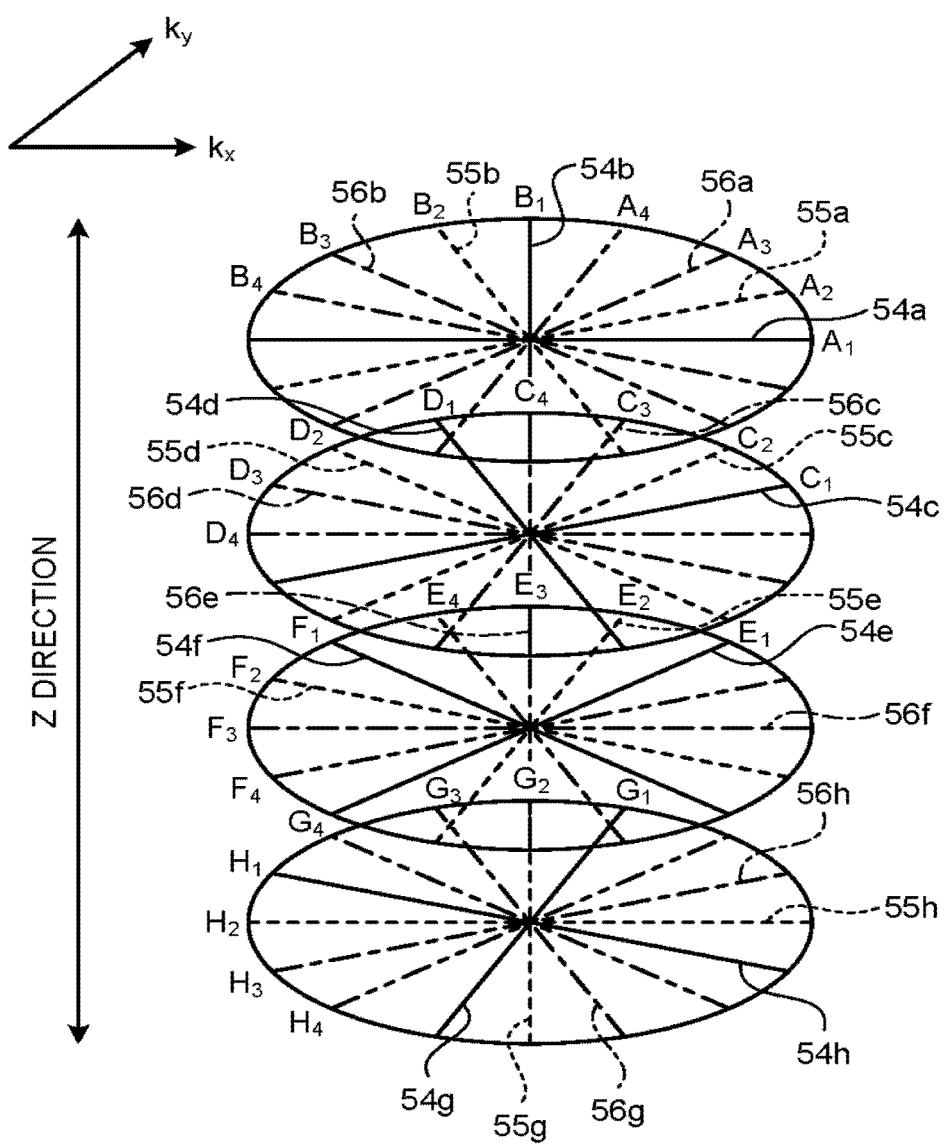
FIG. 15A is a drawing illustrating processing performed by a magnetic resonance imaging apparatus according to a second embodiment.

FIG. 15A is a drawing illustrating processing performed by a magnetic resonance imaging apparatus according to the second embodiment. FIG. 15A illustrates an example of an interleaved radial sampling.

In FIG. 15A, each disc represents data acquisition for a given slice position (or a position in the z-direction) in a two-dimensional k-space, which consists of two k axes of $k_x$ axis and $k_y$ axis. The choice of x, y and z direction is arbitrary so long as they are orthogonal.

Similarly to FIG. 5, each disc consists of a plurality of "lines" having different orientation in two-dimensional k-space. Each of a k-space line 54a ($A_1$) and a k-space line 54b ($B_1$) represents a k-space line pertinent to a first segment of a first slice that is pertinent to a first slice position. Each of a k-space line 54c ($C_1$) and a k-space line 54d ($D_1$) represents a k-space line pertinent to a first segment of a second slice that is pertinent to a second slice position. Each of a k-space line 54e ($E_1$) and a k-space line 54f ($F_1$) represents a k-space line pertinent to a first segment of a third slice that is pertinent to a third slice position. Each of a k-space line 54g ($G_1$) and a k-space line 54h ($H_1$) represents a k-space line pertinent to a first segment of a fourth slice that is pertinent to a fourth slice position.

In the same way, each of a k-space line 55a ($A_2$) and a k-space line 55b ($B_2$) represents a k-space line pertinent to a second segment of a first slice. Each of a k-space line 56a ($A_3$) and a k-space line 56b ($B_3$) represents a k-space line pertinent to a third segment of a first slice. Each of $A_4$ and $B_4$ represents a fourth segment of the first slice.

Similarly, each of a k-space line 54c ($C_1$), a k-space line 55c ($C_2$), a k-space line 56c ($C_3$), $C_4$, a k-space line 54d ($D_1$), a k-space line 55d ($D_2$), a k-space line 56d ($D_3$) and $D_4$ represents a first segment, a second segment, a third segment, a fourth segment, a first segment, a second segment, a third segment and a fourth segment of the second slice.

Each of a k-space line 54e ($E_1$), a k-space line 55e ($E_2$), a k-space line 56e ($E_3$), $E_4$, a k-space line 54f ($F_1$), a k-space line 55f ($F_2$), $F_3$ and $F_4$ represents a first segment, a second segment, a third segment, a fourth segment, a first segment, a second segment, a third segment and a fourth segment of the third slice. Each of a k-space line 54g ($G_1$), a k-space line 55g ($G_2$), a k-space line 56g ($G_3$), $G_4$, a k-space line 54h ($H_1$), a k-space line 55h ($H_2$), a k-space line 56h ($H_3$) and $H_4$ represents a first segment, a second segment, a third segment, a fourth segment, a first segment, a second segment, a third segment and a fourth segment of the fourth slice.

FIG. 15B is a diagram illustrating processing performed by a magnetic resonance imaging apparatus according to the second embodiment. In FIG. 15B, the sequence control circuitry 120 performs an interleaved radial sampling. Each of an inversion pulse 220a, an inversion pulse 220b, an inversion pulse 220c, an inversion pulse 220d, an inversion pulse 220e represents an inversion pulse corresponding to a first, a second, a third, a fourth and a fifth data acquisition performed by the sequence control circuitry 120. Each of a null point 221a, a null point 221b, a null point 221c, a null point 221d and a null point 221e represents a null point on which longitudinal magnetization becomes substantially zero during which the first, the second, the third, the fourth and the fifth data acquisition, respectively.

The sequence control circuitry 120 applies the inversion pulse 220a and waits until near the null point 221a during first data acquisition. The sequence control circuitry 120, for example, performs data acquisition of a first segment of a first slice during a first data acquisition time period 222a. The sequence control circuitry 120 performs data acquisition of, for example, the k-space lines $A_1$ and $B_1$ in FIG. 15A in the data acquisition of the first segment of the first slice.

Subsequently, the sequence control circuitry 120 applies the inversion pulse 220b and waits until near the null point 221b during second data acquisition. The sequence control circuitry 120, for example, performs data acquisition of a first segment of a second slice during a second data acquisition time period 222b. The sequence control circuitry 120 performs data acquisition of, for example, the k-space lines $C_1$ and $D_1$ in FIG. 15A in the data acquisition of the first segment of the second slice. Similarly, the sequence control circuitry 120 performs data acquisition of, for example, the k-space lines $E_1$ and $F_1$ in FIG. 15A in the data acquisition of the first segment of the third slice during a third data acquisition time period 222c. Subsequently, the sequence control circuitry 120 performs data acquisition of, for example, the k-space lines $G_1$ and $H_1$ in FIG. 15A in the data acquisition of the first segment of the fourth slice during a fourth data acquisition time period 222d.

Upon completion of data acquisition of "the first segment", the sequence control circuitry 120 moves on to data acquisition of, for example, the k-space lines of $A_2$ and $B_2$ in FIG. 15A in the data acquisition of the second segment of the first slice during a fifth data acquisition time period 222e. Thereafter, the sequence control circuitry 120 performs data acquisition of the k-space lines of $C_2$ and $D_2$ in FIG. 15A in a sixth data acquisition time period, data acquisition of the k-space lines of $E_2$ and $F_2$ in FIG. 15A in a seventh data acquisition time period and data acquisition of the k-space lines of $G_2$ and $H_2$ in FIG. 15A in a eighth data acquisition time period. In this way, the sequence control circuitry 120 performs data acquisition of "the second segment".

An interleaved radial sampling is robust against motion artifact. As a comparison, in a sequential radial sampling as illustrated in FIG. 5, as for k-space lines pertinent to the first slice position ($A_1$ to $H_1$ in FIG. 5), data acquisition is performed at a time. Thus, if patient motion occurs during the time in which data acquisition for the first slice position is performed, data of the first slice position becomes deteriorated.

However, in an interleaved radial sampling as illustrated in FIG. 15A, as for k-space lines pertinent to the first slice position ($A_1$ to $H_1$ in FIG. 15A), data acquisition is performed in a plurality of times. For example, $A_1$ and $B_1$, that are pertinent to the first segment, are acquired at a first time period. Similarly, $A_2$ and $B_2$, that are pertinent to the second segment, are acquired at a second time period. A, and B, are acquired at a third time period and $A_4$ and $B_4$ are acquired at a fourth time period. Thus, if patient motion occurs during one of the time periods in which data acquisition for the first slice position is performed, data of the other three time periods remains intact. Hence, data of the first slice position becomes less deteriorated. In other words, in an interleaved radial sampling, data becomes decentralized, thus robust against motion artifact.

Third Embodiment

In the first embodiment, a case in which Time-SLIP method and 3D acquisition with any two directions radial and the third direction Cartesian are combined is explained. In the second embodiment, a case in which motion artifact is suppressed with a use of interleaved radial sampling is explained. Compared to true 3D radial sampling (spherical sampling), 3D acquisition with any two directions radial and the third direction Cartesian is advantageous in that acquisition parameter is easily adjustable. In the third embodiment, the processing circuitry 150 optimizes parameters of 3D acquisition with any two directions radial and the third direction Cartesian prior to the imaging sequence.

In sequential radial stack-of-star sampling (3D acquisition with any two directions radial and the third direction Cartesian), a slice of full two-dimensional k-space is acquired by one inversion pulse. On the other hand, in interleaved radial stack-of-star sampling, one slice of two-dimensional k-space needs a plurality of inversion pulses in order for data acquisition to be performed. Thus, sequence radial stack-of-star sampling (3D acquisition with any two directions radial and the third direction Cartesian) is advantageous in terms of data acquisition time.

On the other hand, as is explained in the second embodiment, interleaved radial stack-of-star sampling (3D acquisition with any two directions radial and the third direction Cartesian) is advantageous in terms of robustness against motion artifact.

Figure 16:
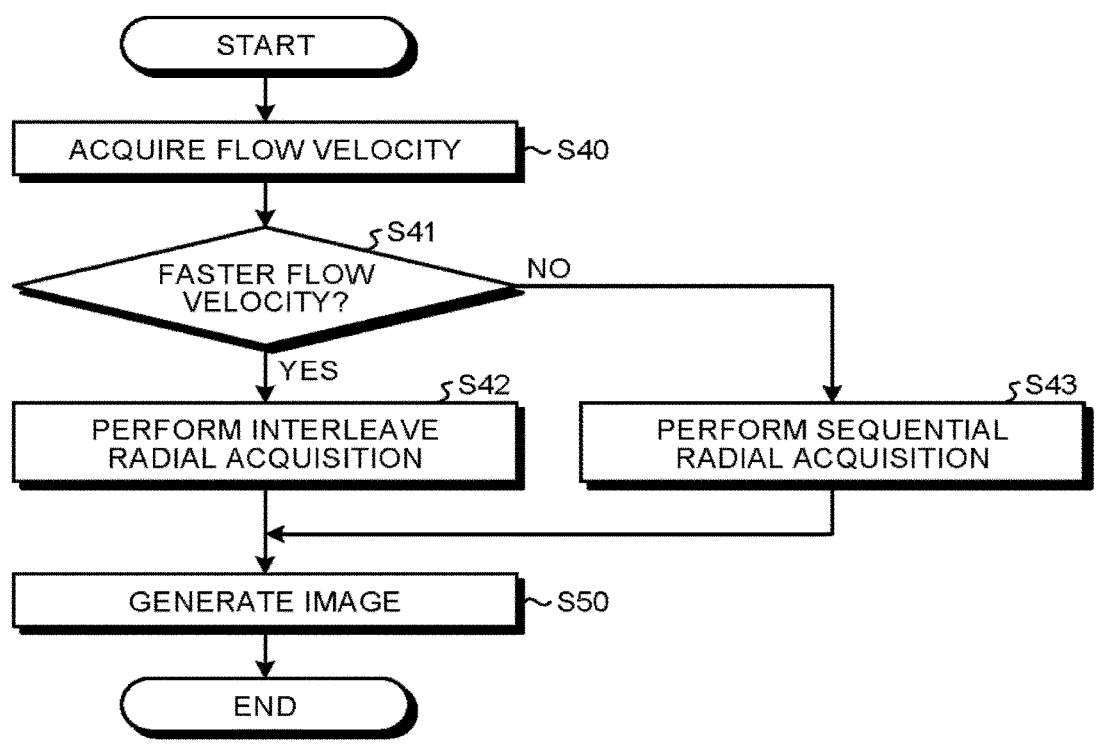
FIG. 16 is a flowchart illustrating a procedure performed by a magnetic resonance imaging apparatus according to a third embodiment.

In this context, the sequence control circuitry 120 according to the third embodiment determines, prior to the application of the inversion pulse, which of the interleave radial sampling and the sequential radial sampling is to be performed during the imaging sequence based on a velocity of fluid to be imaged. This situation is illustrated in FIG. 16. FIG. 16 is a flowchart illustrating a procedure performed by a magnetic resonance imaging apparatus according to a third embodiment. First of all, the processing circuitry 150 acquires a value of flow velocity (Step S40). For example, the processing circuitry 150 receives an input of a value of flow velocity of target vessel from the operator. If the value of flow velocity acquired by the processing circuitry 150 exceeds a predetermined threshold (Step S41 Yes), the sequence control circuitry 120 performs interleaved radial acquisition during the data acquisition time period 10 (Step S42). On the other hand, if the value of flow velocity acquired by the processing circuitry 150 does not exceed the predetermined threshold (Step S41 No), the sequence control circuitry 120 performs sequential radial acquisition during the data acquisition time period 10 (Step S43). Upon completion of a radial acquisition in either of the method, the processing circuitry 150 generates an image by the image generation function 136 (Step S50).

A case in which the sequence control circuitry 120 determines the radial sampling method to be used in the subsequent imaging sequence is explained. However, embodiment is not limited to this situation. In fact, the sequence control circuitry 120 may adjust, prior to an application of the inversion pulse, a number of k-space lines pertinent to the data acquisition based on a velocity of fluid to be imaged. Alternatively, the sequence control circuitry 120 may adjust an amount of slice encoding based on a velocity of fluid to be imaged prior to an application of the inversion pulse.

Figure 17A:
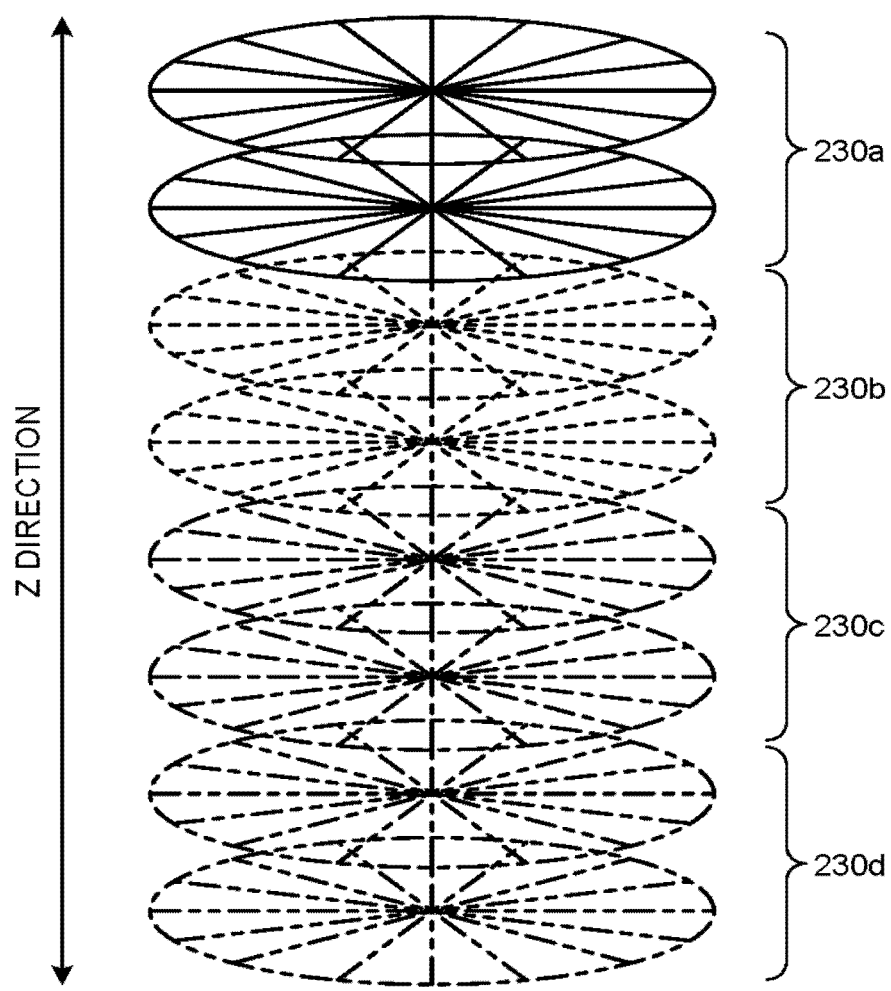
FIG. 17A and FIG. 17B are drawings illustrating processing performed by a magnetic resonance imaging apparatus according to the third embodiment.
Figure 17B:
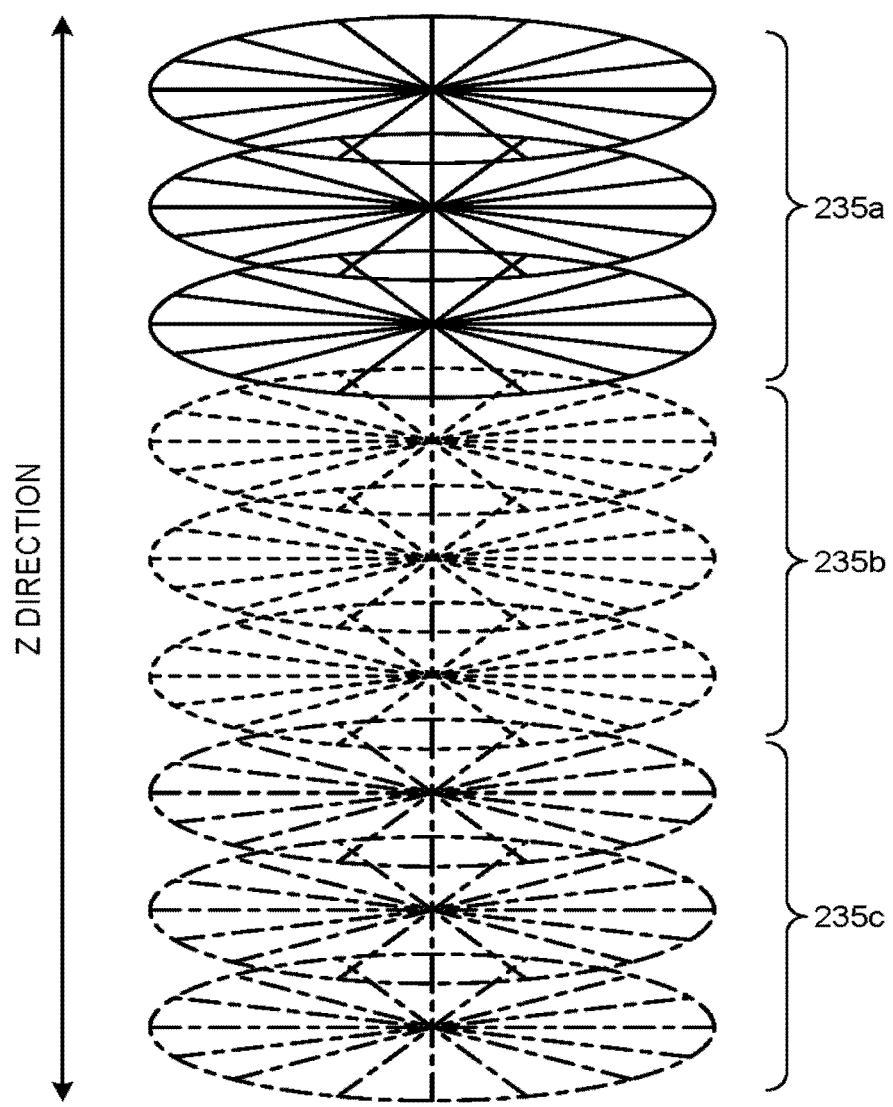

This situation is illustrated in FIG. 17A and FIG. 17B. FIG. 17A and FIG. 17B are drawings illustrating processing performed by a magnetic resonance imaging apparatus according to the third embodiment. FIG. 17A illustrates a case in which flow velocity relatively fast. On the other hand, FIG. 17B illustrates a case in which flow velocity is slower.

FIG. 17A indicates an example of two slice encodings per prepulse of Time-SLIP. In other words, two slices of data are acquired during a predetermined time period. For example, data acquisition is performed to a slice position corresponding to a region 230a during a first time period. Data acquisition is performed to a slice position corresponding to a region 230b during a second time period. Data acquisition is performed to a slice position corresponding to a region 230c during a third time period. Data acquisition is performed to a slice position corresponding to a region 230d during a fourth time period.

FIG. 17A corresponds to a case in which flow velocity is fast. The faster the flow velocity is, the smaller is the time in which the flow stays in a predetermined region of interest. Thus, the number of slices in which data acquisition is performed during a predetermined time period becomes small as the flow velocity becomes faster.

FIG. 17B indicates an example of three slice encodings per the Time-SLIP pulse. In other words, three slices of data are acquired during a predetermined time period. For example, data acquisition is performed to a slice position corresponding to a region 231a during a first time period. Data acquisition is performed to a slice position corresponding to a region 231b during a second time period. Data acquisition is performed to a slice position corresponding to a region 231c during a third time period.

FIG. 17B corresponds to a case in which flow velocity is slow. The slower the flow velocity is, the larger is the time in which the flow stays in a predetermined region of Interest. Thus, the number of slices in which data acquisition is performed in a predetermined time period becomes larger as the flow velocity becomes slower.

Figure 17C:
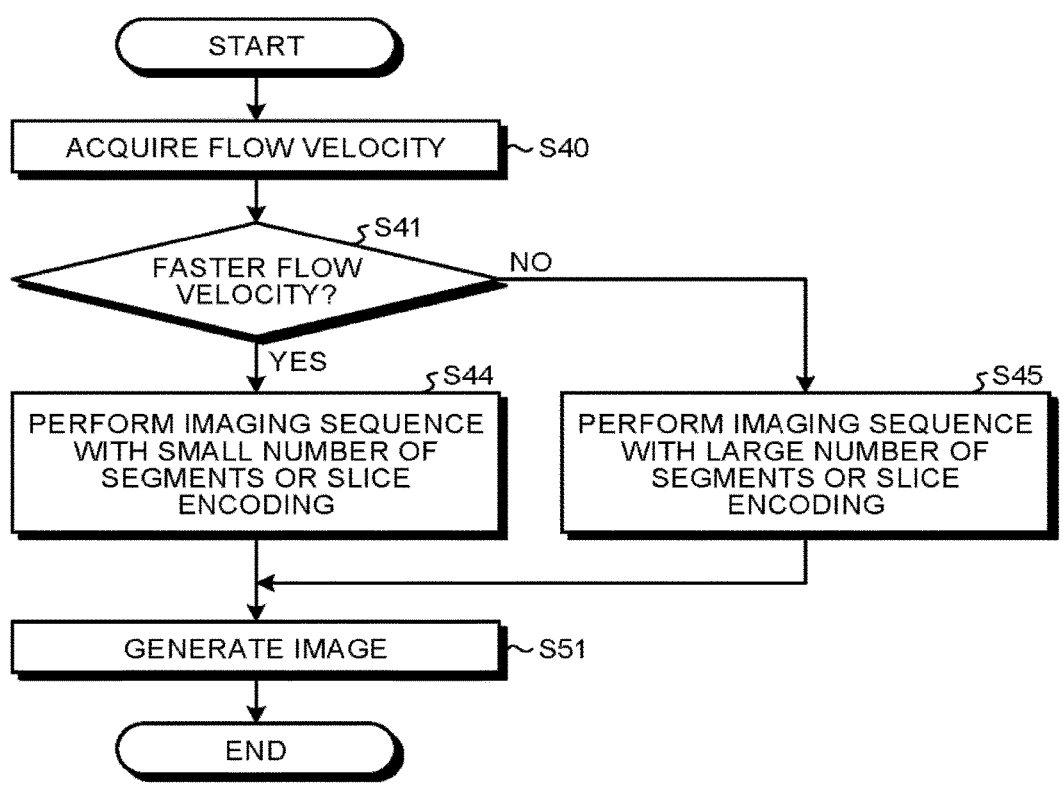
FIG. 17C and FIG. 18 are flowcharts illustrating procedures performed by a magnetic resonance imaging apparatus according to the third embodiment.

FIG. 17C is a flowchart illustrating this procedure performed by a magnetic resonance imaging apparatus according to the third embodiment. First of all, the processing circuitry 150 acquires a value of flow velocity by the interface function 131 (Step S40). For example, the processing circuitry 150 receives an input of a value of flow velocity of target vessel from the operator. If the value of the flow velocity acquired by the processing circuitry 150 exceeds a predetermined threshold (Step S41 Yes), the sequence control circuitry 120 performs an imaging sequence with a small number of segments or slice encoding (Step 44). The small number of segments means, for example, a small number of k-space lines to perform data acquisition. Further, a small number of segments means a large number of segmentations and a large number of segments means a small number of segmentations. The small number of slice encoding means, for example, a small number of slices to perform data acquisition. If the value of flow velocity acquired by the processing circuitry 150 does not exceed the predetermined threshold (Step S41 No), the sequence control circuitry 120 performs an imaging sequence with a large number of segments or slice encoding (Step S45). Upon completion of a radial acquisition in either of the method, the processing circuitry 150 generates an image by the image generation function 136 (Step S51).

Embodiments are not limited to these examples. For example, the sequence control circuitry 120 may switch an amount of slice encoding and a number of segments depending on the flow velocity. For example, in Step S41 of FIG. 17C, the processing circuitry 150 receives an input of a value of flow velocity of target vessel from the operator. If the flow velocity does not exceed a first predetermined threshold (if the flow velocity is very slow), the sequence control circuitry 120 performs data acquisition with 3 slice encodings per prepulse of Time-SLIP as in FIG. 17B. If the flow velocity exceeds the first predetermined threshold but does not exceed a second predetermined threshold larger than the first predetermined threshold (if the flow velocity is slow), the sequence control circuitry 120 performs data acquisition with 2 slice encodings per prepulse of Time-SLIP as in FIG. 17A. If the flow velocity exceeds the second predetermined threshold but does not exceed a third predetermined threshold larger than the second predetermined threshold (if the flow velocity is medium), the sequence control circuitry 120 performs data acquisition with 1 slice encoding per prepulse of Time-SLIP as in FIG. 5. If the flow velocity exceeds the third predetermined threshold but does not exceed a fourth predetermined threshold larger than the third predetermined threshold (if the flow velocity is fast), the sequence control circuitry 120 applies a plurality of inversion pulses in total to perform data acquisition of one slice position as illustrated in FIG. 8A and FIG. 8B. If the flow velocity exceeds the fourth predetermined threshold (if the flow velocity is very fast), the sequence control circuitry 120 performs an interleaved sampling as in FIG. 15A and FIG. 15B.

Embodiments are not limited to these examples. For example, the sequence control circuitry 120 may first execute pulse sequences that are preliminary and thereafter optimize the TI (Inversion Time) for the subsequence pulse sequence, based on data obtained from the executed pulse sequences that are preliminary. In this case, the sequence control circuitry 120 starts data acquisition on a time determined based on data acquired from a pulse sequence executed prior to the imaging sequence.

Figure 18:
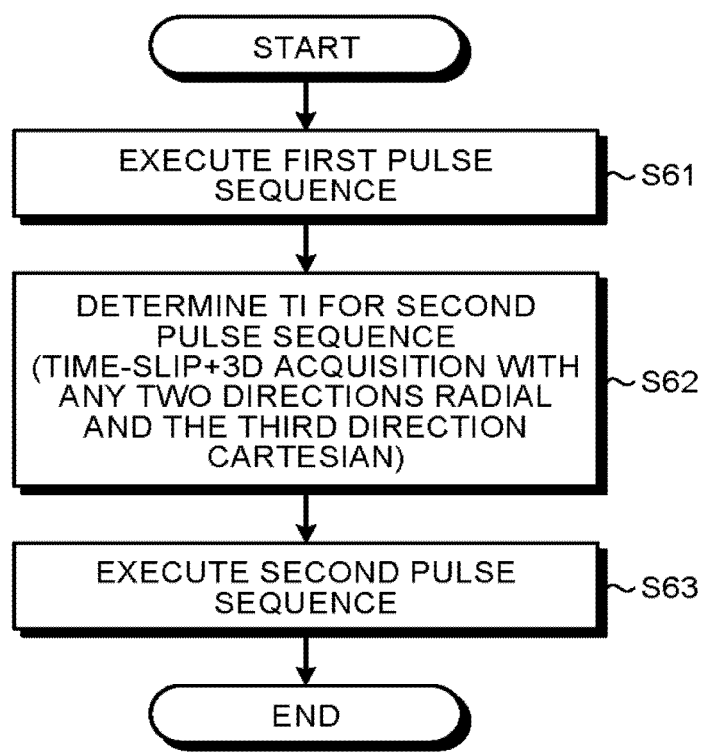

This situation is illustrated in FIG. 18. FIG. 18 is a flowchart illustrating a procedure performed by a magnetic resonance imaging apparatus according to the third embodiment.

In FIG. 18, first of all, the sequence control circuitry 120 executes a first pulse sequence for determining an optimum TI (Inversion Time) for data acquisition subsequently applied by the sequence control circuitry 120 (Step S61). For example, the sequence control circuitry 120 perform an imaging of only one slice with a predetermined pulse sequence and the processing circuitry 150 generates an image corresponding to the one slice, which becomes an image for determining the optimum TI for the subsequent pulse sequence. Subsequently, the sequence control circuitry 120 determines the optimum TI for a second pulse sequence. The second pulse sequence is a pulse sequence, for example, executed by the sequence control circuitry 120 in the first embodiment or in the second embodiment. The second pulse sequence is a combination of Time-SLIP method and 3D acquisition with any two directions radial and the third direction Cartesian (Step S62). Subsequently, the sequence control circuitry 120 executes the second pulse sequence (Step S63). By the image generation function 136, the processing circuitry 150 generates an image based on the second pulse sequence executed by the sequence control circuitry 120.

Embodiments are not limited to these examples. For example, in Step S62, instead of determining TI, the sequence control circuitry 120 may determine which of an interleave radial sampling and a sequential radial sampling is to be performed during the imaging sequence based on the first pulse sequence. Alternatively, for example, in step S62, instead of determining TI, the sequence control circuitry 120 may a number of k-space lines pertinent to the data acquisition or an amount of slice encoding based on the first pulse sequence.

In the third embodiment, various parameters are optimized prior to the Time-SLIP pulse sequence executed by the processing circuitry 150. This optimization is made possible partly because 3D acquisition with any two directions radial and the third direction Cartesian has flexibility as to adjustment of parameters of the pulse sequence depending on flow velocity.

Fourth Embodiment

In the fourth embodiment, Time-SLIP method is combined with multi-slice 2D radial acquisition. In other words, the sequence control circuity 120 performs multi-slice 2D radial acquisition including simultaneous multiband excitation during the data acquisition sequence of the Time-SLIP method. In the following, explanation is given in a case of "flow-in" method as in FIG. 4A. However, embodiments are not limited to this situation. Embodiments can be extended to "flow-out" method or "tag-on/tag-off" method straightforwardly.

First of all, the sequence control circuitry 120 applies a spatially selective inversion pulse as an inversion pulse (Step S100), as in FIG. 4A. For example, the sequence control circuitry 120 applies the spatially selective inversion pulse 20 to the pulse application region 44.

The longitudinal magnetization gradually recovers as time passes. The sequence control circuitry 120 waits until near the null point 30 (Step S110). The null point is the time on which longitudinal magnetization becomes zero.

During the data acquisition time period 10, the sequence control circuitry 120 performs 3D acquisition with any two directions radial and the third direction Cartesian including multiband excitations. In other words, the sequence control circuitry 120 executes a simultaneous multi-slice (SMS) sequence, in which multiband composite RF (Radio Frequency) pulse in combination with slice selective gradient is applied to excite a plurality of slices. During the subsequent echoes generated, data acquisition is performed, in which the encoding pattern in each slice can be, for example, 2D radial, 2D PETRA (as in FIG. 10A), 2D UTE or 2D JET (as in FIG. 10B).

In normal two-dimensional k-space encoding alone, images from simultaneously excited slices are not separable. However, a magnetic resonance imaging apparatus according to the fourth embodiment comprises a plurality of reception coils (or channels), from which signals from each of the slices can be extracted.

In other words, first of all, at Step S120, the sequence control circuitry 120 executes an imaging sequence including a multiband composite RF pulse and a gradient field concurrently applied with the multiband composite RF pulse in a slice direction. Due to the multiband composite RF pulse, a plurality of slices becomes simultaneously excited. Followed by the simultaneous excitation, a plurality of reception coils 109 furnished in the magnetic resonance imaging apparatus 100 picks up the signals, by using, for example, the 3D acquisition with any two directions radial and the third direction Cartesian, which is performed by the sequence control circuitry 120. The signals acquired from the data acquisition are then sent to the processing circuitry 150.

Upon completion of the 3D acquisition with any two directions radial and the third direction Cartesian by the sequence control circuitry 120, the processing circuitry 150 generates an image based on the data acquisition pulse sequence executed by the processing circuitry 150 (Step S130). Specifically, the processing circuitry 150 performs a reconstruction processing, for example, SENSE (Sensitivity Encoding) or other suitable reconstruction methods to the signals, thereby obtaining images of the plurality of slices concurrently.

A case in which the sequence control circuitry 120 performs the 3D acquisition with any two directions radial and the third direction Cartesian is described above. However, embodiments are not limited to this example. For example, the sequence control circuitry 120 may perform data acquisition including at least one of 2D radial acquisition, 2D JET data acquisition (2D data acquisition performing a plurality of times of sampling in a substantially same orientation), 2D PETRA data acquisition and 2D UTE data acquisition.

In the fourth embodiment, Time-SLIP methods, radial acquisition and simultaneous multiband excitation technique are combined. Consequently, a further reduction of data acquisition becomes possible.

Fifth Embodiment

In the previous embodiments, the sequence control circuitry 120 performs 3D acquisition with any two directions radial and the third direction Cartesian. In the fifth, embodiment, the sequence control circuitry 10 performs 3D k-space data acquisition.

In the following, explanation is given in a case of "flow-in" method as in FIG. 4A again. However, embodiments are not limited to this situation, similarly to the case of the fourth embodiment. Embodiments can be extended to "flow-out" method or "tag-on/tag-off" method straightforwardly.

First of all, the sequence control circuitry 120 applies a spatially selective inversion pulse as an inversion pulse (Step S100), as in FIG. 4A. For example, the sequence control circuitry 120 applies the spatially selective inversion pulse 20 to the pulse application region 44. In other words, the sequence control circuitry 120 executes a subsequent imaging sequence including an RF (Radio Frequency) pulse and a gradient magnetic field concurrently applied with the RF pulse in a slice direction.

The longitudinal magnetization gradually recovers as time passes. The sequence control circuitry 120 waits until near the null point 30 (Step S110). The null point is the time on which longitudinal magnetization becomes zero.

During the data acquisition time period 10, the sequence control circuitry 120 performs, for a slice position selected by the RF pulse and the gradient magnetic field and during a time period including a null point, data acquisition in a plurality of orientations including an origin of a three-dimensional k-space. The encoding type of this data acquisition includes, for example, 3D UTE (Ultrashort Echo) data acquisition, 3D PETRA (Pointwise Encoding Time reduction with Radial Acquisition) data acquisition and 3D projection data acquisition.

Figure 19A:
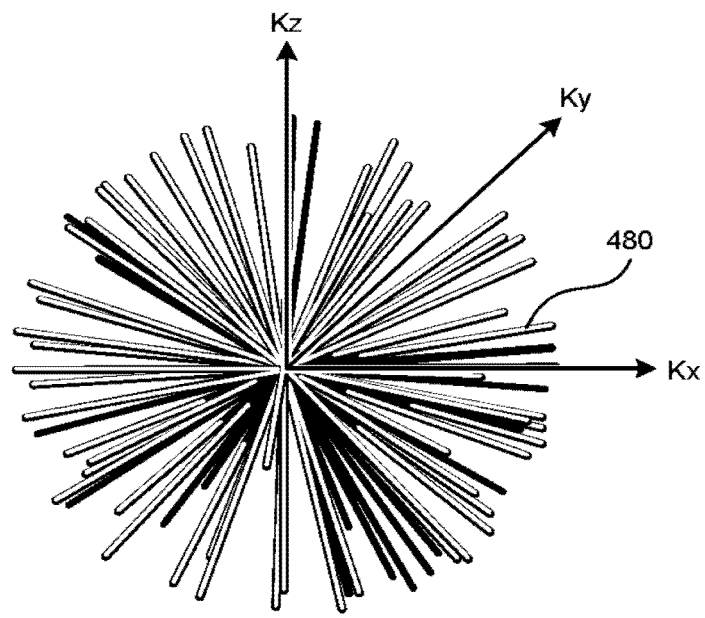
FIG. 19A and FIG. 19B are drawings illustrating processing performed by a magnetic resonance imaging apparatus according to the fourth embodiment.

In FIG. 19A, a typical case in which the sequence control circuitry 120 performs 3D k-space data acquisition is described. For example, 3D UTE data acquisition belongs to this type of data acquisition.

First of all, a case in which the sequence control circuitry 120 performs 3D UTE data acquisition is explained.

The left-right direction, the anterior-posterior direction, the vertical direction in FIG. 19A represents, the $k_x$ direction, the $k_y$ direction and the $k_z$ direction, respectively, of the 3D k-space. It is noted that the choices of x, y and z direction, hence $k_x$, $k_y$ and $k_z$ direction may be arbitrary. Each of the strings illustrated in FIG. 19A, which originates from the origin of the 3D k-space and extending outward, represents one line of 3D k-space data acquisition. In other words, in the 3D UTE data acquisition, each of the plurality of lines of 3D data acquisition starts from the origin of the 3D k-space (starting from the low) and extends outward in a linear trajectory (ending at the high). The sequence control circuitry 120 performs a "low-high" type of data acquisition in the case of 3D UTE data acquisition. This is also the case for the 3D PETRA data acquisition. In other words, the sequence control circuitry 120 performs a "low-high" type of data acquisition in the case of 3D PETRA data acquisition.

In data acquisition that is other than the the UTE data acquisition and the PETRA data acquisition, the sequence control circuitry 120 performs a "high-low-high" type of data acquisition. The "high-low-high" type of data acquisition means that, in one line of data acquisition, the sequence control circuitry 120 starts data acquisition in the outer part of the k-space (starting at the high), gradually approaching to the origin of the k-space (approaching to the low) and then moving outward to the other part of the outer part of the k-space (ending at the low). The sequence control circuitry 120 may perform data acquisition in this way.

Figure 19B:
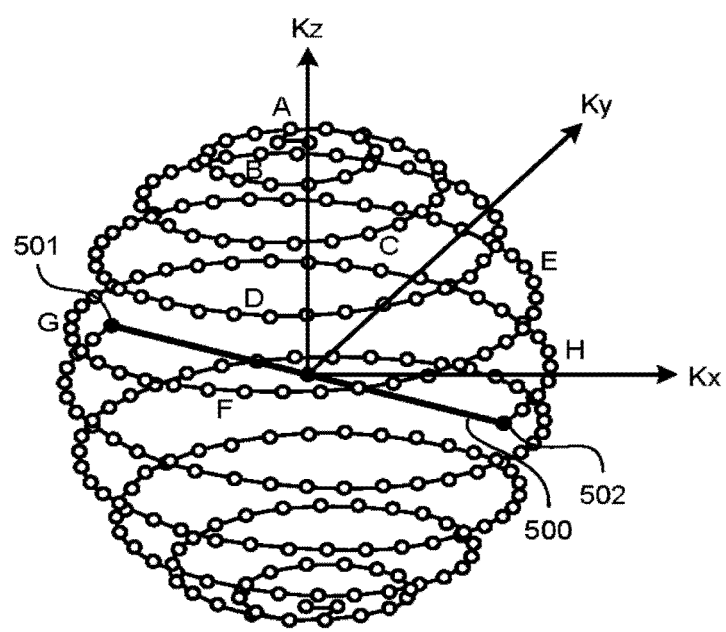
Figure 20:
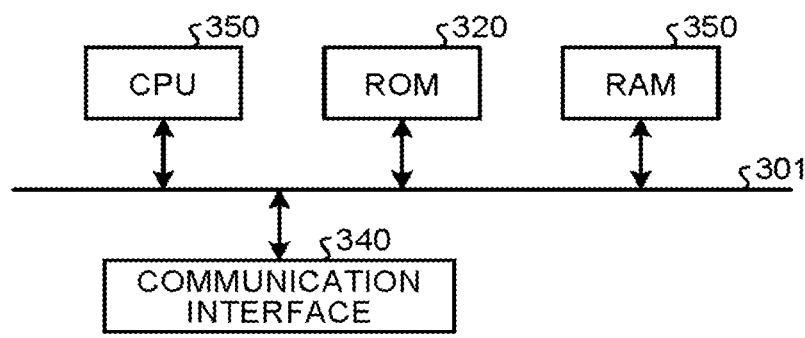
FIG. 20 is a diagram illustrating a hardware configuration of an image processing apparatus according to an embodiment.

As an example, the sequence control circuitry 120 may perform 3D projection data acquisition. This situation is illustrated, for example, in FIG. 19B. The left-right direction, the anterior-posterior direction, the vertical direction in FIG. 19B represents, the $k_x$ direction, the $k_y$ direction and the $k_z$ direction, respectively, of the 3D k-space. Each of the open circles in FIG. 19B represents an end point (either starting point or finishing point) of one line of 3D projection data acquisition. A line 500 illustrates an example of one of the lines of the 3D projection data acquisition performed by the sequence control circuitry 120, with a closed circle 501 and a closed circle 502 being endpoints. In one line of data acquisition, for example, the sequence control circuitry 120 performs a "high-low-high" type of data acquisition. For example, for the line 500, the sequence control circle 120 starts data acquisition at the closed circle 501, moving along the line 500 to the origin of the 3D k-space until finally reaches the closed circle 502. At this time, one line of data acquisition is finished.

Upon completion of one line of data acquisition, the starting point of the next line of the 3D projection data acquisition, for example, moves on to the open circle that is the nearest neighbor. Upon completion of the line of data acquisition, the starting point of the subsequent line of the 3D projection data acquisition, for example, moves on to the open circle that is the next-neighbor. The line connecting the open circles in FIG. 19B illustrates the transition of starting points (or finishing points) of each one line of 3D data acquisition. For example, the starting point of each of the lines of 3D projection data acquisition starts near the point A in FIG. 19B, moving along the trajectory of the line connecting the open circles to, for example, the point B in FIG. 19B, the point C in FIG. 19B, the point D in FIG. 19B, the point E in FIG. 18B, the point F in FIG. 19B, the point G in FIG. 19B, the point H in FIG. 19B, until finally reaching the closed circle 502. On the other hand, the finishing point of each of the lines of 3D projection data acquisition starts near the point that is in the opposite position of the point A across the origin of the 3D k-space, moving along the trajectory of the line connecting the open circles, until finally reaching the closed circle 501. During this process, data acquisition of the whole 3D k-space becomes completed.

The sequence control circuitry 120 performs, for example, performs data acquisition in 3D k-space such that the trajectory of the lines connecting each one of the two end points of the line along which data acquisition is performed becomes a spiral if projected onto the two-dimensional k-space. As an example, sequence control circuitry 120 performs, for example, performs data acquisition in 3D k-space such that the trajectory of the lines connecting each one of the two end points of the line along which data acquisition is performed becomes an Archimedean spiral if projected onto the two-dimensional k-space. Embodiments are not limited to this situation. For example, other spiral design may be possible. For example, the sequence control circuitry 120 may perform data acquisition in a spherical-stack-of-spiral trajectory.

Upon completion of the 3D acquisition by the sequence control circuitry 120 described above, the processing circuitry 150 generates an image based on the data acquisition pulse sequence executed by the processing circuitry 150 (Step S130).

Computer Programs

Further, the instructions presented in the processing procedures described in the above embodiments may be executed according to a computer program (hereinafter, "program") that is software. It is possible to achieve the same advantageous effects as those from the magnetic resonance imaging apparatus 100 in the above embodiments, by causing a general-purpose computer to store the program therein in advance and to read the program. The instructions described in the above embodiments are recorded as a computer-executable program onto a magnetic disk (e.g., a flexible disk, a hard disk), an optical disc (e.g., a Compact Disc Read-Only Memory [CD-ROM], a Compact Disc Recordable [CD-R], a Compact Disc Rewritable [CD-RW], a Digital Versatile Disk Read-Only Memory [DVD-ROM], a Digital Versatile Disk Recordable [DVD±R], a Digital Versatile Disk Rewritable [DVD±RW]), a semiconductor memory, or the like. Any storage format can be used, as long as a computer or an incorporated system is able to read data from the storage medium. The computer is able to realize the same operations as those performed by the magnetic resonance imaging apparatus 100 described in the above embodiments, by reading the program from the recording medium and having the CPU execute the instructions written in the program according to the read program. Further, when obtaining or reading the program, the computer may obtain or read the program via a network.

Further, according to the instructions in the program installed from the storage medium into the computer or the incorporated system, an Operating System (OS) working in the computer, middleware (MW) such as database management software or a network may execute a part of the processes performed for realizing the embodiments described above. Further, the storage medium does not necessarily have to a medium that is independent of the computer or the incorporated system. The storage medium may be such a storage medium that stores therein or temporarily stores therein the downloaded program transferred via a Local Area Network (LAN), the Internet, or the like. Further, the storage medium does not necessarily have to be one. Even the situation where the processes described in the above embodiments are executed from a plurality of media is included in possible modes of the storage medium implementing the embodiments. The medium/media may have any configuration.

Further, the computer or the incorporated system used in any of the embodiments is configured to execute the processes described in the above embodiments according to the program stored in the storage medium. The computer or the incorporated system may be configured by using a single apparatus such as a personal computer or a microcomputer or may be configured by using a system in which a plurality of apparatuses are connected together via a network. Furthermore, the computer used in any of the embodiments does not necessarily have to be a personal computer and may be an arithmetic processing apparatus, a microcomputer, or the like included in an information processing device. The term "computer" generally refers to any device or apparatus that is capable of realizing the functions described in the embodiments by using the program.

A Hardware Configuration

FIG. 19 is a diagram of a hardware configuration of a computer 130 (image processing apparatus) according to an embodiment. The image processing apparatus according to the embodiments described above includes a controlling device such as a Central Processing Unit (CPU) 310, storage devices such as a Read-Only Memory (ROM) 320 and a Random Access Memory (RAM) 330, a communication interface (I/F) 340 that connects to a network and performs communication, and a bus 301 that connects the units together.

The program executed by the image processing apparatus according to the embodiments described above is provided as being incorporated, in advance, in the ROM 320 or the like. Further, the program executed by the image processing apparatus according to the embodiments described above is able to cause the computer to function as the units of the image processing apparatus described above. The computer is configured so that the CPU 310 is able to read the program from a computer-readable storage medium into a main storage device and to execute the read program.

According to a magnetic resonance imaging apparatus and a magnetic resonance imaging method according to at least one of the embodiments, it is possible to reduce motion artifact in non-contrast magnetic resonance angiography.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging method executed in a magnetic resonance imaging apparatus, comprising:
    applying an inversion pulse;
    executing a subsequent imaging sequence including an RF (Radio Frequency) pulse and a gradient magnetic field concurrently applied with the RF pulse in a slice direction; and
    performing, for a slice position selected by the RF pulse and the gradient magnetic field and during a time period including a null point, a plurality of data acquisitions in two-dimensional k-space, each of the plurality of data acquisitions being performed in an orientation that is within the two-dimensional k-space and that is different from one another including a center of the two-dimensional k-space.

2. The magnetic resonance imaging method according to claim 1, further comprising:
    adjusting, prior to an application of the inversion pulse, a number of k-space lines pertinent to the data acquisitions, based on a velocity of fluid to be imaged.

3. The magnetic resonance imaging method according to claim 1, wherein the step of performing the data acquisitions comprises performing an interleaved radial sampling during the imaging sequence.

4. The magnetic resonance imaging method according to claim 1, further comprising:
    determining, prior to an application of the inversion pulse, which of an interleave radial sampling and an sequential radial sampling is to be performed during the imaging sequence based on a velocity of fluid to be imaged.

5. The magnetic resonance imaging method according to claim 1, further comprising:
    adjusting, prior to an application of the inversion pulse, an amount of slice encoding based on a velocity of fluid to be imaged.

6. The magnetic resonance imaging method according to claim 1, wherein the step of performing the data acquisitions further comprises starting the data acquisitions at a time determined based on data acquired from a pulse sequence executed prior to the imaging sequence.

7. The magnetic resonance imaging method according to claim 1, wherein the step of applying the inversion pulse comprises applying a spatially selective inversion pulse as the inversion pulse.

8. The magnetic resonance imaging method according to claim 7, further comprising:
    executing a pulse sequence in which a spatially non-selective inversion pulse is applied;
    generating a first image based on the data acquisition;
    generating a second image based on the pulse sequence; and
    performing subtraction processing between the first image and the second image to generate a third image.

9. The magnetic resonance imaging method according to claim 1, further comprising:
    executing a pulse sequence in which no inversion pulse is applied;
    generating a first image based on the data acquisitions;
    generating a second image based on the pulse sequence; and
    performing subtraction processing between the first image and the second image to generate a third image.

10. The magnetic resonance imaging method according to claim 1, wherein the applying step comprises applying a plurality of inversion pulses in total to perform the data acquisitions of one slice position.

11. The magnetic resonance imaging method according to claim 1, wherein the RF pulse forms a plurality of echoes during the imaging sequence.

12. The magnetic resonance imaging method according to claim 1, wherein the executing step comprises executing an r-bSSFP (radial balanced steady state free precession) sequence as the imaging sequence.

13. The magnetic resonance imaging method according to claim 1, wherein the executing step comprises applying a half RF pulse during the imaging sequence.

14. The magnetic resonance imaging method according to claim 1, wherein the performing step comprises performing both a Cartesian sampling and a radial sampling during the imaging sequence.

15. The magnetic resonance imaging method according to claim 1, wherein the performing step comprises performing a plurality of times of sampling in a substantially same orientation.

16. The magnetic resonance imaging method according to claim 1, wherein the executing step comprises executing a FASE (Fast Asymmetric Spin Echo) sequence as the imaging sequence.

17. A magnetic resonance imaging method executed in a magnetic resonance imaging apparatus, comprising:
applying an inversion pulse;
executing a subsequent imaging sequence including a multiband composite RF (Radio Frequency) pulse and a gradient magnetic field concurrently applied with the multiband composite RF pulse in a slice direction; and
performing data acquisition in a plurality of orientations including an origin of a k-space.

18. The magnetic resonance imaging method according to claim 17, wherein the performing step further comprises:
performing the data acquisition including at least one of 2D radial acquisition, 2D data acquisition, performing a plurality of times of sampling in a substantially same orientation, 2D PETRA (Pointwise Encoding Time reduction with Radial Acquisition) data acquisition, and 2D UTE (Ultrashort Echo) data acquisition.

19. A magnetic resonance imaging method executed in a magnetic resonance imaging apparatus, comprising:
applying an inversion pulse;
executing a subsequent imaging sequence including an RF (Radio Frequency) pulse and a gradient magnetic field concurrently applied with the RF pulse in a slice direction; and
performing, for a slice position selected by the RF pulse and the gradient magnetic field and during a time period including a null point, a plurality of three-dimensional (3D) radial data acquisitions in three-dimensional k-space, each of the plurality of 3D radial data acquisitions being performed in an orientation different from another including an origin of the three-dimensional k-space.

20. The magnetic resonance imaging method according to claim 19, wherein the performing step comprises:
performing the 3D radial data acquisitions including at least one of 3D UTE (Ultrashort Echo) data acquisition, 3D PETRA (Pointwise Encoding Time reduction with Radial Acquisition) data acquisition, and 3D projection data acquisition.

* * * * *